United States Patent
Godo et al.

(10) Patent No.: US 12,453,275 B2
(45) Date of Patent: Oct. 21, 2025

(54) DISPLAY APPARATUS

(71) Applicant: SEMICONDUCTOR ENERGY LABORATORY CO., LTD., Atsugi (JP)

(72) Inventors: Hiromichi Godo, Kanagawa (JP); Kazuki Tsuda, Kanagawa (JP); Hidefumi Rikimaru, Tokyo (JP); Yoshiyuki Kurokawa, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/558,085

(22) PCT Filed: Apr. 25, 2022

(86) PCT No.: PCT/IB2022/053804
§ 371 (c)(1),
(2) Date: Oct. 30, 2023

(87) PCT Pub. No.: WO2022/234382
PCT Pub. Date: Nov. 10, 2022

(65) Prior Publication Data
US 2024/0215425 A1 Jun. 27, 2024

(30) Foreign Application Priority Data
May 7, 2021 (JP) .................. 2021-078866

(51) Int. Cl.
*H10K 59/95* (2023.01)
*G09G 3/3225* (2016.01)
(Continued)

(52) U.S. Cl.
CPC ........... *H10K 59/95* (2023.02); *G09G 3/3225* (2013.01); *H01L 25/18* (2013.01); *H10K 59/87* (2023.02);
(Continued)

(58) Field of Classification Search
CPC ...... H10K 59/95; H10K 59/87; H10K 77/111; G09G 3/3225; G09G 2300/0842;
(Continued)

(56) References Cited

U.S. PATENT DOCUMENTS 5,821,138 A 10/1998 Yamazaki et al.
6,846,696 B2 1/2005 Adachi et al.
(Continued)

FOREIGN PATENT DOCUMENTS

CN 104505004 A 4/2015
CN 108538211 A 9/2018
(Continued)

OTHER PUBLICATIONS

International Search Report (Application No. PCT/IB2022/053804) Dated Jul. 26, 2022.
(Continued)

*Primary Examiner* — Abhishek Sarma
(74) *Attorney, Agent, or Firm* — Fish & Richardson P.C.

(57) ABSTRACT

A display apparatus having a novel structure is provided. A plurality of display panels, a fixing member having a curved surface, and a housing storing the fixing member are included. The display panel includes a display portion including a pixel circuit, a non-display portion provided to surround the display portion, a gate driver circuit for driving the pixel circuit, and a source driver circuit. The gate driver circuit is provided at a position overlapping with the display portion. The source driver circuit is provided at a position overlapping with the non-display portion. The plurality of display panels are fixed along the curved surface of the fixing member.

15 Claims, 23 Drawing Sheets

(51) Int. Cl.
  *H01L 25/18* (2023.01)
  *H10K 59/80* (2023.01)
(52) U.S. Cl.
  CPC . *G09G 2300/0842* (2013.01); *G09G 2310/08* (2013.01)
(58) Field of Classification Search
  CPC .......... G09G 2310/08; G09G 2300/00; G09G 2300/0426; G09G 2300/0452; G09G 2380/10; G09G 3/20; G09G 2354/00; G09G 2360/144; G09G 2360/148; G09G 3/3233; H01L 25/18; G09F 9/301
  See application file for complete search history.

(56) References Cited

U.S. PATENT DOCUMENTS

| | | |
|---|---|---|
| 6,946,361 B2 | 9/2005 | Takayama et al. |
| 7,056,810 B2 | 6/2006 | Yamazaki et al. |
| 7,180,091 B2 | 2/2007 | Yamazaki et al. |
| 7,189,631 B2 | 3/2007 | Yamazaki et al. |
| 7,282,380 B2 | 10/2007 | Maruyama et al. |
| 7,335,573 B2 | 2/2008 | Takayama et al. |
| 7,351,300 B2 | 4/2008 | Takayama et al. |
| 7,521,383 B2 | 4/2009 | Morisue et al. |
| 7,867,907 B2 | 1/2011 | Shimomura et al. |
| 8,030,132 B2 | 10/2011 | Ogita et al. |
| 8,110,442 B2 | 2/2012 | Jinbo |
| 8,367,440 B2 | 2/2013 | Takayama et al. |
| 8,430,530 B2 | 4/2013 | Aurongzeb et al. |
| 8,982,545 B2 | 3/2015 | Kim et al. |
| 9,354,385 B2 | 5/2016 | An et al. |
| 9,523,875 B2 | 12/2016 | Kim |
| 9,551,893 B2 | 1/2017 | An et al. |
| 9,755,167 B2 | 9/2017 | Yamazaki et al. |
| 9,759,420 B1 * | 9/2017 | Baloga ..................... G06F 1/16 |
| 9,940,086 B2 | 4/2018 | Yoshizumi et al. |
| 10,198,235 B2 | 2/2019 | Yoshizumi et al. |
| 10,572,211 B2 | 2/2020 | Yoshizumi et al. |
| 10,777,758 B2 | 9/2020 | Okazaki |
| 11,093,204 B2 | 8/2021 | Yoshizumi et al. |
| 11,567,724 B2 | 1/2023 | Yoshizumi et al. |
| 2008/0007936 A1 | 1/2008 | Liu et al. |
| 2011/0050657 A1 | 3/2011 | Yamada |
| 2011/0249425 A1 | 10/2011 | Aurongzeb et al. |
| 2012/0113632 A1 | 5/2012 | Aoyama et al. |
| 2012/0217516 A1 | 8/2012 | Hatano et al. |
| 2013/0002133 A1 | 1/2013 | Jin et al. |
| 2014/0103321 A1 | 4/2014 | Furukawa et al. |
| 2014/0306260 A1 | 10/2014 | Yamazaki et al. |
| 2014/0321074 A1 | 10/2014 | Chida et al. |
| 2015/0228704 A1 | 8/2015 | Miyake et al. |
| 2015/0255740 A1 | 9/2015 | Nakada |
| 2015/0261352 A1 | 9/2015 | Miyake |
| 2015/0292716 A1 | 10/2015 | Yamazaki et al. |
| 2015/0355763 A1 | 12/2015 | Miyake et al. |
| 2016/0019019 A1 | 1/2016 | Ikeda et al. |
| 2016/0037608 A1 | 2/2016 | Ikeda et al. |
| 2016/0044751 A1 | 2/2016 | Ikeda et al. |
| 2016/0103649 A1 | 4/2016 | Yoshitani et al. |
| 2016/0132281 A1 | 5/2016 | Yamazaki et al. |
| 2016/0210103 A1 | 7/2016 | Yoshizumi et al. |
| 2019/0334104 A1 | 10/2019 | Okazaki |
| 2020/0168133 A1 | 5/2020 | Hwang et al. |
| 2022/0384398 A1 | 12/2022 | Yamazaki et al. |
| 2023/0176802 A1 | 6/2023 | Yoshizumi et al. |

FOREIGN PATENT DOCUMENTS

| | | |
|---|---|---|
| JP | 2015-207556 A | 11/2015 |
| JP | 2016-167049 A | 9/2016 |
| KR | 2016-0090247 A | 7/2016 |
| TW | 201640465 | 11/2016 |
| WO | WO-2018/138861 | 8/2018 |
| WO | WO-2019/196335 | 10/2019 |

OTHER PUBLICATIONS

Written Opinion (Application No. PCT/IB2022/053804) Dated Jul. 26, 2022.

* cited by examiner

DISPLAY APPARATUS

CROSS REFERENCE TO RELATED APPLICATIONS

This application is a U.S. National Phase Application under 35 U.S.C. § 371 of International Application PCT/IB2022/053804, filed on Apr. 25, 2022, which is incorporated by reference and claims the benefit of a foreign priority application filed in Japan on May 7, 2021, as Application No. 2021-078866.

TECHNICAL FIELD

One embodiment of the present invention relates to a display apparatus, an electronic device, or a semiconductor device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Thus, more specifically, examples of the technical field of one embodiment of the present invention disclosed in this specification include a semiconductor device, a display apparatus, a light-emitting apparatus, a power storage device, a memory device, a driving method thereof, and a manufacturing method thereof.

Note that in this specification, a semiconductor device refers to any device that can function by utilizing semiconductor characteristics, and an electro-optical device, a semiconductor circuit, and an electronic device are all semiconductor devices.

BACKGROUND ART

As a result of recent technological innovation, commoditization of display apparatuses has progressed. In order to gain a competitive edge in such a situation, higher-value-added products have been required.

For example, research and development of display apparatuses each having a well-designed display surface with a complex shape formed by combining a plurality of display panels have been progressed. Patent Document 1 discloses a structure of a light-emitting apparatus in which a plurality of display panels are arranged along a skeleton and thus a developable surface is formed between curved portions.

REFERENCE

Patent Document

[Patent Document 1] Japanese Published Patent Application No. 2015-207556

SUMMARY OF THE INVENTION

Problems to be Solved by the Invention

Higher-value-added products are desired to be not only well designed but also robust. Particularly in the case of a display apparatus having a complex-shaped display surface, defective display due to bending might occur, which might degrade convenience or reliability.

An object of one embodiment of the present invention is to provide a novel display apparatus that is highly convenient or reliable. Another object is to provide a novel semiconductor device that is highly convenient or reliable. Another object is to provide a novel display apparatus, a novel semiconductor device, or the like.

Note that the description of these objects does not preclude the existence of other objects. One embodiment of the present invention does not need to achieve all these objects. Other objects will be apparent from the description of the specification, the drawings, the claims, and the like, and other objects can be derived from the description of the specification, the drawings, the claims, and the like.

Means for Solving the Problems

One embodiment of the present invention is a display apparatus including a plurality of display panels, a fixing member having a curved surface, and a housing storing the fixing member. The display panel includes a display portion including a pixel circuit, and a gate driver circuit for driving the pixel circuit. The gate driver circuit is provided at a position overlapping with the display portion. The plurality of display panels are fixed along the curved surface of the fixing member.

One embodiment of the present invention is a display apparatus including a plurality of display panels, a fixing member having a curved surface, and a housing storing the fixing member. The display panel includes a display portion including a pixel circuit, a non-display portion provided to surround the display portion, and a gate driver circuit and a source driver circuit for driving the pixel circuit. The gate driver circuit is provided at a position overlapping with the display portion. The source driver circuit is provided at a position overlapping with the non-display portion. The plurality of display panels are fixed along the curved surface of the fixing member.

One embodiment of the present invention is a display apparatus including a plurality of display panels, a fixing member having a curved surface, and a housing storing the fixing member. The display panel includes a display portion including a pixel circuit, a non-display portion provided to surround the display portion, and a gate driver circuit and a source driver circuit for driving the pixel circuit. The gate driver circuit is provided at a position overlapping with the display portion. The source driver circuit is provided at a position overlapping with the non-display portion. The plurality of display panels are fixed along the curved surface of the fixing member so as to include a region overlapping with the non-display portion.

One embodiment of the present invention is a display apparatus including a first display panel, a plurality of second display panels, a frustoconical fixing member having a plane and a curved surface, and a housing storing the fixing member. The first display panel and the second display panel each include a display portion including a pixel circuit, and a gate driver circuit for driving the pixel circuit. The gate driver circuit is provided at a position overlapping with the display portion. The first display panel is fixed along the plane of the fixing member. The plurality of second display panels are fixed along the curved surface of the fixing member.

One embodiment of the present invention is a display apparatus including a first display panel, a plurality of second display panels, a frustoconical fixing member having a plane and a curved surface, and a housing storing the fixing member. The first display panel and the second display panel each include a display portion including a pixel circuit, a non-display portion provided to surround the display portion, and a gate driver circuit and a source driver circuit for driving the pixel circuit. The gate driver circuit is provided at a position overlapping with the display portion. The source driver circuit is provided at a position overlapping with the non-display portion. The first display panel is fixed along the plane of the fixing member. The plurality of second display panels are fixed along the curved surface of the fixing member.

One embodiment of the present invention is a display apparatus including a first display panel, a plurality of second display panels, a frustoconical fixing member having a plane and a curved surface and a housing storing the fixing member. The first display panel and the second display panel each include a display portion including a pixel circuit, a non-display portion provided to surround the display portion, and a gate driver circuit and a source driver circuit for driving the pixel circuit. The gate driver circuit is provided at a position overlapping with the display portion. The source driver circuit is provided at a position overlapping with the non-display portion. The first display panel is fixed along the plane of the fixing member. The first display panel and the plurality of second display panels are each fixed along the curved surface of the fixing member so as to include a region overlapping with the non-display portion.

One embodiment of the present invention is a display apparatus including a display panel including a notch portion and a bending portion, a frustopyramidal fixing member, and a housing storing the fixing member. The display panel includes a display portion including a pixel circuit, and a gate driver circuit for driving the pixel circuit. The gate driver circuit is provided at a position overlapping with the display portion. The notch portion of the display panel is placed in a corner portion of a top surface of the fixing member and the bending portion of the display panel is bent along a side of the top surface of the fixing member.

Note that other embodiments of the present invention will be shown in the description of the following embodiments and the drawings.

Effect of the Invention

One embodiment of the present invention can provide a novel display apparatus that is highly convenient or reliable. Alternatively, a novel semiconductor device that is highly convenient or reliable can be provided. Alternatively, a novel display apparatus, a novel semiconductor device, or the like can be provided.

Note that the description of these effects does not preclude the existence of other effects. One embodiment of the present invention does not need to have all these effects. Other effects will be apparent from the description of the specification, the drawings, the claims, and the like, and other effects can be derived from the description of the specification, the drawings, the claims, and the like.

MODE FOR CARRYING OUT THE INVENTION

Figure 1A:
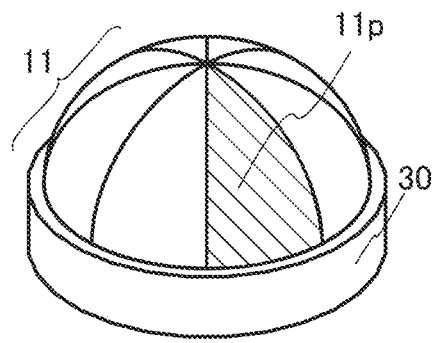
FIG. 1A to FIG. 1C are diagrams illustrating a structure example of a display apparatus.

Embodiments of the present invention will be described below. Note that one embodiment of the present invention is not limited to the following description, and it will be readily understood by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the ordinal numbers do not limit the number of components. In addition, the ordinal numbers do not limit the order of components. For example, a "first" component in one embodiment in this specification and the like can be referred to as a "second" component in other embodiments or the scope of claims. For another example, a "first" component in one embodiment in this specification and the like can be omitted in other embodiments or the scope of claims.

The same components, components having similar functions, components made of the same material, components formed at the same time, and the like in the drawings are denoted by the same reference numerals, and repeated description thereof is omitted in some cases.

In this specification, for example, a power supply potential VDD may be abbreviated to a potential VDD, VDD, or the like. The same applies to other components (e.g., a signal, a voltage, a circuit, an element, an electrode, and a wiring).

In the case where a plurality of components are denoted by the same reference numerals, and, particularly when they need to be distinguished from each other, an identification sign such as "_1", "_2", "_n", or "_m,n" is sometimes added to the reference numerals. For example, a second wiring GL is referred to as a wiring GL_2.

Embodiment 1

In this embodiment, a structure of a highly convenient or highly reliable display apparatus configured to have a well-designed display surface and be robust against impact or the like will be described.

Figure 1B:
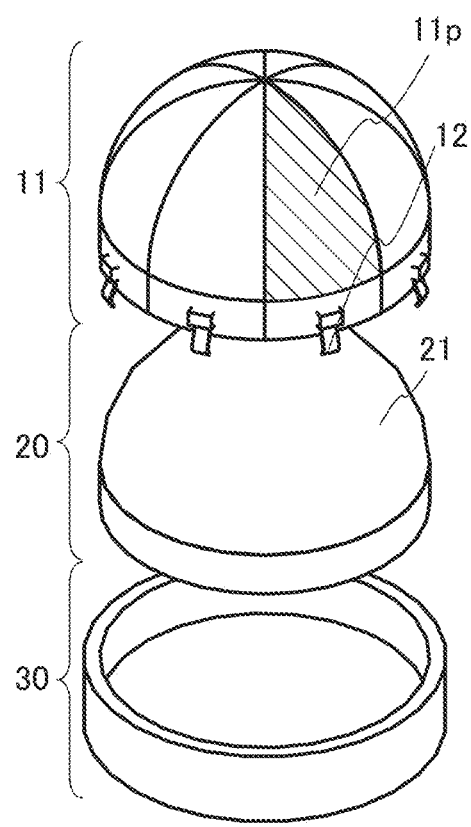
Figure 1C:
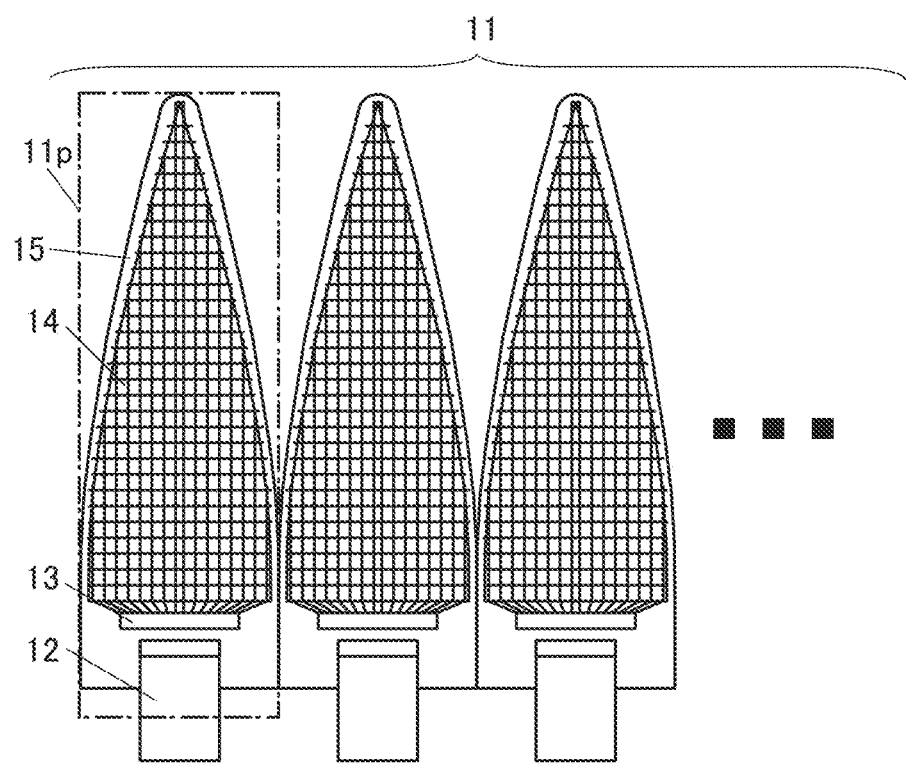

FIG. 1A is a perspective view for illustrating a display apparatus 10A of one embodiment of the present invention. FIG. 1B is an exploded schematic diagram of the display apparatus 10A illustrated in FIG. 1A. FIG. 1C is a schematic diagram for illustrating a structure example of a display panel 11p included in the display apparatus 10A.

The display apparatus 10A illustrated in FIG. 1A includes a housing 30 in which a display panel 11 composed of a plurality of display panels 11p is stored. The display panel 11 has a developable surface formed by joining the plurality of display panels 11p together.

In the display panel 11 illustrated in FIG. 1A, an example is illustrated in which a hemispherical display portion is formed by joining the plurality of display panels 11p together. With this structure, the display apparatus 10A can have a well-designed display surface. Although FIG. 1A exemplifies the structure in which eight display panels 11p are joined together, the present invention is not limited thereto.

The display apparatus 10A illustrated in FIG. 1B includes the display panel 11 composed of the plurality of display panels 11p, a fixing member 20 having a curved surface 21, and the housing 30. FPCs 12 (Flexible printed circuits) are attached to the display panels 11p and are to be stored in the housing 30.

The fixing member 20 to which the plurality of display panels 11p are fixed has the curved surface 21 corresponding to the developable surface formed by joining the plurality of display panels 11p together. By using a plastic material such as FRP (fiber reinforced plastic) for the fixing member 20, the weight can be reduced and a well-designed curved surface can be formed. As the fixing member 20, a plastic substrate made from polyimide (PI), aramid, polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), a silicone resin, or the like can be used. In order to prevent deformation of the display panel 11p when the display panel 11p is touched, the curved surface 21 preferably has high impact resistance.

Anon-display portion in the display panel 11, such as the FPC 12, is stored in the housing 30 while the plurality of display panels 11p are fixed along the curved surface 21 of the fixing member 20. With this structure, a display apparatus having a display surface with a curved surface can be obtained. In a cavity portion in the housing 30, an air bag or the like can be stored.

Although not illustrated in FIG. 1, a protective substrate for protecting the display panel 11 may be provided over the display panel 11. With the protective substrate, the surface of the display panel 11 can be protected, and moreover, the mechanical strength of the display apparatus can be increased. For the protective substrate, a light-transmitting material is used at least in a region overlapping with a display region. Furthermore, the protective substrate may have a light-blocking property so that a region other than the region overlapping with the display region is not seen. Note that a material similar to that for the fixing member 20 can be used for the protective substrate. The structure in which a protective substrate is provided over the display panel 11 brings about an effect of making a seam region between the plurality of display panels 11p less noticeable.

FIG. 1C illustrates a state where the display panel 11 is composed of the plurality of display panels 11p joined together. FIG. 1C illustrates a source driver circuit 13, a display portion 14, and a non-display portion 15, in addition to the FPC 12 illustrated in FIG. 1B. Note that although FIG. 1B illustrates, as an example, a COG (Chip On Glass) method in which an IC chip of the source driver circuit 13 is provided over a substrate, a COF (Chip on Film) method may be employed.

Note that a structure in which the plurality of display panels 11p are divided from each other is preferable. When the plurality of display panels 11p are combined to form a hemispherical surface, this structure can relieve stress in a joint portion between the display panels 11p.

Figure 2A:
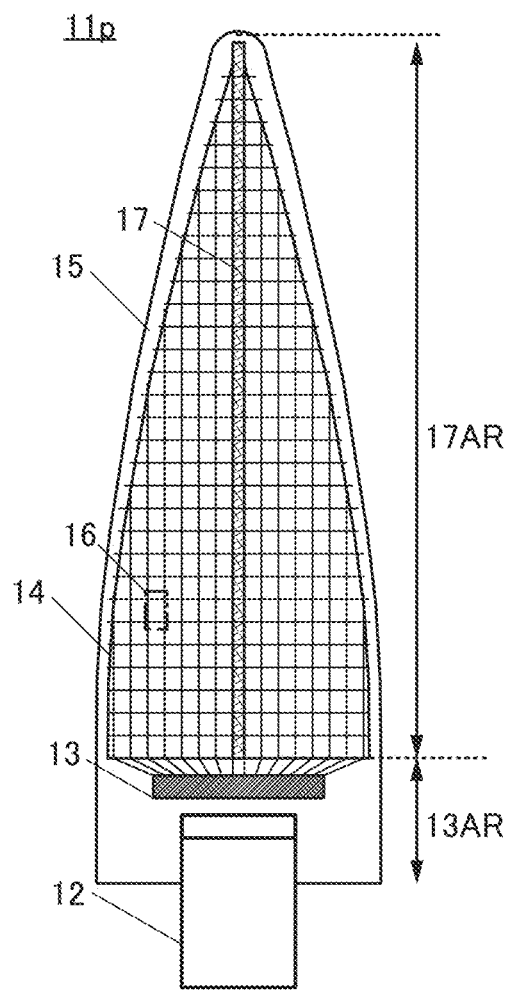
FIG. 2A to FIG. 2E are diagrams illustrating a structure example of a display apparatus.
Figure 2B:
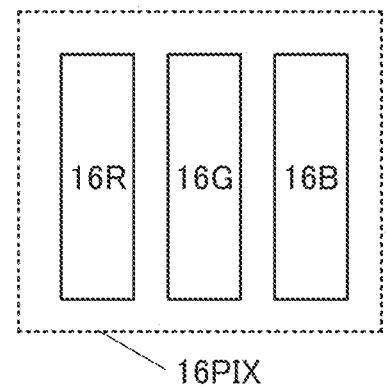

The details of the display panel 11p illustrated in FIG. 1C are described with reference to FIG. 2A. FIG. 2A illustrates a pixel 16 and a gate driver circuit 17, in addition to the FPC 12, the source driver circuit 13, the display portion 14, and the non-display portion 15 that are illustrated in FIG. 1B.

In the display portion 14 provided with the pixel 16, a display device such as a light-emitting device and a pixel circuit for controlling display by the display device are provided. The non-display portion 15 is provided so as to surround the display portion 14 and is provided with the FPC 12 and the source driver circuit 13.

The display device and the pixel circuit that are provided in the display portion 14 are provided over a substrate. The substrate provided with the display device and the pixel circuit is non-rectangular and flexible. In the case where the hemispherical display surface illustrated in FIG. 1A is composed of the display panels 11p, a non-rectangular flexible substrate is preferable in order to obtain a desired display surface illustrated in FIG. 2A that includes a bending region 17AR and a non-bending region 13AR and is along the curved surface 21 of the fixing member 20.

Examples of such a substrate include polyester resins such as PET and PEN, a polyacrylonitrile resin, an acrylic resin, a polyimide resin, a polymethyl methacrylate resin, a PC resin, a PES resin, polyamide resins (such as nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a PTFE resin, and an ABS resin. In particular, a material with a low coefficient of linear expansion is preferred, and for example, a polyamide imide resin, a polyimide resin, a polyamide resin, PET, or the like can be suitably used. A substrate in which a fibrous body is impregnated with a resin, a substrate whose coefficient of linear expansion is reduced by mixing an inorganic filler with a resin, or the like can also be used. Unlike glass or the like, these materials of a substrate have a low risk of scattering pieces when impact is applied thereto, and thus are preferable.

A flexible substrate may have a stacked-layer structure in which at least one of a hard coat layer (e.g., a silicon nitride layer) by which a surface of the apparatus is protected from damage or the like, a layer of a material capable of dispersing pressure (e.g., an aramid resin layer), and the like is stacked with a layer of any of the above-mentioned materials.

A flexible substrate can be processed or cut into a non-rectangular shape. A method in which the pixel circuit and the display device are directly formed on a flexible substrate may be employed, or a method in which a transistor, a light-emitting element, or the like is formed over a glass substrate or the like, separated from the glass substrate, and then bonded to a flexible substrate with an adhesive layer may be employed. Although there are various kinds of separation methods and transfer methods, there is no particular limitation and a known technique is employed as appropriate. For the adhesive layer, various curable adhesives such as a photocurable adhesive (e.g., an ultraviolet curable adhesive), a reactive curable adhesive, a thermosetting adhesive, and an anaerobic adhesive can be used. An adhesive sheet or the like may be used.

The display devices and the pixel circuits that are provided in the display portion 14 are arranged in a matrix. In this embodiment, an organic EL element that is a light-emitting device is used as the display device.

As a color conversion (wavelength conversion) material of an organic EL element, a quantum dot can be used. A quantum dot is a semiconductor nanocrystal with a diameter of several nanometers and contains approximately $1 \times 10^3$ to $1 \times 10^6$ atoms. A quantum dot confines an electron, a hole, or an exciton, which results in discrete energy states and an energy shift depending on the size of a quantum dot. This means that quantum dots made of the same substance emit light with different wavelengths depending on their size; accordingly, emission wavelengths can be easily adjusted by changing the size of quantum dots to be used.

The display portion 14 can have a touch panel function. A user can operate the display portion 14 by touching it with a hand, holding a hand over it, or gesturing.

Note that in the case where a light-emitting device, such as an organic EL element, is a device having a fine metal mask (FMM) structure, separate formation of light-emitting devices with different resolutions in a plane is sometimes difficult. Here, the FMM structure will be described below.

In order to fabricate the FMM structure, a metal mask provided with an opening portion (also referred to as an FMM) is set to be opposed to a substrate so that an EL material is deposited to a desired region at the time of EL evaporation. Then, the EL material is deposited to the desired region by EL evaporation through the FMM. When the size of the substrate at the time of EL evaporation is larger, the size of the FMM is increased and accordingly the weight thereof is also increased. In addition, heat or the like is applied to the FMM at the time of EL evaporation and may change the shape of the FMM. Furthermore, there is a method in which EL evaporation is performed while a certain level of tension is applied to the FMM. Therefore, the weight and strength of the FMM are important parameters.

Therefore, in the case of changing the resolution in the plane of the display panel 11p with use of the FMM, the design of the FMM needs to be changed. Note that in the case of changing the design of the FMM, deformation of the FMM or the like also needs to be considered; thus, it is very difficult to change the resolution in the plane of the display panel. Meanwhile, the display panel of one embodiment of the present invention is fabricated employing an MML (metal maskless) structure and thus has an advantageous effect such as the ease of changing the resolution in a plane of the display panel. That is, the display panel of one embodiment of the present invention (e.g., a non-rectangular flexible display panel) is highly compatible with the MML structure. In other words, a flexible display panel has high compatibility with the MML structure.

In this specification and the like, a device formed using a metal mask or an FMM (fine metal mask, high-resolution metal mask) is sometimes referred to as a device having an MM (metal mask) structure. In this specification and the like, a device formed without using a metal mask or an FMM may be referred to as a device having an MML (metal maskless) structure.

The non-display portion 15 is a region not provided with the pixel 16 and a source driver circuit is provided in a position overlapping with the non-display portion 15. The source driver circuit 13 is provided in the non-bending region 13AR of the non-display portion 15. By including a transistor formed in the same step as the pixel circuit included in the pixel 16, the gate driver circuit 17 can be provided in a position overlapping with the display portion 14. A structure example of the gate driver circuit 17 will be described later. When the gate driver circuit 17 is composed of a transistor formed in the same step as the pixel circuit, the gate driver circuit 17 can be hardly broken even when placed in the bending region 17AR. The gate driver circuit 17 that can be placed in the display portion 14 enables the pixels to be driven even in a non-rectangular display portion, so that a well-designed display apparatus can be provided.

FIG. 2B to FIG. 2E illustrate structure examples of the pixel 16 illustrated in FIG. 2A. The pixel 16 includes a plurality of subpixels. The subpixel functions as a light-emitting device functioning as a display device or functions as a light-receiving device functioning as a photoelectric conversion element.

Note that in this specification and the like, although a minimum unit in which independent operation is performed in one "pixel" is defined as a "subpixel" in the description for convenience, a "pixel" may be replaced with a "region" and a "subpixel" may be replaced with a "pixel".

In the display apparatus of this embodiment, the pixel 16 can include a plurality of types of subpixels including light-emitting devices that emit light of different colors. For example, a pixel 16PIX illustrated in FIG. 2B can include three types of subpixels. As the three subpixels, subpixels 16R, 16G, and 16B of three colors of red (R), green (G), and blue (B) are included. Note that subpixels may correspond to four or more colors.

The subpixel 16R includes a light-emitting device that emits red light. The subpixel 16G includes a light-emitting device that emits green light. The subpixel 16B includes a light-emitting device that emits blue light.

There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to atop surface shape of a light-emitting region of the light-emitting device.

Figure 2C:
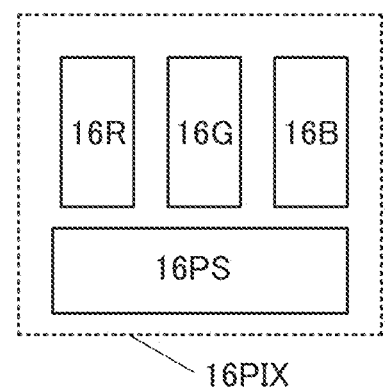

In the display apparatus including the light-emitting device and the light-receiving device in the pixel, for example, the pixel 16PIX illustrated in FIG. 2C can include a subpixel 16PS having a light-receiving function, in addition to the three types of subpixels (the subpixels 16R, 16G, and 16B). The pixel has a light-receiving function, which enables the touch or approach of an object to be detected while an image is displayed. For example, all the subpixels included in the display apparatus can display an image; alternatively, some of the subpixels can emit light as a light source and the other subpixels can display an image. Note that the pixel 16PIX may include a subpixel including a light-emitting device that emits infrared light.

The subpixel 16PS includes a light-receiving device. The wavelength of light detected by the subpixel 16PS is not particularly limited; however, the light-receiving device included in the subpixel 16PS preferably has sensitivity to light emitted by the light-emitting device included in a subpixel R, a subpixel G, or a subpixel B.

The light-receiving area of the subpixel 16PS may be smaller than the light-receiving areas of the other subpixels. A smaller light-receiving area leads to a narrower image-capturing range, inhibits a blur in a captured image, and improves the definition. Thus, the use of the subpixel 16PS enables high-resolution or high-definition image capturing. For example, image capturing for personal authentication with the use of a fingerprint, a palm print, the iris, the shape of a blood vessel (including the shape of a vein and the shape of an artery), a face, or the like is possible by using the subpixel 16PS.

The subpixel 16PS can be used in a touch sensor (also referred to as a direct touch sensor), a near touch sensor (also referred to as a hover sensor, a hover touch sensor, a contactless sensor, or a touchless sensor), or the like. For example, the subpixel 16PS preferably detects infrared light. Thus, a touch can be detected even in a dark place.

Here, the touch sensor or the near touch sensor can detect an approach or contact of an object (e.g., a finger, a hand, or a pen). The touch sensor can detect the object when the display apparatus and the object come in direct contact with each other. Furthermore, even when an object is not in contact with the display apparatus, the near touch sensor can detect the object. For example, the display apparatus is preferably capable of detecting an object positioned in the range of 0.1 mm to 300 mm inclusive, further preferably 3 mm to 50 mm inclusive from the display apparatus. This structure enables the display apparatus to be operated without direct contact of an object, that is, enables the display apparatus to be operated in a contactless (touchless) manner. With the above-described structure, the display apparatus can have a reduced risk of being dirty or damaged, or the display apparatus can be operated without the object directly touching a dirt (e.g., dust or a virus) attached to the display apparatus.

For high-resolution image capturing, the subpixel 16PS is preferably provided in all pixels included in the display apparatus. Meanwhile, in the case where the subpixel 16PS is used in a touch sensor, a near touch sensor, or the like, high accuracy is not required as compared to the case of capturing an image of a fingerprint or the like; accordingly, the subpixel 16PS is provided in some subpixels included in the display apparatus. When the number of subpixels 16PS included in the display apparatus is smaller than the number of subpixels 16R or the like, higher detection speed can be achieved.

Figure 2D:
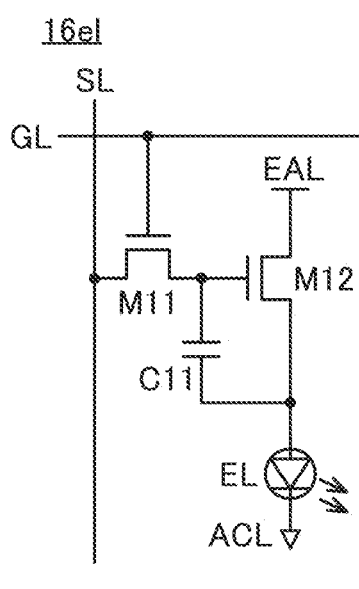
Figure 2E:
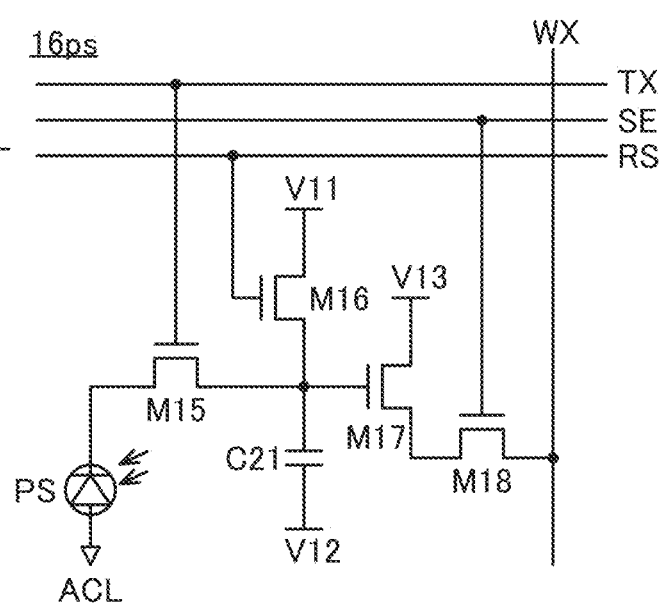

FIG. 2D illustrates an example of a pixel circuit 16el of a pixel applicable to the subpixels 16R, 16G, and 16B each including the light-emitting device and FIG. 2E illustrates an example of a pixel circuit 16ps applicable to the subpixel 16PS including the light-receiving device.

The pixel circuit 16el illustrated in FIG. 2D includes a light-emitting device EL, a transistor M11, a transistor M12, and a capacitor C11. Here, an example in which a light-emitting diode is used as the light-emitting device EL is illustrated. In particular, an organic EL element is preferably used as the light-emitting device EL.

A gate of the transistor M11 is electrically connected to a wiring GL, one of a source and a drain thereof is electrically connected to a wiring SL, and the other of the source and the drain thereof is electrically connected to one electrode of the capacitor C11 and a gate of the transistor M12. One of a source and a drain of the transistor M12 is electrically connected to a wiring EAL, and the other of the source and the drain thereof is electrically connected to an anode of the light-emitting device EL and the other electrode of the capacitor C11. A cathode of the light-emitting device EL is electrically connected to a wiring ACL.

The wiring EAL and the wiring ACL are each supplied with a constant potential. In the light-emitting device EL, the anode side can have a high potential and the cathode side can have a lower potential than the anode side. The transistor M11 is controlled by a signal supplied to the wiring GL and functions as a selection transistor for controlling a selection state of the pixel circuit 16el. In addition, the transistor M12 functions as a driving transistor that controls current flowing through the light-emitting device EL in accordance with a potential supplied to the gate. Although the two transistors are described as the transistors included in the pixel circuit 16el, three or more transistors may be included in the pixel circuit 16el.

The pixel circuit 16ps illustrated in FIG. 2E includes a light-receiving device PS, a transistor M15, a transistor M16, a transistor M17, a transistor M18, and a capacitor C21. Here, an example in which a photodiode is used as the light-receiving device PS is illustrated.

An anode of the light-receiving device PS is electrically connected to the wiring ACL, and a cathode thereof is electrically connected to one of a source and a drain of the transistor M15. A gate of the transistor M15 is electrically connected to a wiring TX, and the other of the source and the drain thereof is electrically connected to one electrode of the capacitor C21, one of a source and a drain of the transistor M16, and a gate of the transistor M17. A gate of the transistor M16 is electrically connected to a wiring RS, and the other of the source and the drain thereof is electrically connected to a wiring V11. One of a source and a drain of the transistor M17 is electrically connected to a wiring V13, and the other of the source and the drain thereof is electrically connected to one of a source and a drain of the transistor M18. Agate of the transistor M18 is electrically connected to a wiring SE, and the other of the source and the drain thereof is electrically connected to a wiring WX. The other electrode of the capacitor C21 is electrically connected to a wiring V12.

Note that in the case where the light-receiving device PS is provided, by placing a plurality of gate driver circuits 17 illustrated in FIG. 2A, the transistors included in the light-receiving device PS can be sequentially brought into selected states.

The wiring V11, the wiring V12, and the wiring V13 are each supplied with a constant potential. When the light-receiving device PS is driven with a forward bias, a potential lower than the potential of the wiring ACL is supplied to the wiring V11. The transistor M16 is controlled by a signal supplied to the wiring RS and has a function of resetting the potential of a node connected to the gate of the transistor M17 to a potential supplied to the wiring V11. The transistor M15 is controlled by a signal supplied to the wiring TX and has a function of controlling the timing at which the potential of the node changes, in accordance with current flowing through the light-receiving device PS. The transistor M17 functions as an amplifier transistor for performing output in response to the potential of the node. The transistor M18 is controlled by a signal supplied to the wiring SE and functions as a selection transistor for reading an output corresponding to the potential of the node by an external circuit connected to the wiring WX.

Although n-channel transistors are shown as the transistors in FIG. 2D and FIG. 2E, p-channel transistors can also be used.

The transistors included in the pixel circuit 16*el* and the transistors included in the pixel circuit 16*ps* are preferably formed to be arranged over the same substrate. It is particularly preferable that the transistors included in the pixel circuit 16*el* and the transistors included in the pixel circuit 16*ps* be periodically arranged in one region.

One or more layers including one or both of the transistor and the capacitor are preferably provided at a position overlapping with the light-receiving device PS or the light-emitting device EL. Thus, the effective area of each pixel circuit can be reduced, and a high-resolution light-receiving portion or display portion can be achieved.

Here, as each of the transistor M11 and the transistor M12 that are included in the pixel circuit 16*el* and the transistors M15 to M18 that are included in the pixel circuit 16*ps*, it is preferable to use a transistor using a metal oxide (an oxide semiconductor) for a semiconductor layer where a channel is formed.

A transistor using a metal oxide having a wider band gap and a lower carrier density than silicon can achieve an extremely low off-state current. Thus, such a low off-state current enables long-term retention of electric charge accumulated in a capacitor that is connected in series with the transistor. Therefore, it is particularly preferable to use a transistor using an oxide semiconductor as the transistor M11, the transistor M15, and the transistor M16 each of which is connected in series with the capacitor C11 or the capacitor C21. Moreover, the use of transistors using an oxide semiconductor as the other transistors can reduce the fabrication cost. Note that one embodiment of the present invention is not limited thereto. A transistor using silicon for a semiconductor layer (hereinafter, also referred to as a Si transistor) may be used.

Note that the off-state current value per micrometer of channel width of an OS transistor at room temperature can be lower than or equal to 1 aA ($1 \times 10^{-18}$ A), lower than or equal to 1 zA ($1 \times 10^{-21}$ A), or lower than or equal to 1 yA ($1 \times 10^{-24}$ A). Note that the off-state current value per micrometer of channel width of a Si transistor at room temperature is higher than or equal to 1 fA ($1 \times 10^{-15}$ A) and lower than or equal to 1 pA ($1 \times 10^{-1}$ A). In other words, the off-state current of an OS transistor is lower than the off-state current of a Si transistor by approximately ten orders of magnitude.

Note that the display apparatus of one embodiment of the present invention can have a structure including an OS transistor and a light-emitting element having an MML (metal maskless) structure. With this structure, the leakage current that might flow through the transistor and the leakage current that might flow between adjacent light-emitting elements (also referred to as a lateral leakage current, a side leakage current, or the like) can become extremely low. With the above structure, a viewer can notice any one or more of the image clearness, the image sharpness, and a high contrast ratio in an image displayed on the display apparatus. Note that with the structure in which the leakage current that might flow through the transistor and the lateral leakage current between light-emitting elements are extremely low, display in which light leakage or the like that might occur in black display is as little as possible (also referred to as completely black display) can be achieved.

To increase the emission luminance of the light-emitting device included in the pixel circuit, the amount of current fed through the light-emitting device needs to be increased. For this, it is necessary to increase the source-drain voltage of a driving transistor included in the pixel circuit. Since an OS transistor has a higher withstand voltage between the source and the drain than a Si transistor, a high voltage can be applied between the source and the drain of the OS transistor. Accordingly, when an OS transistor is used as the driving transistor included in the pixel circuit, a high voltage can be applied between the source and the drain of the OS transistor; thus, the amount of current flowing through the light-emitting device can be increased, so that the emission luminance of the light-emitting device can be increased.

When transistors operate in a saturation region, a change in source-drain current relative to a change in gate-source voltage can be smaller in an OS transistor than in a Si transistor. Accordingly, when an OS transistor is used as the driving transistor included in the pixel circuit, the amount of current flowing between the source and the drain can be set minutely by a change in gate-source voltage; hence, the amount of current flowing through the light-emitting device can be controlled minutely. Therefore, the emission luminance of the light-emitting device can be controlled minutely (the number of gray levels in the pixel circuit can be increased).

Regarding saturation characteristics of current flowing when the transistor operates in a saturation region, the OS transistor can make constant current (saturation current) flow more stably than the Si transistor even when the source-drain voltage gradually increases. Thus, by using an OS transistor as the driving transistor, a stable constant current can be fed through a light-emitting device that contains an EL material even when the current-voltage characteristics of the light-emitting device vary, for example. In other words, when the OS transistor operates in the saturation region, the source-drain current hardly changes with an increase in the source-drain voltage; hence, the emission luminance of the light-emitting device can be stable.

As described above, with use of an OS transistor as a driving transistor included in the pixel circuit, it is possible to achieve "inhibition of black floating", "increase in emission luminance", "increase in gray level", "inhibition of variation in light-emitting devices", and the like. Therefore, a display apparatus including the pixel circuit can display a clear and smooth image; as a result, any one or more of the image clearness, the image sharpness, and a high contrast ratio can be observed. With the structure in which the off-state current that might flow through the driving transistor included in the pixel circuit is extremely low, black display performed by the display apparatus can be display with as little light leakage or the like as possible (completely black display).

Alternatively, a transistor using silicon as a semiconductor where a channel is formed can be used as each of the transistors M11, M12, and M15 to M18. In particular, the use of silicon with high crystallinity, such as single crystal silicon or polycrystalline silicon, is preferable because high field-effect mobility is achieved and a higher-speed operation is possible.

Alternatively, a structure may be employed in which a transistor using an oxide semiconductor (an OS transistor) is used as one or more of the transistors M11, M12, and M15 to M18 and a transistor using silicon (a Si transistor) is used as the other transistors. Note that as the Si transistor, a transistor including low-temperature polysilicon (LTPS) (hereinafter, referred to as an LTPS transistor) can be used. A structure in which an OS transistor and an LTPS transistor are used in combination is referred to as LTPO in some cases. By employing LTPO, an LTPS transistor with a high mobility and an OS transistor with a low off-state current can be used, so that a display panel with high display quality can be provided.

Figure 3A:
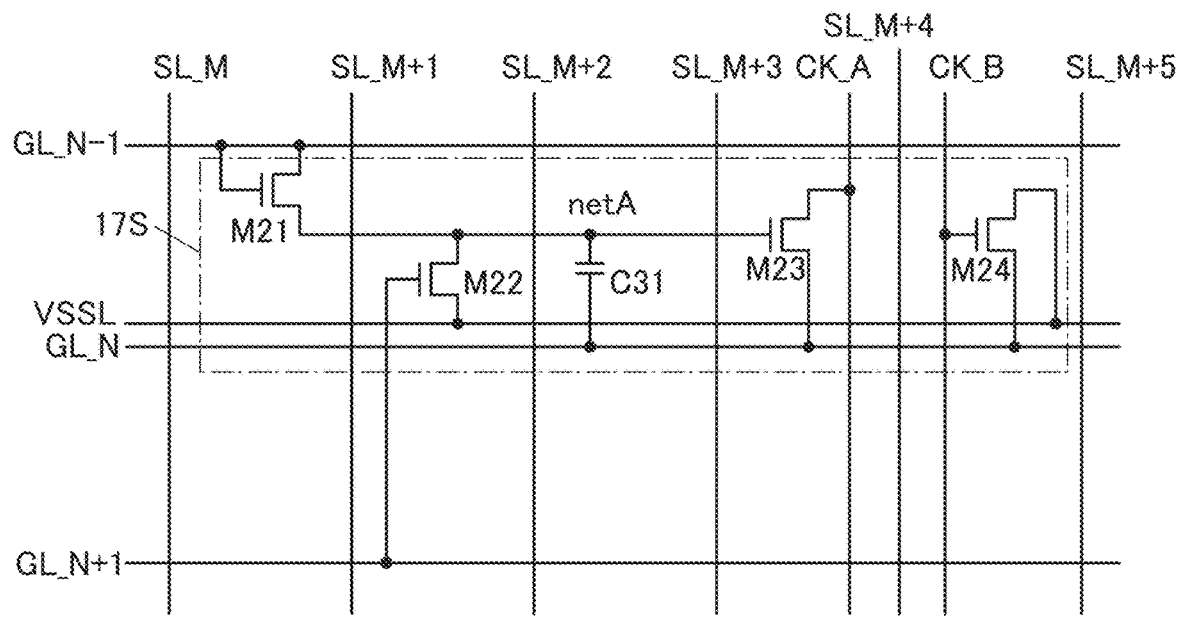
FIG. 3A and FIG. 3B are diagrams illustrating a structure example of a display apparatus.
Figure 3B:
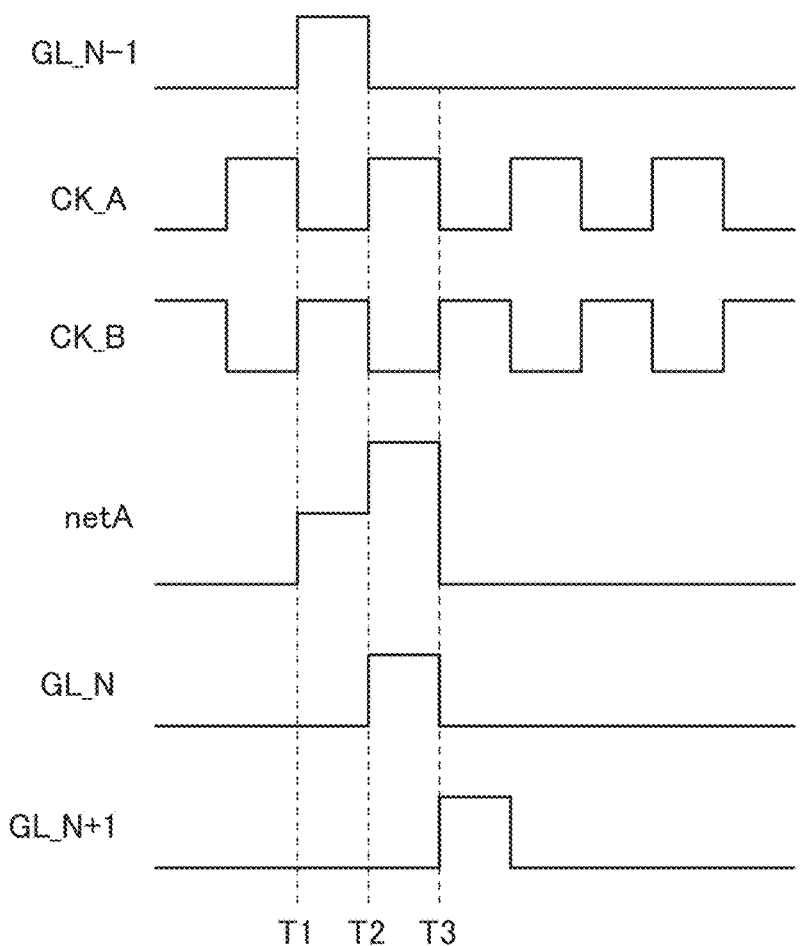

FIG. 3A and FIG. 3B illustrate examples of a pulse output circuit and a timing chart that are applicable to the gate driver circuit 17 described with reference to FIG. 2A. Note that the pulse output circuit and the timing chart that are described with reference to FIG. 3A and FIG. 3B are also effective for the gate driver circuit for driving the light-receiving device PS.

FIG. 3A is an example of a circuit structure of a pulse output circuit 17S applicable to the gate driver circuit 17. The pulse output circuit 17S illustrated in FIG. 3A includes transistors M21 to M24 and a capacitor C31. The transistors and the capacitor that are included in the pulse output circuit 17S are provided in a region surrounded by a region where the pixel circuit 16el or the pixel circuit 16ps is provided (in FIG. 3A, wirings SL_M to SL_M+5 and wirings GL_N−1 to SL_N+1) (N and M are each a natural number). Note that a wiring VSSL is a wiring for supplying a voltage VSS.

In FIG. 3B, a gate clock signal CK_A, a gate clock signal CK_B, an output signal supplied to the wiring GL_N, a gate start pulse GSP supplied to the wiring GL_N−1 (or an output signal from the previous pulse output circuit), and an output signal from the subsequent pulse output circuit 17S supplied to the wiring GL_N+1 are illustrated as signals and voltages supplied to the transistors or the wirings. FIG. 3A also illustrates anode connected to the transistors M21, M22, and M23 and the capacitor C31, which is indicated by netA.

FIG. 3B is a timing chart for describing the operation of the pulse output circuit 17S illustrated in FIG. 3A. In the description with reference to FIG. 3B, the reference numeral of the wiring or the signal in FIG. 3A is replaced with that of the signal described with reference to FIG. 3B.

At time T1 in FIG. 3B, CK_A is at a low level and CK_B is at a high level, and GL_N−1 is set at the high level at this time so as to increase the voltage of netA. At time T2 that follows, GL_N−1 is at the low level, so that netA is brought into a floating state. Since CK_A is at the high level and CK_B is at the low level at the time T2, the voltage of netA in a floating state increases owing to capacitive coupling of the capacitor C31. Thus, the transistor M23 is turned on and GL_N becomes at the high level. At time T3, GL_N+1 becomes at the high level, whereby netA becomes at the low level, and CK_B becomes at the high level, whereby GL_N becomes at the low level.

FIG. 4A to FIG. 4D are diagrams for illustrating a modification example in the case of fabricating a display panel having a well-designed display surface by combining a plurality of display panels.

Figure 4A:
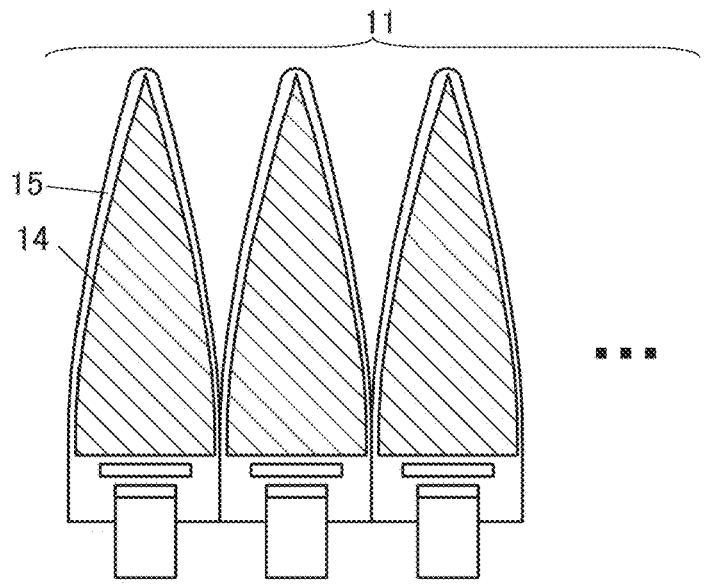
FIG. 4A to FIG. 4E are diagrams illustrating a structure example of a display apparatus.
Figure 4B:
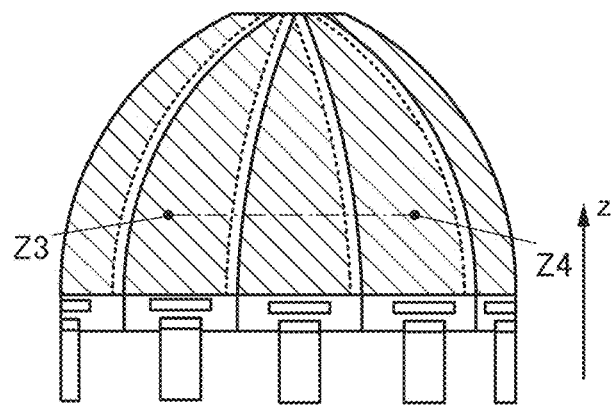
Figure 4C:
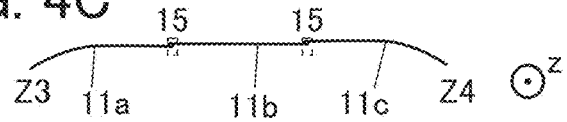

As described above, a plurality of display panels 11 illustrated in FIG. 4A each include the display portion 14 and the non-display portion 15. FIG. 4B is a front view in the case of a structure having a hemispherical display surface formed by arranging the plurality of display panels 11 illustrated in FIG. 4A. FIG. 4C is a schematic cross-sectional view in the case of cutting a portion along a surface perpendicular to the z direction (the dashed-dotted line Z3-Z4) in FIG. 4B.

In the display apparatus of one embodiment of the present invention, when the non-display portions 15 of adjacent display panels overlap with each other, the area of a region seen as the non-display portion 15 in the hemispherical display surface can be reduced as illustrated in FIG. 4C. Accordingly, a vertical stripe or a lateral stripe seen in the vicinity of the non-display portion 15 can be suppressed.

Figure 4D:
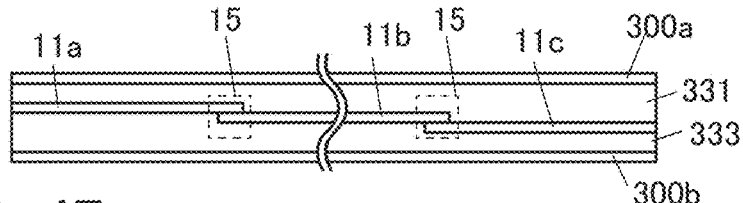

Furthermore, for adjusting the refractive index that is changed when the non-display portions 15 overlap with each other, a structure in which the display surface of the display panel 11 is covered with a resin layer is preferable. This structure is described with reference to a cross-sectional structure illustrated in FIG. 4D. FIG. 4D illustrates display panels 11a, 11b, and 11c as display panels configured so that the non-display portions 15 overlap with each other.

As illustrated in FIG. 4D, a light-transmitting resin layer 331 can be provided to cover top surfaces of the display panels 11a to 11c. By covering the top surfaces of the display panels 11a to 11c with the resin layer 331, the mechanical strength of the display panel can be increased. In addition, when the resin layer 331 is formed to have a plane, the display quality of an image displayed on a display region can be increased. For example, when a coating apparatus such as a slit coater, a curtain coater, a gravure coater, a roll coater, or a spin coater is used, the resin layer 331 with high flatness can be formed.

Furthermore, a difference in refractive index n between the resin layer 331 and the substrate used on the display surface side of the display panels 11a to 11c is preferably less than or equal to 20%, further preferably less than or equal to 10%, still further preferably less than or equal to 5%. By using the resin layer 331 with such a refractive index, the refractive index difference between the display panels 11a to 11c and the resin layer can be reduced and light can be efficiently extracted outside. In addition, the resin layer 331 with such a refractive index is provided to cover a step portion between adjacent display panels, whereby the step portion is not easily seen as a vertical stripe or a lateral stripe, and the display quality of an image displayed on the display region of the display panel can be increased.

As a material used for the resin layer 331, a resin having a high light-transmitting property is preferable; for example, an organic resin such as an epoxy resin, an aramid resin, an acrylic resin, a polyimide resin, a polyamide resin, or a polyamide-imide resin can be used.

In addition, a protective substrate 300a is preferably provided for the display panels 11a to 11c with the resin layer 331 therebetween. With the protective substrate 300a, the surface of the display apparatus can be protected, and moreover, the mechanical strength of the display apparatus can be increased. For the protective substrate 300a, a light-transmitting material is used at least in a region overlapping with the display region. Furthermore, the protective substrate 300a may have a light-blocking property so that a region other than the region overlapping with the display region is not seen.

The protective substrate 300a may have a function of a touch panel. In the case where the display panels 11a to 11c have flexibility and are capable of being bent, it is preferable that the protective substrate 300a also have flexibility.

Furthermore, a difference in refractive index n between the protective substrate 300a and the substrate or the resin layer 331 used on the display surface side of the display panels 11a to 11c is preferably less than or equal to 20%, further preferably less than or equal to 10%, still further preferably less than or equal to 5%. Note that a refractive index refers to an average refractive index with respect to visible light, specifically, light with a wavelength in the range from 400 nm to 750 nm. The average refractive index is a value obtained by dividing, by the number of measurement points, the sum of measured refractive indices with respect to light with wavelengths in the above range. Note that the refractive index of the air is 1.

As the protective substrate 300a, a film-like plastic substrate, for example, a plastic substrate made from polyimide (PI), aramid, polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), a silicone resin, or the like can be used. The protective substrate 300a preferably has flexibility.

Alternatively, as illustrated in FIG. 4D, a resin layer 333 may be provided on surfaces opposite to display surfaces of the display panels 11a to 11c and a protective substrate 300b may be provided on the surfaces with the resin layer 333 therebetween. With this structure in which the display panels 11a to 11c are sandwiched between the two protective substrates, the mechanical strength of the display apparatus can be further increased. Furthermore, when the resin layer 331 and the resin layer 333 have substantially the same thickness and materials having the same thickness are used for the protective substrate 300a and the protective substrate 300b, the plurality of display panels can be placed at the center of the stack. For example, at the time of bending the stack including the display panels, when the display panels are positioned at the center in the thickness direction, stress in the lateral direction applied to the display panels by bending is relieved, which can prevent damage.

Figure 4E:
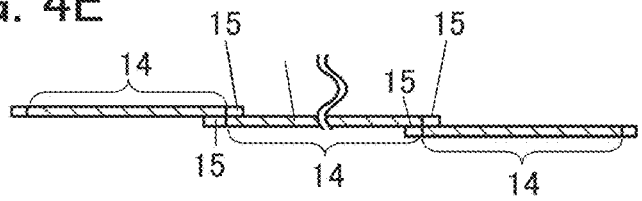

Although FIG. 4D illustrates the structure in which the non-display portions 15 of different display panels overlap with each other to reduce the area of the non-display portion 15, another structure may be employed. For example, as illustrated in FIG. 4E, arrangement may be employed in which the display portion 14 overlaps with the non-display portion 15. In this case, the non-display portion 15 has a light-transmitting property, so that an image on the display portion 14 can be seen although the display portion 14 is covered in a step portion. Accordingly, a vertical stripe or a lateral stripe in the non-display portion 15 can be made less likely to be seen.

As described above, with the structure of one embodiment of the present invention, a display apparatus with high display quality can be provided. Alternatively, with the structure of one embodiment of the present invention, a display apparatus that is highly convenient or reliable can be provided. Alternatively, with the structure of one embodiment of the present invention, flexibility in design of a display apparatus is improved and thus design of the display apparatus can be improved.

At least part of this embodiment can be implemented in combination with the other embodiments described in this specification as appropriate.

Embodiment 2

In this embodiment, a structure, which is different from that in Embodiment 1, of a highly convenient or highly reliable display apparatus configured to have a well-designed display surface and be robust against impact or the like will be described. The above description is referred to for portions similar to Embodiment 1, and detailed description of the portions is omitted.

Figure 5A:
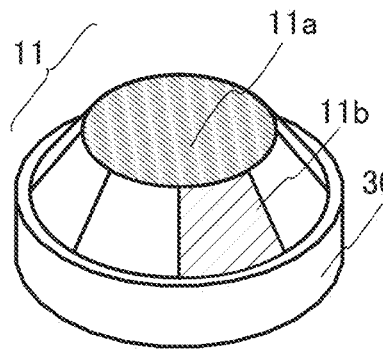
FIG. 5A to FIG. 5D are diagrams illustrating a structure example of a display apparatus.
Figure 5B:
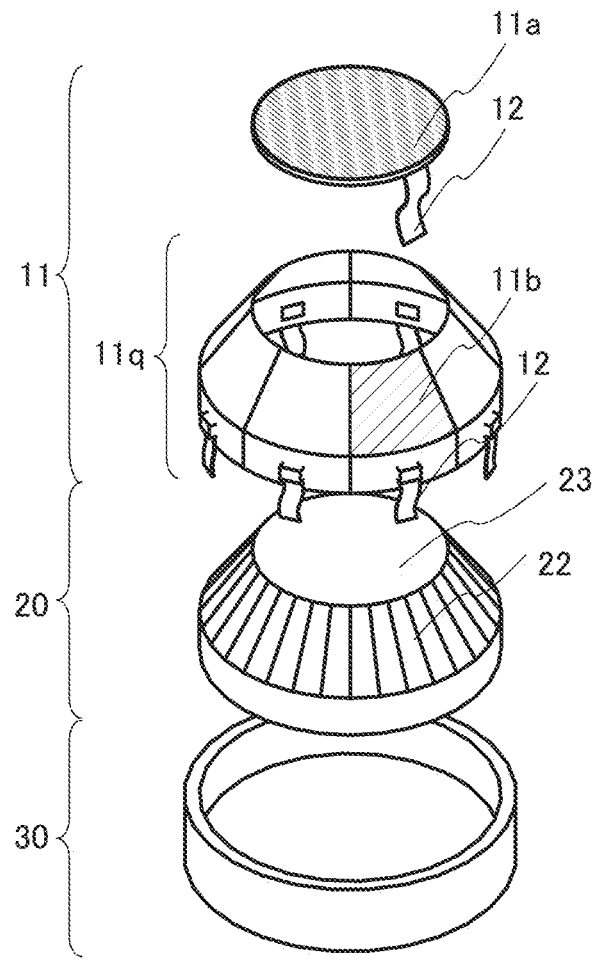
Figure 5C:
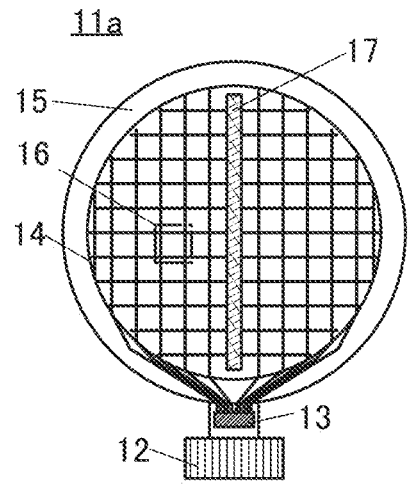
Figure 5D:
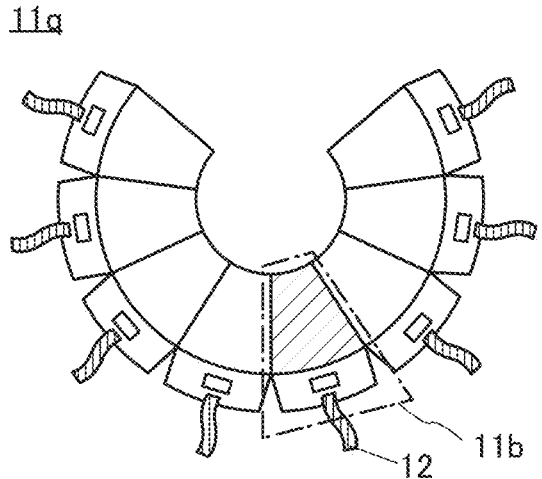

FIG. 5A is a perspective view for illustrating a display apparatus 10B of one embodiment of the present invention. FIG. 5B is an exploded schematic diagram of the display apparatus 10B illustrated in FIG. 5A. FIG. 5C is a schematic diagram for illustrating a structure example of the display panel 11a included in the display apparatus 10B. FIG. 5D is a schematic diagram for illustrating a structure example of a display panel 11q included in the display apparatus 10B.

The display apparatus 10B illustrated in FIG. 5A includes the housing 30 in which the display panel 11 composed of the display panel 11a and a plurality of display panels 11b is stored. The display panel 11 has a developable surface formed by joining the display panel 11a and the plurality of display panels 11b together.

In the display panel 11 illustrated in FIG. 5A, an example is illustrated in which a frustoconical display portion is formed by joining the display panel 11a and the plurality of display panels 11b together. With this structure, the display apparatus 10B can have a well-designed display surface.

The display apparatus 10B illustrated in FIG. 5B includes the display panel 11 including the display panel 11a and the display panel 11q composed of the plurality of display panels 11b, the fixing member 20 having a curved surface 22 and a plane 23, and the housing 30. The FPCs 12 (Flexible printed circuits) are attached to the display panel 11a and the plurality of display panels 11b and are to be stored in the housing 30.

The fixing member 20 to which the plurality of display panels 11p are fixed has a frustoconical shape formed by the curved surface 22 corresponding to the developable surface formed by joining the plurality of display panels 11b together and the plane 23 to which the display panel 11a is attached.

Anon-display portion in the display panel 11, such as the FPC 12, is stored in the housing 30 while the display panel 11a is fixed to the plane 23 of the fixing member 20 and the plurality of display panels 11b are fixed along the curved surface 22 of the fixing member. With this structure, a display apparatus having a display surface with a plane and a curved surface can be obtained.

The display panel 11a illustrated in FIG. 5C is a circular display panel. FIG. 5C illustrates the source driver circuit 13, the display portion 14, the non-display portion 15, the pixel 16, and the gate driver circuit 17, in addition to the FPC 12 illustrated in FIG. 5B.

Description of the source driver circuit 13, the display portion 14, the non-display portion 15, the pixel 16, and the gate driver circuit 17 that are included in the display panel 11a is similar to the description with reference to FIG. 2A in Embodiment 1. When the gate driver circuit 17 is composed of a transistor formed in the same step as the pixel circuit, the gate driver circuit 17 can be hardly broken even when placed in the display portion 14. The gate driver circuit 17 that can be placed in the display portion 14 enables the pixels to be driven even in a non-rectangular display portion, so that a well-designed display apparatus can be provided.

FIG. 5D illustrates a state where the display panel 11q is composed of the plurality of display panels 11b joined together. Note that a structure in which the plurality of display panels 11b are divided from each other is preferable. When the plurality of display panels 11b are combined to form the display panel 11*q*, this structure can relieve stress in a joint portion between the display panels 11*b*.

Figure 6:
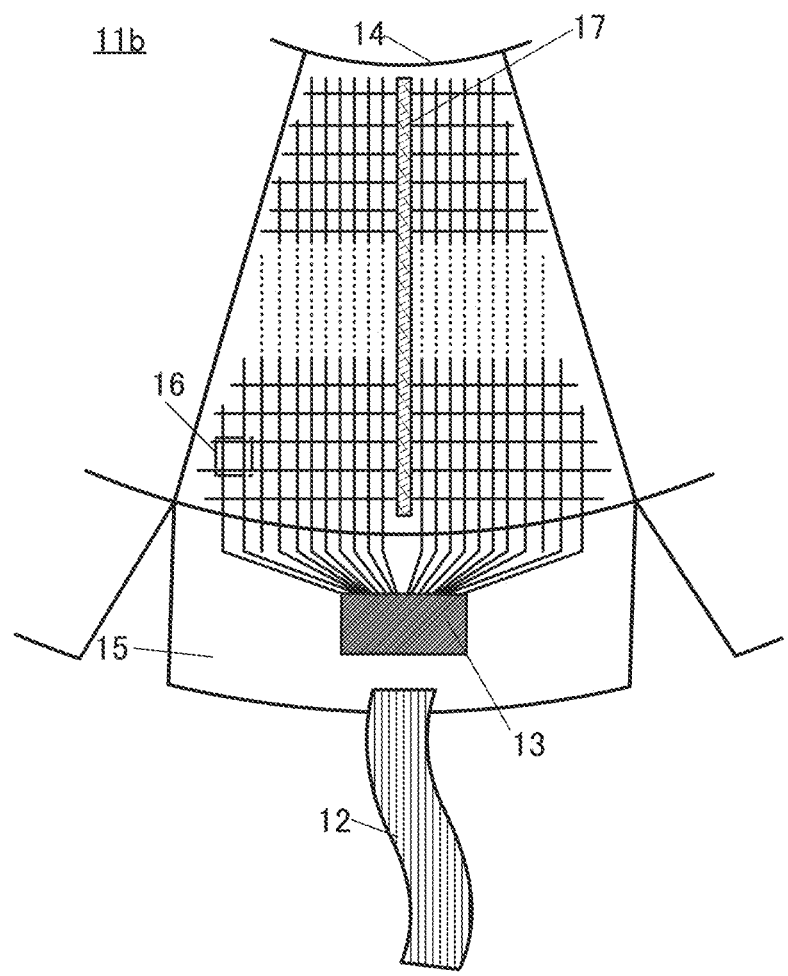
FIG. 6 is a diagram illustrating a structure example of a display apparatus.

The details of the display panel 11*b* illustrated in FIG. 5D are described with reference to FIG. 6. FIG. 6 illustrates the source driver circuit 13, the display portion 14, the non-display portion 15, the pixel 16, and the gate driver circuit 17, in addition to the FPC 12 illustrated in FIG. 5B.

Description of the source driver circuit 13, the display portion 14, the non-display portion 15, the pixel 16, and the gate driver circuit 17 that are included in the display panel 11*b* is similar to the description with reference to FIG. 2A in Embodiment 1. When the gate driver circuit 17 is composed of a transistor formed in the same step as the pixel circuit, the gate driver circuit 17 can be hardly broken even when placed in the display portion 14. The gate driver circuit 17 that can be placed in the display portion 14 enables the pixels to be driven even in a non-rectangular display portion, so that a well-designed display apparatus can be provided.

As described above, with the structure of one embodiment of the present invention, a display apparatus with high display quality can be provided. Alternatively, with the structure of one embodiment of the present invention, a display apparatus that is highly convenient or reliable can be provided. Alternatively, with the structure of one embodiment of the present invention, flexibility in design of a display apparatus is improved and thus design of the display apparatus can be improved.

At least part of this embodiment can be implemented in combination with the other embodiments described in this specification as appropriate.

Embodiment 3

In this embodiment, a structure, which is different from those in Embodiment 1 and Embodiment 2, of a highly convenient or highly reliable display apparatus configured to have a well-designed display surface and be robust against impact or the like will be described. The above description is referred to for portions similar to Embodiment 1 and Embodiment 2, and detailed description of the portions is omitted.

Figure 7A:
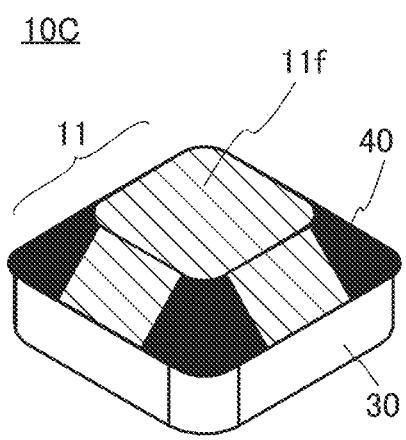
FIG. 7A and FIG. 7B are diagrams illustrating a structure example of a display apparatus.
Figure 7B:
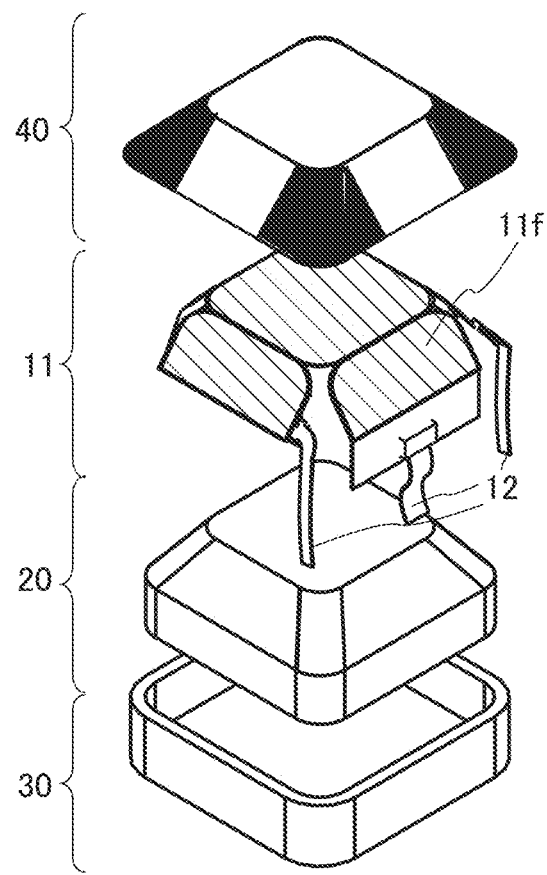

FIG. 7A is a perspective view for illustrating a display apparatus 10C of one embodiment of the present invention. FIG. 7B is an exploded schematic diagram of the display apparatus 10C illustrated in FIG. 7A.

The display apparatus 10C illustrated in FIG. 7A includes the housing 30 in which the display panel 11 composed of a display panel 11*f* is stored. The display panel 11 has a frustopyramidal developable surface formed by folding the display panel 11*f* and joining its sides together. The display apparatus 10C also includes a protective substrate 40 for blocking display on corner portions of the frustopyramidal surface.

In the display panel 11 illustrated in FIG. 7A, an example is illustrated in which a frustopyramidal display portion is formed by folding the display panel 11*f* and joining its sides together. With this structure, the display apparatus 10C can have a well-designed display surface.

The display apparatus 10C illustrated in FIG. 7B includes the protective substrate 40 for blocking display on the corner portions of the frustopyramidal surface, the display panel 11 formed by folding the display panel 11*f* and joining its sides together, the fixing member 20 for fixing frustopyramidal display, and the housing 30. The plurality of FPCs 12 (Flexible printed circuits) are attached to the display panel 11*f* and are to be stored in the housing 30.

The fixing member 20 to which the display panel 11 is fixed has a frustopyramidal shape formed by folding the display panel 11*f* and joining its sides together.

A non-display portion in the display panel 11, such as the FPC 12, is stored in the housing 30 while the display panel 1*if* is fixed to the frustopyramidal fixing member 20.

Figure 8A:
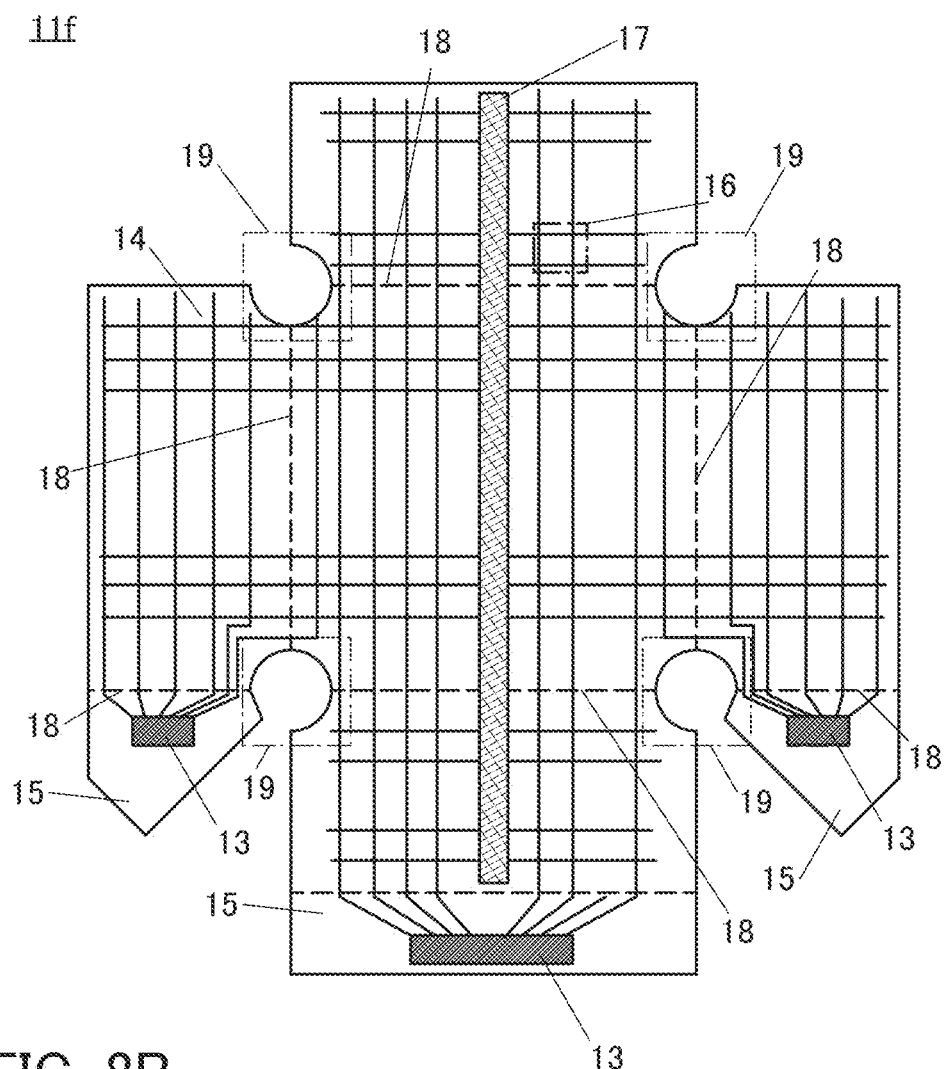
FIG. 8A and FIG. 8B are diagrams illustrating a structure example of a display apparatus.

FIG. 8A illustrates the display panel 1*if* illustrated in FIG. 7B. FIG. 8A illustrates the source driver circuit 13, the display portion 14, the non-display portion 15, the pixel 16, the gate driver circuit 17, a bending portion 18, and a notch portion 19.

Description of the source driver circuit 13, the display portion 14, the non-display portion 15, the pixel 16, and the gate driver circuit 17 that are included in the display panel 11*f* is similar to the description with reference to FIG. 2A in Embodiment 1. When the gate driver circuit 17 is composed of a transistor formed in the same step as the pixel circuit, the gate driver circuit 17 can be hardly broken even when placed in the display portion 14. The gate driver circuit 17 that can be placed in the display portion 14 enables the pixels to be driven even in a non-rectangular display portion, so that a well-designed display apparatus can be provided.

Figure 8B:
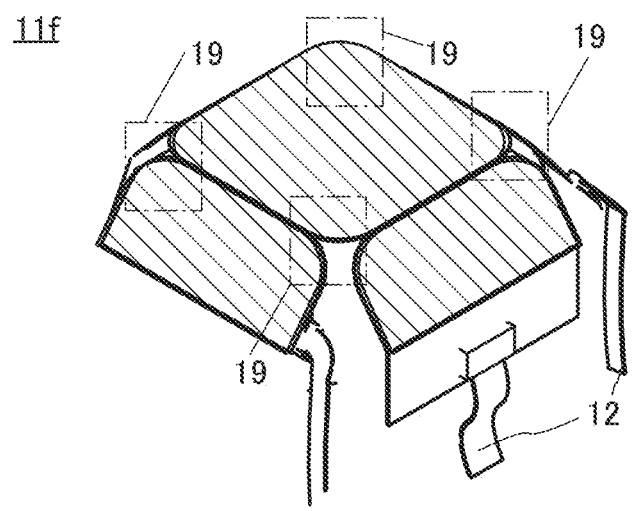

The bending portion 18 of the display panel 11*f* is bent along a side of a top surface of the fixing member 20 while the notch portion 19 is placed in a corner portion of the top surface of the fixing member 20 and then sides in a bent region are joined together, whereby the frustopyramidal display panel 11*f* illustrated in FIG. 8B can be formed. The plurality of source driver circuits 13 that are illustrated in FIG. 8A and provided in the non-display portion 15 are connected to the FPCs 12 as illustrated in FIG. 8B. With the structure including the notch portion 19 illustrated in FIG. 8A, stress generated in the corner portion when a frustopyramidal shape is formed by bending the display panel 11*f* and joining its sides together can be relieved.

Figure 9A:
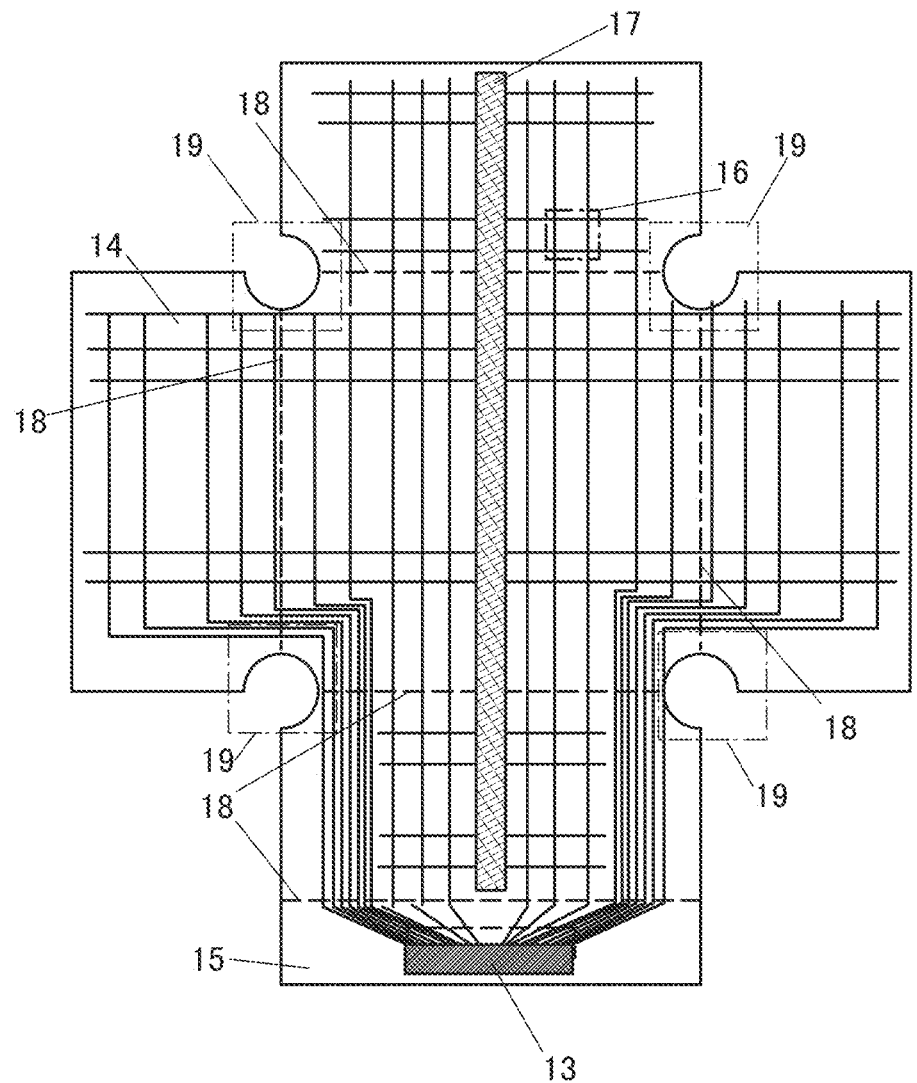
FIG. 9A to FIG. 9C are diagrams illustrating structure examples of a display apparatus.
Figure 9B:
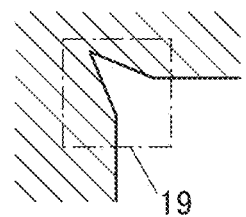
Figure 9C:
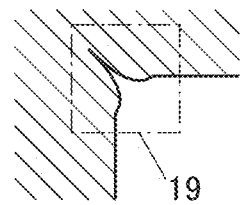

Note that the position of the source driver circuit 13 in the display panel 1*if* is not limited to that in the structure in FIG. 8A. For example, as illustrated in FIG. 9A, the source driver circuit 13 can be placed at one position. Moreover, the structure of the notch portion 19 illustrated in FIG. 8A is not limited to a circular shape and may be an acute angular shape illustrated in FIG. 9B, a slit shape illustrated in FIG. 9C, or the like.

As described above, with the structure of one embodiment of the present invention, a display apparatus with high display quality can be provided. Alternatively, with the structure of one embodiment of the present invention, a display apparatus that is highly convenient or reliable can be provided. Alternatively, with the structure of one embodiment of the present invention, flexibility in design of a display apparatus is improved and thus design of the display apparatus can be improved.

At least part of this embodiment can be implemented in combination with the other embodiments described in this specification as appropriate.

Embodiment 4

In this embodiment, specific structures of the display portion 14 in Embodiment 1 are shown below.

Figure 10A:
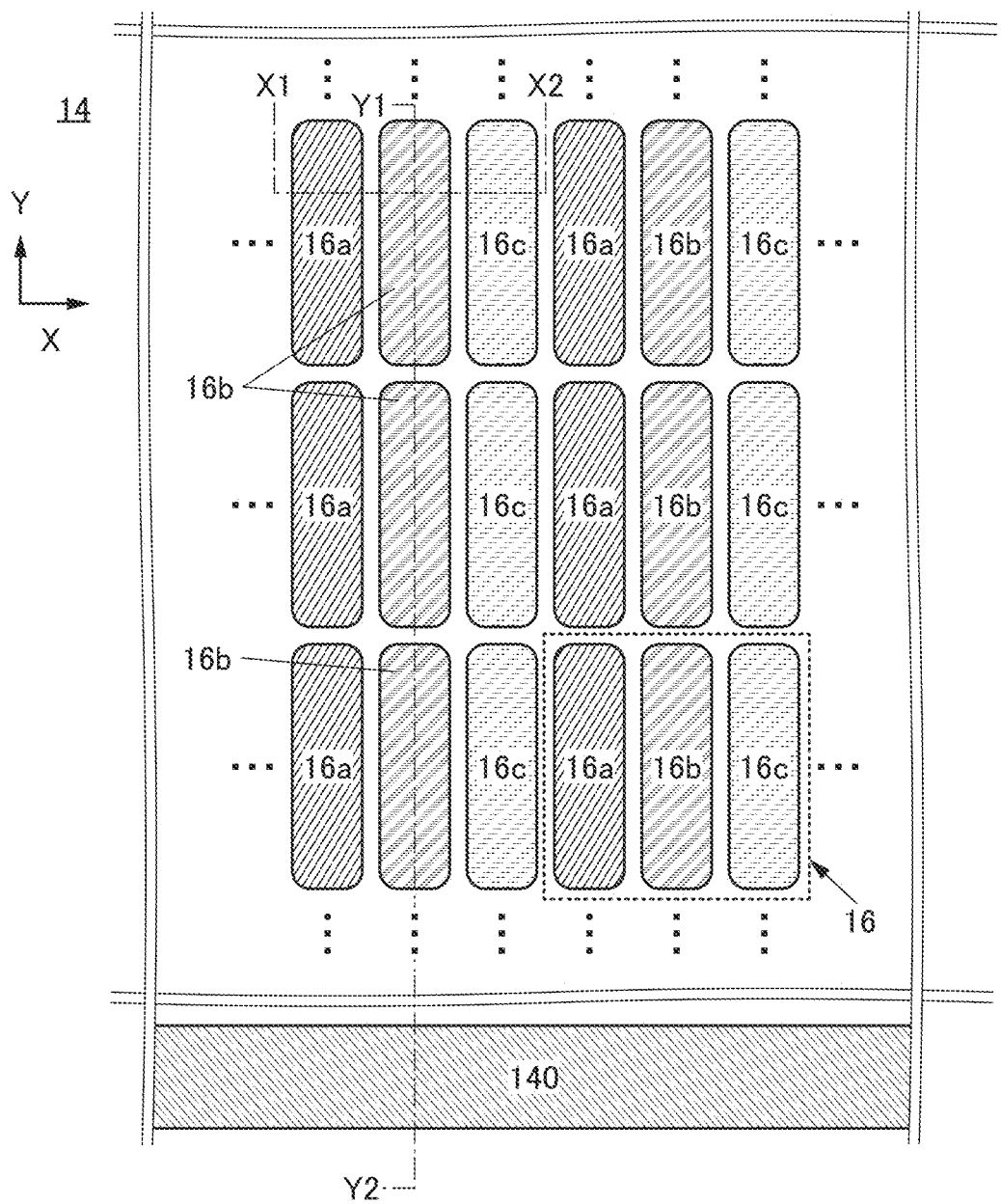
FIG. 10A and FIG. 10B are diagrams illustrating a structure example of a display apparatus.

FIG. 10A is a top view of the display portion 14. The display portion 14 includes a pixel portion where a plurality of pixels 16 are arranged in a matrix, and a connection portion 140 outside the pixel portion. A region between the pixels and the connection portion 140 are not light-emitting regions, but are included in the display portion 14.

The pixel 16 illustrated in FIG. 10A employs stripe arrangement. The pixel 16 illustrated in FIG. 10A consists of three subpixels 16a, 16b, and 16c. The subpixels 16a, 16b, and 16c include light-emitting devices that emit light of different colors. The subpixels 16a, 16b, and 16c can be subpixels of three colors of red (R), green (G), and blue (B) or subpixels of three colors of yellow (Y), cyan (C), and magenta (M), for example.

FIG. 10A illustrates an example in which subpixels of different colors are arranged in the X direction and subpixels of the same color are arranged in the Y direction. Note that subpixels of different colors may be arranged in the Y direction, and subpixels of the same color may be arranged in the X direction.

Although the top view of FIG. 10A illustrates an example in which the connection portion 140 is positioned in the lower side of the pixel portion, one embodiment of the present invention is not limited thereto. The connection portion 140 is provided in at least one of the upper side, the right side, the left side, and the lower side of the pixel portion in the top view. The number of connection portions 140 can be one or more.

Figure 10B:
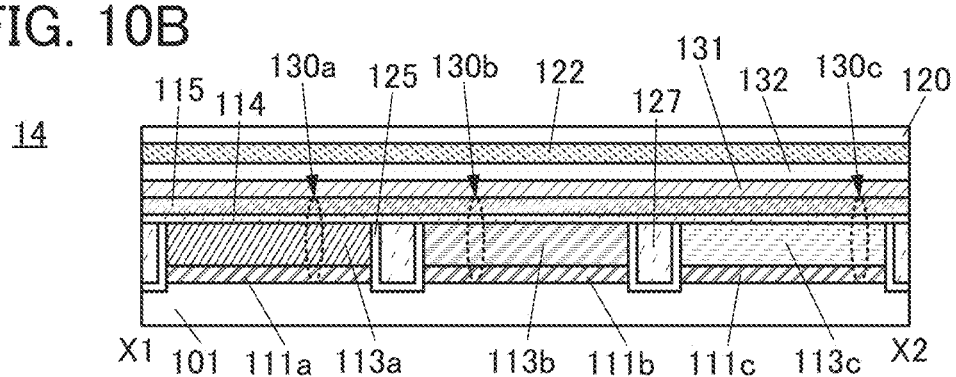

FIG. 10B is a cross-sectional view taken along the dashed-dotted line X1-X2 in FIG. 10A.

As illustrated in FIG. 10B, in the display portion 14, light-emitting devices 130a, 130b, and 130c are provided over a layer 101 including transistors, and insulating layers 131 and 132 are provided to cover the light-emitting devices. A substrate 120 is bonded above the insulating layer 132 with a resin layer 122. In a region between adjacent light-emitting devices, an insulating layer 125 and an insulating layer 127 over the insulating layer 125 are provided.

The display region of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

The layer 101 including transistors can employ a stacked-layer structure in which a plurality of transistors are provided over a substrate and an insulating layer is provided to cover these transistors, for example. The layer 101 including transistors may have a recessed portion between adjacent light-emitting devices. For example, an insulating layer positioned on the outermost surface of the layer 101 including transistors may have a recessed portion. Structure examples of the layer 101 including transistors will be described later.

The light-emitting devices 130a, 130b, and 130c emit light of different colors. Preferably, the light-emitting devices 130a, 130b, and 130c emit light of three colors, red (R), green (G), and blue (B), for example.

As each of the light-emitting devices 130a, 130b, and 130c, an EL device such as an OLED (Organic Light Emitting Diode) or a QLED (Quantum-dot Light Emitting Diode) is preferably used. Alternatively, a light-emitting device such as an inorganic light-emitting diode (including an LED, a mini LED, a micro LED, and the like) can be used. Examples of a light-emitting substance contained in the EL device include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material). Note that as a TADF material, a material that is in a thermal equilibrium state between a singlet excited state and a triplet excited state may be used. Since such a TADF material enables a short emission lifetime (excitation lifetime), an efficiency decrease of a light-emitting device in a high-luminance region can be inhibited.

The light-emitting device includes an EL layer between a pair of electrodes. In this specification and the like, one of the pair of electrodes may be referred to as a pixel electrode and the other may be referred to as a common electrode.

One of the pair of electrodes of the light-emitting device functions as an anode, and the other electrode functions as a cathode. The case where the pixel electrode functions as an anode and the common electrode functions as a cathode is described below as an example.

The light-emitting device 130a includes a pixel electrode 111a over the layer 101 including transistors, an island-shaped first organic layer 113a over the pixel electrode 111a, a fifth organic layer 114 over the island-shaped first organic layer 113a, and a common electrode 115 over the fifth organic layer 114. In the light-emitting device 130a, the first organic layer 113a and the fifth organic layer 114 can be collectively referred to as an EL layer.

There is no particular limitation on the structure of the light-emitting device in this embodiment, and either a single structure or a tandem structure can be employed. Note that structure examples of the light-emitting device will be described later in Embodiment 7.

The light-emitting device 130b includes a pixel electrode 111b over the layer 101 including transistors, an island-shaped second organic layer 113b over the pixel electrode 111b, the fifth organic layer 114 over the island-shaped second organic layer 113b, and the common electrode 115 over the fifth organic layer 114. In the light-emitting device 130b, the second organic layer 113b and the fifth organic layer 114 can be collectively referred to as an EL layer.

The light-emitting device 130c includes a pixel electrode 111c over the layer 101 including transistors, an island-shaped third organic layer 113c over the pixel electrode 111c, the fifth organic layer 114 over the island-shaped third organic layer 113c, and the common electrode 115 over the fifth organic layer 114. In the light-emitting device 130c, the third organic layer 113c and the fifth organic layer 114 can be collectively referred to as an EL layer.

The light-emitting devices of different colors share one film as the common electrode. The common electrode shared by the light-emitting devices of different colors is electrically connected to a conductive layer provided in the connection portion 140. Thus, the same potential is supplied to the common electrode included in the light-emitting devices of different colors.

A conductive film that transmits visible light is used as the electrode through which light is extracted, which is either the pixel electrode or the common electrode. A conductive film that reflects visible light is preferably used as the electrode through which light is not extracted.

As a material that forms the pair of electrodes (the pixel electrode and the common electrode) of the light-emitting device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La); and an alloy of silver, palladium, and copper (Ag—Pd—Cu, also referred to as APC).

In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not exemplified above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting device preferably employs a microcavity structure. Therefore, one of the pair of electrodes of the light-emitting device is preferably an electrode having properties of transmitting and reflecting visible light (a transflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified.

The transfective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light at wavelengths greater than or equal to 400 nm and less than 750 nm) transmittance higher than or equal to 40% is preferably used in the light-emitting device. The visible light reflectivity of the transfective electrode is higher than or equal to 10% and lower than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1 \times 10^{-2}$ Ωcm or lower.

The first organic layer 113a, the second organic layer 113b, and the third organic layer 113c are each provided to have an island shape. The first organic layer 113a, the second organic layer 113b, and the third organic layer 113c each include alight-emitting layer. The first organic layer 113a, the second organic layer 113b, and the third organic layer 113c preferably include light-emitting layers that emit light of different colors.

The light-emitting layer is a layer containing a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably contains a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from the exciplex to the light-emitting substance (phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In addition to the light-emitting layer, the first organic layer 113a, the second organic layer 113b, and the third organic layer 113c may further include a layer containing any of a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), and the like.

Either a low molecular compound or a high molecular compound can be used in the light-emitting device, and an inorganic compound may also be included. Each layer included in the light-emitting device can be formed by a method such as an evaporation method (including a vacuum evaporation method), a transfer method, a printing method, an inkjet method, or a coating method.

For example, the first organic layer 113a, the second organic layer 113b, and the third organic layer 113c may each include one or more of a hole-injection layer, a hole-transport layer, a hole-blocking layer, an electron-blocking layer, an electron-transport layer, and an electron-injection layer. A hole-injection layer, a hole-transport layer, a hole-blocking layer, an electron-blocking layer, an electron-transport layer, and an electron-injection layer are referred to as functional layers in some cases.

In the EL layer, one or more of a hole-injection layer, a hole-transport layer, a hole-blocking layer, an electron-blocking layer, an electron-transport layer, and an electron-injection layer can be used as a layer formed to be shared by the light-emitting devices of different colors. For example, a carrier-injection layer (a hole-injection layer or an electron-injection layer) may be formed as the fifth organic layer 114. Note that all the layers in the EL layer may be separately formed for the respective colors. That is, the EL layer does not necessarily include a layer formed to be shared by the light-emitting devices of different colors.

The first organic layer 113a, the second organic layer 113b, and the third organic layer 113c each preferably include a light-emitting layer and a carrier-transport layer over the light-emitting layer. Accordingly, the light-emitting layer can be inhibited from being exposed on the outermost surface during the manufacturing process of the display portion 14 and damage to the light-emitting layer can be reduced. Thus, the reliability of the light-emitting device can be increased.

The hole-injection layer is a functional layer injecting holes from an anode to a hole-transport layer, and a layer containing a material with a high hole-injection property. Examples of a material with a high hole-injection property include an aromatic amine compound and a composite material containing a hole-transport material and an acceptor material (electron-accepting material).

The hole-transport layer is a functional layer that transports holes injected from the anode by the hole-injection layer, to the light-emitting layer. The hole-transport layer is a layer containing a hole-transport material. As the hole-transport material, a substance having a hole mobility of $10^{-6}$ cm$^2$/Vs or higher is preferable. Note that other substances can also be used as long as the substances have a hole-transport property higher than an electron-transport property. As the hole-transport material, materials with a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-transport layer is a functional layer that transports electrons injected from the cathode by the electron-injection layer, to the light-emitting layer. The electron-transport layer is a layer containing an electron-transport material. As the electron-transport material, a substance having an electron mobility of $1\times10^{-6}$ cm$^2$/Vs or higher is preferable. Note that other substances can also be used as long as the substances have an electron-transport property higher than a hole-transport property. As the electron-transport material, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a functional layer that injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

As the electron-injection layer, for example, an alkali metal, an alkaline earth metal, or a compound thereof, such as lithium, cesium, ytterbium, lithium fluoride (LiF), cesium fluoride (CsF), calcium fluoride (CaF$_x$, where X is a given number), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide (LiO$_x$), or cesium carbonate can be used. In addition, the electron-injection layer may have a stacked-layer structure of two or more layers. For example, it is possible to employ a structure in which lithium fluoride is used for a first layer and ytterbium is provided for a second layer as the stacked-layer structure.

Alternatively, for the electron-injection layer, an electron-transport material may be used. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, and a pyridazine ring), and a triazine ring.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

In the case of manufacturing a light-emitting device having a tandem structure, an intermediate layer is provided between two light-emitting units. The intermediate layer has a function of injecting electrons into one of the two light-emitting units and injecting holes to the other when voltage is applied between the pair of electrodes.

For example, a material that can be used for the electron-injection layer, such as lithium, can be favorably used for the intermediate layer. As another example, a material that can be used for the hole-injection layer can be favorably used for the intermediate layer. A layer containing a hole-transport material and an acceptor material (electron-accepting material) can be used as the intermediate layer. A layer containing an electron-transport material and a donor material can be used as the intermediate layer. Forming the intermediate layer including such a layer can inhibit an increase in the driving voltage that would be caused by stacking light-emitting units.

The side surfaces of the pixel electrodes 111a, 111b, and 11c, the first organic layer 113a, the second organic layer 113b, and the third organic layer 113c are covered with the insulating layer 125 and the insulating layer 127. Thus, the fifth organic layer 114 (or the common electrode 115) can be inhibited from being in contact with the side surface of any of the pixel electrodes 111a, 111b, and 111c, the first organic layer 113a, the second organic layer 113b, and the third organic layer 113c, whereby a short circuit of the light-emitting device can be inhibited.

The insulating layer 125 preferably covers at least the side surfaces of the pixel electrodes 111a, 111b, and 111c. Moreover, the insulating layer 125 preferably covers the side surfaces of the first organic layer 113a, the second organic layer 113b, and the third organic layer 113c. The insulating layer 125 can be in contact with the side surfaces of the pixel electrodes 111a, 111b, and 111c, the first organic layer 113a, the second organic layer 113b, and the third organic layer 113c.

The insulating layer 127 is provided over the insulating layer 125 to fill a recessed portion formed in the insulating layer 125. The insulating layer 127 can overlap with the side surfaces of the pixel electrodes 111a, 111b, and 111c, the first organic layer 113a, the second organic layer 113b, and the third organic layer 113c with the insulating layer 125 therebetween.

Note that one of the insulating layer 125 and the insulating layer 127 is not necessarily provided. For example, in the case where the insulating layer 125 is not provided, the insulating layer 127 can be in contact with the side surfaces of the first organic layer 113a, the second organic layer 113b, and the third organic layer 113c. The insulating layer 127 can be provided over the protective layer 121 to fill gaps between the EL layers of the light-emitting devices.

The fifth organic layer 114 and the common electrode 115 are provided over the first organic layer 113a, the second organic layer 113b, the third organic layer 113c, the insulating layer 125, and the insulating layer 127. At the stage before the insulating layer 125 and the insulating layer 127 are provided, a level difference due to a region where the pixel electrode and the EL layer are provided and a region where the pixel electrode and the EL layer are not provided (a region between the light-emitting devices) is caused. The display region of one embodiment of the present invention can eliminate the level difference by including the insulating layer 125 and the insulating layer 127, whereby the coverage with the fifth organic layer 114 and the common electrode 115 can be improved. Consequently, it is possible to inhibit a connection defect due to disconnection. Alternatively, it is possible to inhibit an increase in electric resistance due to local thinning of the common electrode 115 by the level difference.

In order to improve the planarity of the formation surfaces of the fifth organic layer 114 and the common electrode 115, the height of the top surface of the insulating layer 125 and the height of the top surface of the insulating layer 127 are each preferably equal to or substantially equal to the height of the top surface of at least one of the first organic layer 113a, the second organic layer 113b, and the third organic layer 113c. The top surface of the insulating layer 127 preferably has a flat shape and may have a protruding portion or a recessed portion.

The insulating layer 125 includes regions in contact with the side surfaces of the first organic layer 113a, the second organic layer 113b, and the third organic layer 113c and functions as a protective insulating layer for the first organic layer 113a, the second organic layer 113b, and the third organic layer 113c. Providing the insulating layer 125 can inhibit impurities (e.g., oxygen and moisture) from entering the first organic layer 113a, the second organic layer 113b, and the third organic layer 113c through their side surfaces, resulting in a highly reliable display region.

When the width (thickness) of the insulating layer 125 in the regions in contact with the side surfaces of the first organic layer 113a, the second organic layer 113b, and the third organic layer 113c is large in the cross-sectional view, the intervals between the first organic layer 113a, the second organic layer 113b, and the third organic layer 113c increase, so that the aperture ratio may be reduced. When the width (thickness) of the insulating layer 125 is small, the effect of inhibiting impurities from entering the first organic layer 113a, the second organic layer 113b, and the third organic layer 113c through their side surfaces may be weakened. The width (thickness) of the insulating layer 125 in the regions in contact with the side surfaces of the first organic layer 113a, the second organic layer 113b, and the third organic layer 113c is preferably greater than or equal to 3 nm and less than or equal to 200 nm, further preferably greater than or equal to 3 nm and less than or equal to 150 nm, further preferably greater than or equal to 5 nm and less than or equal to 150 nm, still further preferably greater than or equal to 5 nm and less than or equal to 100 nm, still further preferably greater than or equal to 10 nm and less than or equal to 100 nm, yet further preferably greater than or equal to 10 nm and less than or equal to 50 nm. When the width (thickness) of the insulating layer 125 is within the above range, the display region can have both a high aperture ratio and high reliability.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferable because it has high selectivity with respect to the EL layer in etching and has a function of protecting the EL layer in forming the insulating layer 127 described later. In particular, when an inorganic insulating film such as an aluminum oxide film, a hafnium oxide film, or a silicon oxide film formed by an ALD method is used as the insulating layer 125, the insulating layer 125 having few pinholes and an excellent function of protecting the EL layer can be formed.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

The insulating layer 125 can be formed by a sputtering method, a CVD method, a PLD method, an ALD method, or the like. The insulating layer 125 is preferably formed by an ALD method achieving good coverage.

The insulating layer 127 provided over the insulating layer 125 has a function of filling a recessed portion of the insulating layer 125, which is formed between the adjacent light-emitting devices. In other words, the insulating layer 127 has an effect of improving the planarity of the formation surface of the common electrode 115. An insulating layer containing an organic material can be suitably used as the insulating layer 127. For the insulating layer 127, an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of any of these resins, or the like can be used, for example. For the insulating layer 127, an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin may be used. Moreover, for the insulating layer 127, a photosensitive resin can be used. A photoresist may be used for the photosensitive resin. As the photosensitive resin, a positive photosensitive material or a negative photosensitive material can be used.

The difference between the height of the top surface of the insulating layer 127 and the height of the top surface of any of the first organic layer 113a, the second organic layer 113b, and the third organic layer 113c is preferably less than or equal to 0.5 times, further preferably less than or equal to 0.3 times the thickness of the insulating layer 127, for example. As another example, the insulating layer 127 may be provided so that the height of the top surface of any of the first organic layer 113a, the second organic layer 113b, and the third organic layer 113c is greater than the height of the top surface of the insulating layer 127. As another example, the insulating layer 127 may be provided so that the height of the top surface of the insulating layer 127 is greater than the height of the top surface of the light-emitting layer included in the first organic layer 113a, the second organic layer 113b, or the third organic layer 113c.

The insulating layers 131 and 132 are preferably provided over the light-emitting devices 130a, 130b, and 130c. Providing the insulating layers 131 and 132 can improve the reliability of the light-emitting devices.

There is no limitation on the conductivity of the insulating layers 131 and 132. As the insulating layers 131 and 132, at least one type of insulating films, semiconductor films, and conductive films can be used.

The insulating layers 131 and 132 including inorganic films can inhibit deterioration of the light-emitting devices by preventing oxidation of the common electrode 115 and inhibiting entry of impurities (e.g., moisture and oxygen) into the light-emitting devices 130a, 130b, and 130c, for example; thus, the reliability of the display region can be improved.

As the insulating layers 131 and 132, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

Each of the insulating layers 131 and 132 preferably includes a nitride insulating film or a nitride oxide insulating film, and further preferably includes a nitride insulating film.

As the insulating layers 131 and 132, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the insulating layers 131 and 132, the insulating layers 131 and 132 preferably have a high visible-light-transmitting property. For example, ITO, IGZO, and aluminum oxide are preferable because they are inorganic materials having a high visible-light-transmitting property.

The insulating layers 131 and 132 can have, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (e.g., water and oxygen) into the EL layer.

Furthermore, the insulating layers 131 and 132 may each include an organic film. For example, the insulating layer 132 may include both an organic film and an inorganic film.

Different deposition methods may be employed for the insulating layer 131 and the insulating layer 132. Specifically, the insulating layer 131 may be formed by an atomic layer deposition (ALD) method and the insulating layer 132 may be formed by a sputtering method.

End portions of the top surfaces of the pixel electrodes 111a, 111b, and 111c are not covered with an insulating layer. This allows the distance between adjacent light-emitting devices to be extremely narrowed. As a result, the display region can have high resolution or high definition.

In the display portion 14 of this embodiment, the distance between the light-emitting devices can be narrowed. Specifically, the distance between the light-emitting devices, the distance between the EL layers, or the distance between the pixel electrodes can be less than 10 μm, less than or equal to 5 μm, less than or equal to 3 μm, less than or equal to 2 μm, less than or equal to 1 μm, less than or equal to 500 nm, less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus includes a region where the distance between the side surface of the first organic layer 113a and the side surface of the second organic layer 113b or the distance between the side surface of the second organic layer 113b and the side surface of the third organic layer 113c is less than or equal to 1 am, preferably less than or equal to 0.5 m (500 nm), further preferably less than or equal to 100 nm.

A light-blocking layer may be provided on a surface of the substrate 120 on the resin layer 122 side. A variety of optical members can be arranged on the outer surface of the substrate 120. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be arranged on the outer surface of the substrate 120.

For the substrate 120, any of the following can be used, for example: polyester resins such as polyethylene terephthalate (PET) and polyethylene naphthalate (PEN), a poly acrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for the substrate 120.

In the case where a circularly polarizing plate overlaps with the display region, a highly optically isotropic substrate is preferably used as the substrate included in the display apparatus. A highly optically isotropic substrate has a low birefringence (that can also be referred to as a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic resin film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the resin layer 122, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As materials for the gates, the source, and the drain of a transistor and conductive layers such as a variety of wirings and electrodes included in the display panel, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display panel, and conductive layers (e.g., a conductive layer functioning as a pixel electrode or a common electrode) included in a light-emitting device.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

[Pixel Layout]

Next, pixel layouts different from that in FIG. 10A will be described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting device.

Figure 11A:
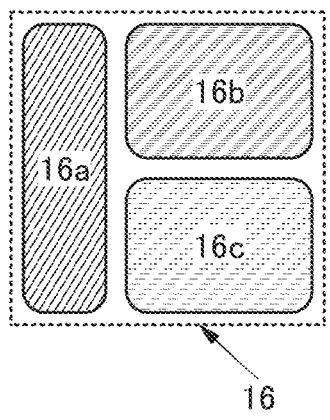
FIG. 11A to FIG. 11E are diagrams illustrating structure examples of a display apparatus.
Figure 12A:
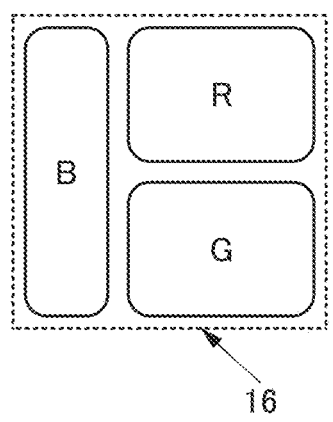
FIG. 12A to FIG. 12E are diagrams illustrating structure examples of a display apparatus.

The pixel 16 illustrated in FIG. 11A employs S-stripe arrangement. The pixel 16 illustrated in FIG. 11A consists of three subpixels 16a, 16b, and 16c. For example, as illustrated in FIG. 12A, the subpixel 16a may be the blue subpixel B, the subpixel 16b may be the red subpixel R, and the subpixel 16c may be the green subpixel G.

Figure 11B:
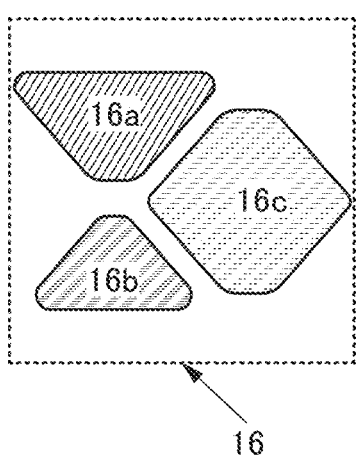
Figure 12B:
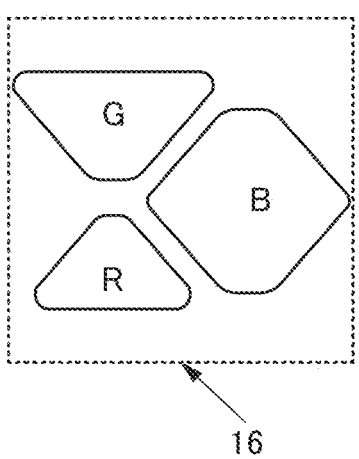

The pixel 16 illustrated in FIG. 11B includes the subpixel 16a whose top surface has a rough trapezoidal shape with rounded corners, the subpixel 16b whose top surface has a rough triangle shape with rounded corners, and the subpixel 16c whose top surface has a rough tetragonal or rough hexagonal shape with rounded corners. The subpixel 16a has a larger light-emitting area than the subpixel 16b. In this manner, the shapes and sizes of the subpixels can be determined independently. For example, the size of a subpixel including a light-emitting device with higher reliability can be smaller. For example, as illustrated in FIG. 12B, the subpixel 16a may be the green subpixel G, the subpixel 16b may be the red subpixel R, and the subpixel 16c may be the blue subpixel B.

Figure 11C:
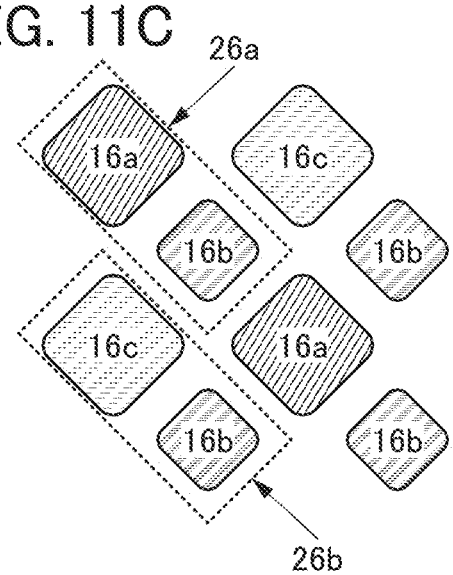
Figure 12C:
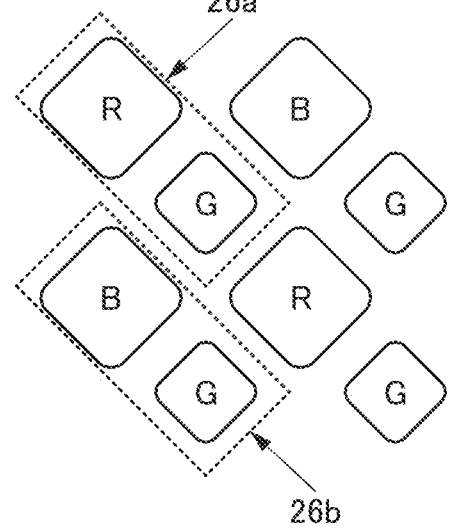

Pixels 26a and 26b illustrated in FIG. 11C employ pentile arrangement. FIG. 11C illustrates an example in which the pixels 26a, each of which includes the subpixel 16a and the subpixel 16b, and the pixels 26b, each of which includes the subpixel 16b and the subpixel 16c, are alternately arranged. For example, as illustrated in FIG. 12C, the subpixel 16a may be the red subpixel R, the subpixel 16b may be the green subpixel G, and the subpixel 16c may be the blue subpixel B.

Figure 11D:
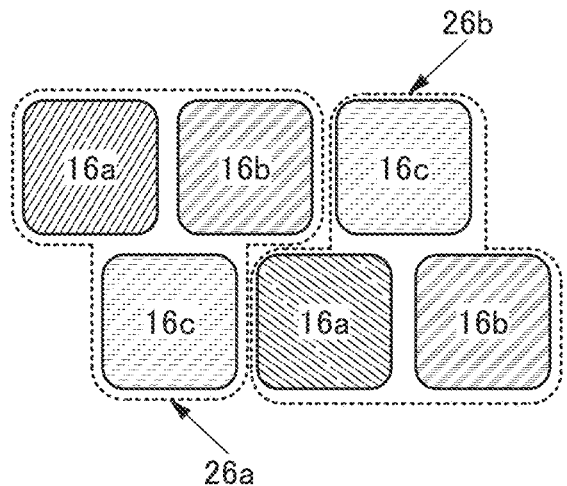
Figure 11E:
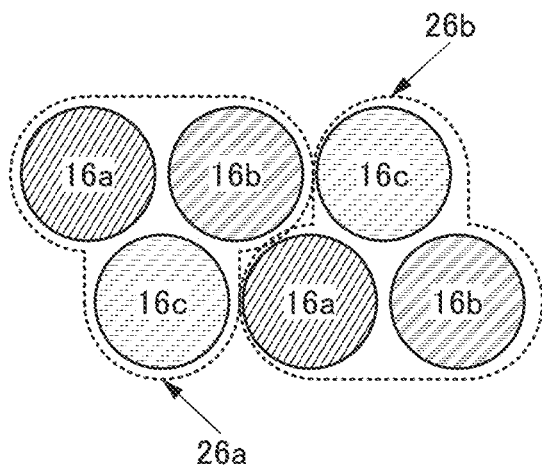
Figure 12D:
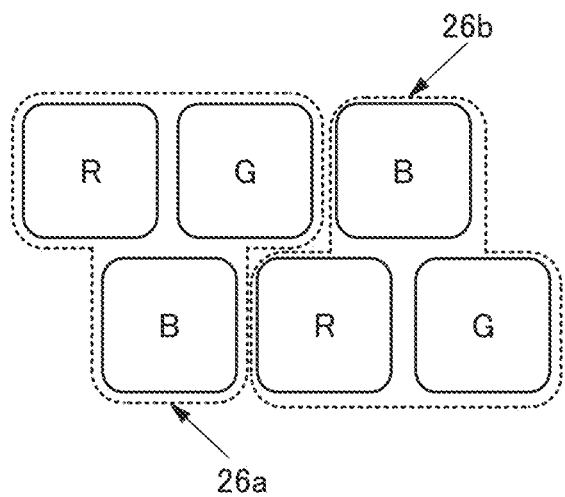

The pixels 26a and 26b illustrated in FIG. 11D and FIG. 11E employ delta arrangement. The pixel 26a includes two subpixels (the subpixels 16a and 16b) in the upper row (first row) and one subpixel (the subpixel 16c) in the lower row (second row). The pixel 26b includes one subpixel (the subpixel 16c) in the upper row (first row) and two subpixels (the subpixels 16a and 16b) in the lower row (second row). For example, as illustrated in FIG. 12D, the subpixel 16a may be the red subpixel R, the subpixel 16b may be the green subpixel G, and the subpixel 16c may be the blue subpixel B.

FIG. 11D illustrates an example in which the top surface of each subpixel has a rough tetragonal shape with rounded corners, and FIG. 11E illustrates an example in which the top surface of each subpixel is circular.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel may have a polygonal shape with rounded corners, an elliptical shape, a circular shape, or the like.

Furthermore, in the method for manufacturing the display panel of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, the top surface shape of the EL layer may be a polygonal shape with rounded corners, an elliptical shape, a circular shape, or the like. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance so that a design pattern agrees with a transferred pattern (an OPC (Optical Proximity Correction) technique) may be used. Specifically, with the OPC technique, a pattern for correction is added to a corner portion or the like of a figure on a mask pattern.

Figure 12E:
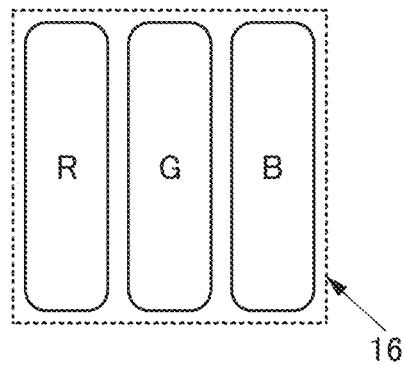

Also in the pixel 16 illustrated in FIG. 10A, which employs stripe arrangement, for example, the subpixel 16a can be the red subpixel R, the subpixel 16b can be the green subpixel G, and the subpixel 16c can be the blue subpixel B as illustrated in FIG. 12E.

In one embodiment of the present invention, an organic EL device is used as a light-emitting device.

In the display portion 14 of one embodiment of the present invention, the light-emitting devices are arranged in a matrix in the pixel portion, and an image can be displayed on the pixel portion.

The refresh rate of the display portion 14 of one embodiment of the present invention can be variable. For example, the refresh rate is adjusted (adjusted in the range from 0.1 Hz to 240 Hz, for example) in accordance with contents displayed on the display portion 14, whereby power consumption can be reduced.

At least part of this embodiment can be implemented in combination with the other embodiments described in this specification as appropriate.

Embodiment 5

In this embodiment, a light-emitting element (also referred to as a light-emitting device) and a light-receiving element (also referred to as a light-receiving device) that can be used in a display apparatus of one embodiment of the present invention will be described.

[Light-Emitting Device]

Structures of light-emitting devices can be classified roughly into a single structure and a tandem structure. A device with a single structure includes one light-emitting unit between a pair of electrodes, and the light-emitting unit preferably includes one or more light-emitting layers. To obtain white light emission in a single structure, two or more light-emitting layers are selected such that emission colors of the light-emitting layers are complementary colors. For example, when an emission color of a first light-emitting layer and an emission color of a second light-emitting layer are complementary colors, the light-emitting device can be configured to emit white light as a whole. The same applies to a light-emitting device including three or more light-emitting layers.

A device having a tandem structure includes two or more light-emitting units between a pair of electrodes, and each light-emitting unit preferably includes one or more light-emitting layers. When light-emitting layers that emit light of the same color are used in each light-emitting unit, luminance per predetermined current can be increased, and the light-emitting device can have higher reliability than that with a single structure. To obtain white light emission with a tandem structure, a structure in which white light emission can be obtained by combining light from light-emitting layers of a plurality of light-emitting units is employed. Note that a combination of emission colors for obtaining white light emission is similar to that of the case of a single structure. In the device having a tandem structure, an intermediate layer such as a charge-generation layer is suitably provided between the plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

<Structure Example of Light-Emitting Device>

Figure 13A:
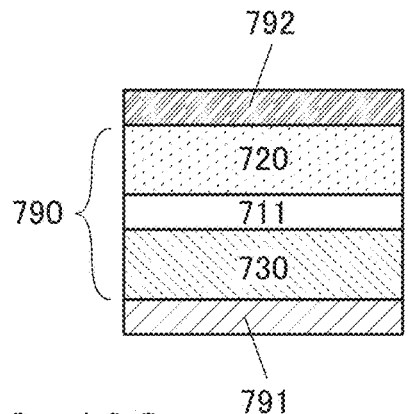
FIG. 13A to FIG. 13F are diagrams illustrating structure examples of a display apparatus.

As illustrated in FIG. 13A, the light-emitting device includes an EL layer 790 between a pair of electrodes (a lower electrode 791 and an upper electrode 792). The EL layer 790 can be formed of a plurality of layers such as a layer 720, a light-emitting layer 711, and a layer 730. The layer 720 can include, for example, a layer containing a substance with a high electron-injection property (an electron-injection layer) and a layer containing a substance with a high electron-transport property (an electron-transport layer). The light-emitting layer 711 contains a light-emitting compound, for example. The layer 730 can include, for example, a layer containing a substance with a high hole-injection property (a hole-injection layer) and a layer containing a substance with a high hole-transport property (a hole-transport layer).

The structure including the layer 720, the light-emitting layer 711, and the layer 730, which is provided between a pair of electrodes, can function as a single light-emitting unit, and the structure in FIG. 13A is referred to as a single structure in this specification.

Figure 13B:
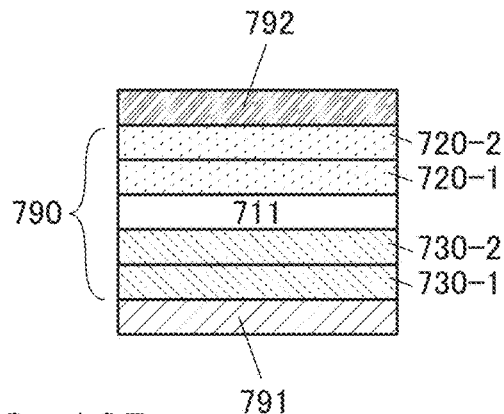

FIG. 13B is a modification example of the EL layer 790 included in the light-emitting device illustrated in FIG. 13A. Specifically, the light-emitting device illustrated in FIG. 13B includes a layer 730-1 over the lower electrode 791, a layer 730-2 over the layer 730-1, the light-emitting layer 711 over the layer 730-2, a layer 720-1 over the light-emitting layer 711, a layer 720-2 over the layer 720-1, and the upper electrode 792 over the layer 720-2. For example, when the lower electrode 791 is an anode and the upper electrode 792 is a cathode, the layer 730-1 functions as a hole-injection layer, the layer 730-2 functions as a hole-transport layer, the layer 720-1 functions as an electron-transport layer, and the layer 720-2 functions as an electron-injection layer. Alternatively, when the lower electrode 791 is a cathode and the upper electrode 792 is an anode, the layer 730-1 functions as an electron-injection layer, the layer 730-2 functions as an electron-transport layer, the layer 720-1 functions as a hole-transport layer, and the layer 720-2 functions as a hole-injection layer. With such a layered structure, carriers can be efficiently injected to the light-emitting layer 711, and the efficiency of the recombination of carriers in the light-emitting layer 711 can be enhanced.

Figure 13C:
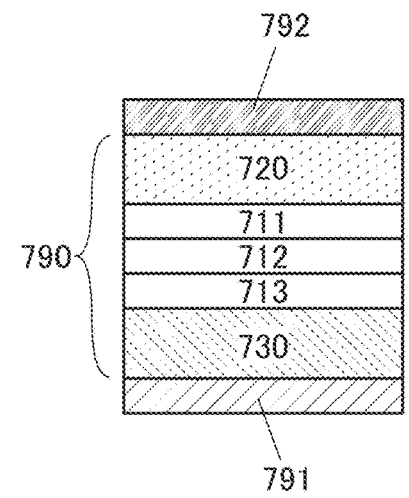
Figure 13D:
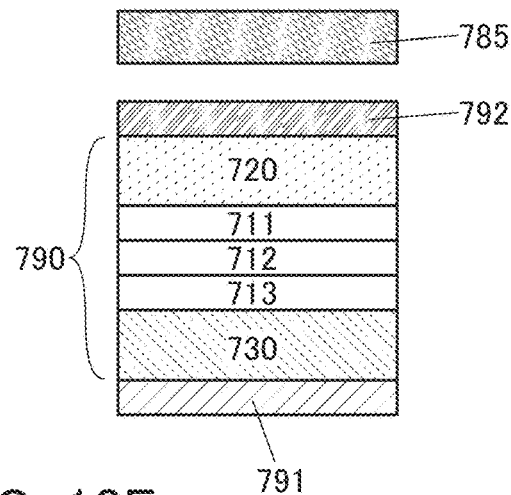

Note that structures in which a plurality of light-emitting layers (the light-emitting layers 711, 712, and 713) are provided between the layer 720 and the layer 730 as illustrated in FIG. 13C and FIG. 13D are variations of the single structure.

Figure 13E:
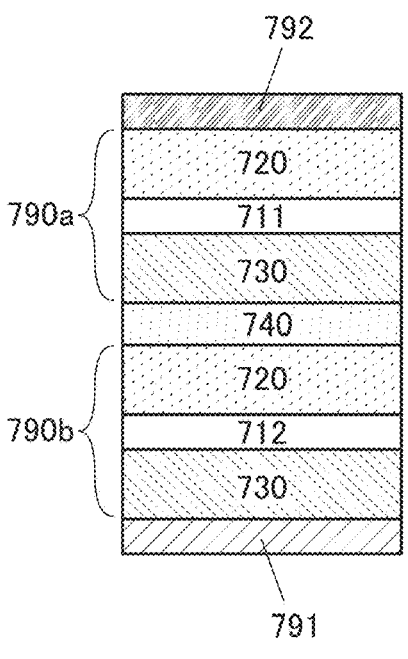
Figure 13F:
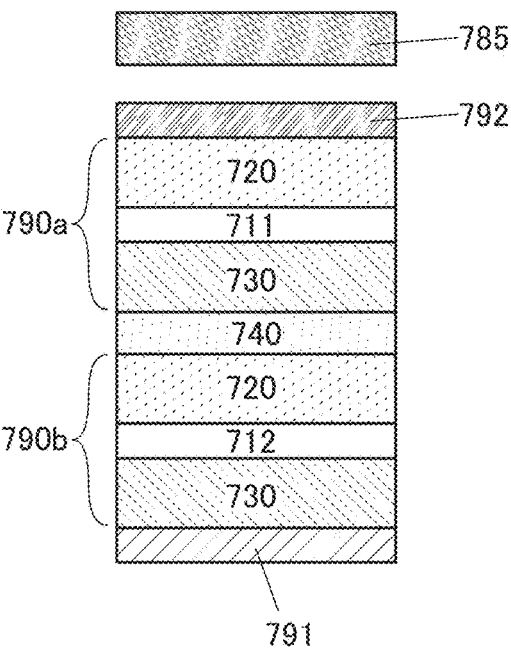

Structures in which a plurality of light-emitting units (an EL layer 790a and an EL layer 790b) are connected in series with an intermediate layer (charge-generation layer) 740 therebetween as illustrated in FIG. 13E and FIG. 13F are referred to as a tandem structure in this specification. In this specification and the like, the structures illustrated in FIG. 13E and FIG. 13F are referred to as a tandem structure; however, without being limited to this, a tandem structure may be referred to as a stack structure, for example. The tandem structure enables a light-emitting device capable of high-luminance light emission.

In FIG. 13C, light-emitting materials that emit the same light may be used for the light-emitting layer 711, the light-emitting layer 712, and the light-emitting layer 713.

Different light-emitting materials may be used for the light-emitting layer 711, the light-emitting layer 712, and the light-emitting layer 713. White light emission can be obtained when the light-emitting layer 711, the light-emitting layer 712, and the light-emitting layer 713 emit light of complementary colors. FIG. 13D illustrates an example in which a coloring layer 785 functioning as a color filter is provided. When white light passes through the color filter, light of a desired color can be obtained.

In FIG. 13E, the same light-emitting material may be used for the light-emitting layer 711 and the light-emitting layer 712. Alternatively, light-emitting materials that emit different lights may be used for the light-emitting layer 711 and the light-emitting layer 712. White light can be obtained when the light-emitting layer 711 and the light-emitting layer 712 emit light of complementary colors. FIG. 13F illustrates an example in which the coloring layer 785 is further provided.

In FIG. 13C, FIG. 13D, FIG. 13E, and FIG. 13F, the layer 720 and the layer 730 may each have a stacked-layer structure of two or more layers as illustrated in FIG. 13B.

In FIG. 13D, the same light-emitting material may be used for the light-emitting layer 711, the light-emitting layer 712, and the light-emitting layer 713. Similarly, in FIG. 13F, the same light-emitting material may be used for the light-emitting layer 711 and the light-emitting layer 712. In that case, by using a color conversion layer instead of the coloring layer 785, light of a desired color different from the emission color of the light-emitting material can be obtained. For example, a blue-light-emitting material is used for each light-emitting layer and blue light passes through the color conversion layer, whereby light with a wavelength longer than that of blue light (e.g., red light or green light) can be obtained. For the color conversion layer, a fluorescent material, a phosphorescent material, quantum dots, or the like can be used.

A structure in which emission colors (here, blue (B), green (G), and red (R)) are separately formed is referred to as an SBS (Side By Side) structure in some cases.

The emission color of the light-emitting device can be red, green, blue, cyan, magenta, yellow, white, or the like depending on the material of the EL layer 790. Furthermore, the color purity can be further increased when the light-emitting device has a microcavity structure.

The light-emitting device that emits white light preferably contains two or more kinds of light-emitting substances in the light-emitting layer. To obtain white light emission, two or more kinds of light-emitting substances are selected such that their emission colors are complementary. For example, when an emission color of a first light-emitting layer and an emission color of a second light-emitting layer are complementary colors, the light-emitting device as a whole can be configured to emit white light. The same applies to a light-emitting device including three or more light-emitting layers.

The light-emitting layer preferably contains two or more selected from light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

[Light-Receiving Device]

Figure 14A:
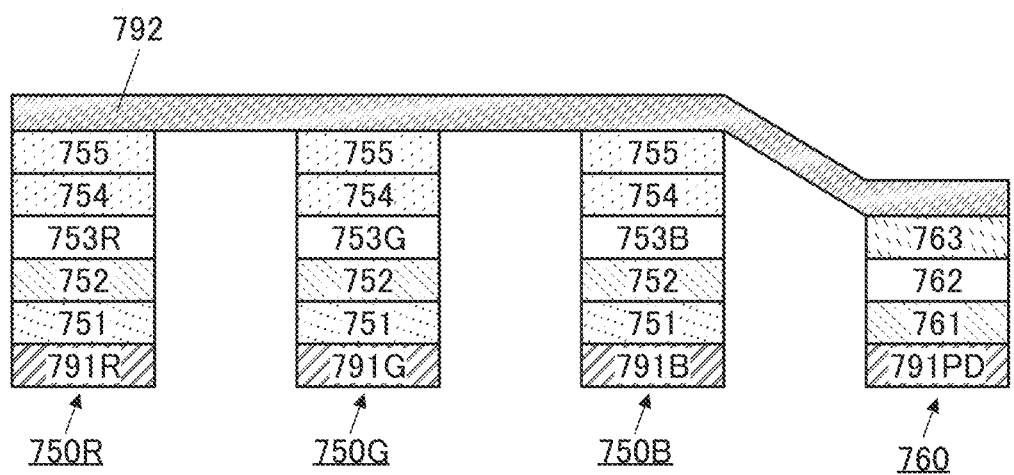
FIG. 14A and FIG. 14B are diagrams illustrating structure examples of a display apparatus.

FIG. 14A is a schematic cross-sectional view of a light-emitting device 750R, a light-emitting device 750G, a light-emitting device 750B, and a light-receiving element 760. The light-emitting device 750R, the light-emitting device 750G, the light-emitting device 750B, and the light-receiving element 760 share an upper electrode 792.

The light-emitting device 750R includes a pixel electrode 791R, a layer 751, a layer 752, a light-emitting layer 753R, a layer 754, a layer 755, and the upper electrode 792. The light-emitting device 750G includes the pixel electrode 791G and a light-emitting layer 753G. The light-emitting device 750B includes the pixel electrode 791B and a light-emitting layer 753B.

The layer 751 includes, for example, a layer containing a substance with a high hole-injection property (a hole-injection layer). The layer 752 includes, for example, a layer containing a substance with a high hole-transport property (a hole-transport layer). The layer 754 includes, for example, a layer containing a substance with a high electron-transport property (an electron-transport layer). The layer 755 includes, for example, a layer containing a substance with a high electron-injection property (an electron-injection layer).

Alternatively, the layer 751 may include an electron-injection layer, the layer 752 may include an electron-transport layer, the layer 754 may include a hole-transport layer, and the layer 755 may include a hole-injection layer.

FIG. 14A illustrates the layer 751 and the layer 752 separately; however, one embodiment of the present invention is not limited thereto. For example, the layer 752 may be omitted when the layer 751 has functions of both a hole-injection layer and a hole-transport layer or the layer 751 has functions of both an electron-injection layer and an electron-transport layer.

Note that the light-emitting layer 753R included in the light-emitting device 750R contains a light-emitting substance that emits red light, the light-emitting layer 753G included in the light-emitting device 750G contains a light-emitting substance that emits green light, and the light-emitting layer 753B included in the light-emitting device 750B contains a light-emitting substance that emits blue light. Note that the light-emitting device 750G and the light-emitting device 750B have a structure in which the light-emitting layer 753R included in the light-emitting device 750R is replaced with the light-emitting layer 753G and the light-emitting layer 753B, respectively, and the other components are similar to those of the light-emitting device 750R.

The structure (e.g., material and thickness) of the layer 751, the layer 752, the layer 754, and the layer 755 may be the same or different from each other among the light-emitting devices of different colors.

The light-receiving element 760 includes a pixel electrode 791PD, a layer 761, a layer 762, a layer 763, and the upper electrode 792. The light-receiving element 760 can be configured not to include a hole-injection layer and an electron-injection layer.

The layer 762 includes an active layer (also referred to as a photoelectric conversion layer). The layer 762 has a function of absorbing light in a specific wavelength range and generating carriers (electrons and holes).

The layer 761 and the layer 763 each include, for example, a hole-transport layer or an electron-transport layer. In the case where the layer 761 includes a hole-transport layer, the layer 763 includes an electron-transport layer. In the case where the layer 761 includes an electron-transport layer, the layer 763 includes a hole-transport layer.

In the light-receiving element 760, the pixel electrode 791PD may be an anode and the upper electrode 792 may be a cathode, or the pixel electrode 791PD may be a cathode and the upper electrode 792 may be an anode.

Figure 14B:
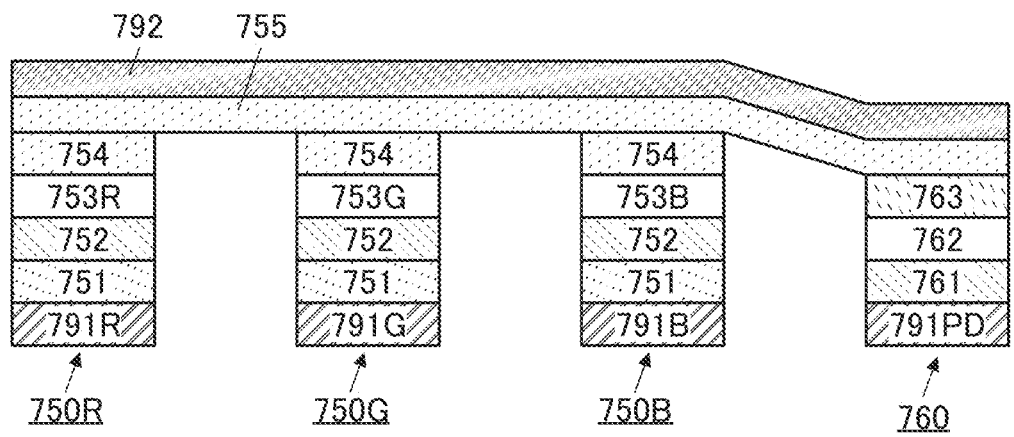

FIG. 14B is a modification example of FIG. 14A. FIG. 14B illustrates an example in which the light-emitting elements and the light-receiving element share the layer 755 as well as the upper electrode 792. In this case, the layer 755 can be referred to as a common layer. The light-emitting elements and the light-receiving element share one or more common layers in this manner, whereby the manufacturing process can be simplified, resulting in reduced manufacturing cost.

Here, the layer 755 functions as an electron-injection layer or a hole-injection layer of the light-emitting device 750. In this case, the layer 755 functions as an electron-transport layer or a hole-transport layer of the light-receiving element 760. Thus, the light-receiving element 760 illustrated in FIG. 14B is not necessarily provided with the layer 763 functioning as an electron-transport layer or a hole-transport layer.

[Light-Emitting Device]

A specific structure example of the light-emitting device will be described here.

The light-emitting device includes at least the light-emitting layer. The light-emitting device may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

Either a low molecular compound or a high molecular compound can be used in the light-emitting device, and an inorganic compound may also be included. Each layer included in the light-emitting device can be formed by a method such as an evaporation method (including a vacuum evaporation method), a transfer method, a printing method, an inkjet method, or a coating method.

For example, the light-emitting device can include one or more of a hole-injection layer, a hole-transport layer, a hole-blocking layer, an electron-blocking layer, an electron-transport layer, and an electron-injection layer.

The hole-injection layer is a layer injecting holes from an anode to a hole-transport layer, and a layer containing a material with a high hole-injection property. Examples of a material with a high hole-injection property include an aromatic amine compound and a composite material containing a hole-transport material and an acceptor material (electron-accepting material).

The hole-transport layer is a layer that transports holes injected from the anode by the hole-injection layer, to the light-emitting layer. The hole-transport layer is a layer containing a hole-transport material. As the hole-transport material, a substance having a hole mobility of $10^{-6}$ cm$^2$/Vs or higher is preferable. Note that other substances can also be used as long as the substances have a hole-transport property higher than an electron-transport property. As the hole-transport material, materials with a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-transport layer is a layer that transports electrons injected from the cathode by the electron-injection layer, to the light-emitting layer. The electron-transport layer is a layer containing an electron-transport material. As the electron-transport material, a substance having an electron mobility of $1\times10^{-6}$ cm$^2$/Vs or higher is preferable. Note that other substances can also be used as long as the substances have an electron-transport property higher than a hole-transport property. As the electron-transport material, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer that injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

As the electron-injection layer, for example, an alkali metal, an alkaline earth metal, or a compound thereof, such as lithium, cesium, ytterbium, lithium fluoride (LiF), cesium fluoride (CsF), calcium fluoride (CaF$_2$), 8-(quinolinolato) lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolato-lithium (abbreviation: LiPPP), lithium oxide (LiO$_x$), or cesium carbonate can be used. In addition, the electron-injection layer may have a stacked-layer structure of two or more layers. For example, it is possible to employ a structure in which lithium fluoride is used for a first layer and ytterbium is provided for a second layer as the stacked-layer structure.

Alternatively, for the electron-injection layer, an electron-transport material may be used. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, and a pyridazine ring), and a triazine ring.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably contains a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from the exciplex to the light-emitting substance (phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

[Light-Receiving Device]

The active layer included in the light-receiving device includes a semiconductor. Examples of the semiconductor include an inorganic semiconductor such as silicon and an organic semiconductor including an organic compound. This embodiment shows an example in which an organic semiconductor is used as the semiconductor included in the active layer. An organic semiconductor is preferably used, in which case the light-emitting layer and the active layer can be formed by the same method (e.g., a vacuum evaporation method) and thus the same manufacturing apparatus can be used.

Examples of an n-type semiconductor material contained in the active layer include electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, an electron-donating property (donor property) usually increases; however, having a spherical shape, fullerene has a high electron-accepting property even when π-electron conjugation widely spreads therein. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of the fullerene derivative include [6,6]-Phenyl-C71-butyric acid methyl ester (abbreviation: PC70BM), [6,6]-Phenyl-C61-butyric acid methyl ester (abbreviation: PC60BM), and 1',1''',4',4'''-Tetrahydro-di[1,4]methanonaphthaleno[1,2:2',3',56,60:2'',3''][5,6]fullerene-C60 (abbreviation: ICBA).

Other examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Other examples of the p-type semiconductor material include a carbazole derivative, a thiophene derivative, a furan derivative, and a compound having an aromatic amine skeleton. Furthermore, other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of the same kind, which have molecular orbital energy levels close to each other, can improve a carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing a substance with a high hole-transport property, a substance with a high electron-transport property, a substance with a bipolar property (a substance with a high electron-transport property and a high hole-transport property), or the like. Without limitation to the above, the light-receiving device may further include a layer containing a substance with a high hole-injection property, a hole-blocking material, a material with a high electron-injection property, an electron-blocking material, or the like.

Either a low molecular compound or a high molecular compound can be used in the light-receiving device, and an inorganic compound may also be included. Each layer included in the light-receiving device can be formed by a method such as an evaporation method (including a vacuum evaporation method), a transfer method, a printing method, an inkjet method, or a coating method.

As the hole-transport material or the electron-blocking material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material or the hole-blocking material, an inorganic compound such as zinc oxide (ZnO) or an organic compound such as polyethylenimine ethoxylated (PEIE) can be used. The light-receiving device may include a mixed film of PEIE and ZnO, for example.

For the active layer, a high molecular compound such as Poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to expand the wavelength range. In that case, the third material may be a low molecular compound or a high molecular compound.

The above is the description of the light-receiving device.

At least part of this embodiment can be implemented in combination with the other embodiments described in this specification as appropriate.

Embodiment 6

In this embodiment, structure examples of a light-emitting apparatus or a display apparatus that can be used for the light-emitting and light-receiving apparatus of one embodiment of the present invention are described.

One embodiment of the present invention is a display apparatus including a light-emitting element (also referred to as a light-emitting device) and a light-receiving element (also referred to as a light-receiving device). For example, three kinds of light-emitting elements emitting red (R), green (G), and blue (B) light are included, whereby a full-color display apparatus can be achieved.

In one embodiment of the present invention, fine patterning of EL layers and an EL layer and an active layer is performed by a photolithography method without a shadow mask such as a metal mask. With the patterning, a high-resolution display apparatus with a high aperture ratio, which had been difficult to achieve, can be fabricated. Moreover, EL layers can be formed separately, enabling the display apparatus to perform extremely clear display with high contrast and high display quality.

It is difficult to set the distance between EL layers for different colors or between an EL layer and an active layer to be less than 10 μm with a formation method using a metal mask, for example. In contrast, with use of the above method, the distance can be decreased to be less than or equal to 3 μm, less than or equal to 2 μm, or less than or equal to 1 μm. For example, with use of an exposure tool for LSI, the distance can be decreased to be less than or equal to 500 nm, less than or equal to 200 nm, less than or equal to 100 nm, or less than or equal to 50 nm. Accordingly, the area of a non-light-emitting region existing between two light-emitting elements or between a light-emitting element and a light-receiving element can be significantly reduced, and the aperture ratio can be close to 100%. For example, the aperture ratio is higher than or equal to 50%, higher than or equal to 60%, higher than or equal to 70%, higher than or equal to 80%, or higher than or equal to 90%; that is, an aperture ratio lower than 100% can be achieved.

Furthermore, patterns of the EL layer and the active layer themselves can be made much smaller than that in the case of using a metal mask. For example, in the case of using a metal mask for forming EL layers separately, a variation in the thickness occurs between the center and the edge of the pattern. This causes a reduction in an effective area that can be used as a light-emitting region with respect to the area of the entire pattern. In contrast, in the above manufacturing method, a pattern is formed by processing a film deposited to have a uniform thickness, which enables a uniform thickness in the pattern. Thus, even when the pattern is fine, almost the whole area can be used as alight-emitting region.

Therefore, the above manufacturing method makes it possible to obtain a high resolution display apparatus with a high aperture ratio.

In many cases, an organic film formed using an FMM (Fine Metal Mask) has an extremely small taper angle (e.g., a taper angle of greater than 0° and less than 30°) so that the thickness of the film becomes smaller in a portion closer to an end portion. Therefore, it is difficult to clearly observe a side surface of an organic film formed using an FMM because the side surface and a top surface are continuously connected. In contrast, an EL layer included in one embodiment of the present invention is processed without using an FMM, and has a clear side surface. In particular, part of the taper angle of the EL layer included in one embodiment of the present invention is preferably greater than or equal to 30° and less than or equal to 120°, further preferably greater than or equal to 60° and less than or equal to 120°.

Note that in this specification and the like, an end portion of an object having a tapered shape indicates that the end portion of the object has a cross-sectional shape in which the angle between a side surface (a surface) of the object and a surface on which the object is formed (a bottom surface) is greater than 0° and less than 90° in a region of the end portion, and the thickness continuously increases from the end portion. A taper angle refers to an angle between a bottom surface (a surface on which an object is formed) and a side surface (a surface) at an end portion of the object.

Hereinafter, a more specific example will be described.

Figure 15A:
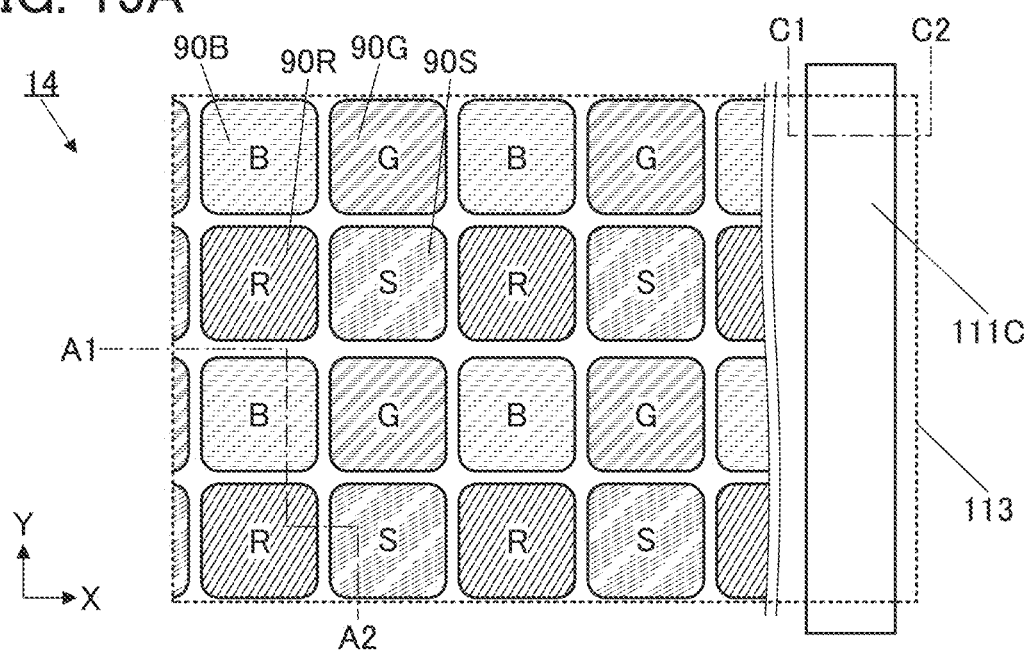
FIG. 15A and FIG. 15B are diagrams illustrating a structure example of a display apparatus.

FIG. 15A is a schematic top view of the display portion 14. The display portion 14 includes a plurality of light-emitting elements 90R emitting red light, a plurality of light-emitting elements 90G emitting green light, a plurality of light-emitting elements 90B emitting blue light, and a plurality of light-receiving elements 90S. In FIG. 4A, light-emitting regions of the light-emitting elements (and light-receiving regions of the light-receiving elements) are denoted by R, G, B, and S to easily differentiate the light-emitting elements.

The light-emitting elements 90R, the light-emitting elements 90G, the light-emitting elements 90B, and the light-receiving elements 90S are arranged in a matrix. In FIG. 15A, two elements are alternately arranged in one direction. Note that the arrangement method of the light-emitting elements is not limited thereto; another arrangement method such as stripe arrangement, S stripe arrangement, delta arrangement, Bayer arrangement, or zigzag arrangement may be used, or pentile arrangement, diamond arrangement, or the like can be used.

FIG. 15A also illustrates a connection electrode 111C that is electrically connected to a common electrode 113. The connection electrode 111C is supplied with a potential (e.g., an anode potential or a cathode potential) that is to be supplied to the common electrode 113. The connection electrode 111C is provided outside a display region where the light-emitting elements 90R and the like are arranged. In FIG. 15A, the common electrode 113 is denoted by a dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface, a top surface of the connection electrode 111C can have a band shape, an L shape, a square bracket shape, a quadrangular shape, or the like.

Figure 15B:
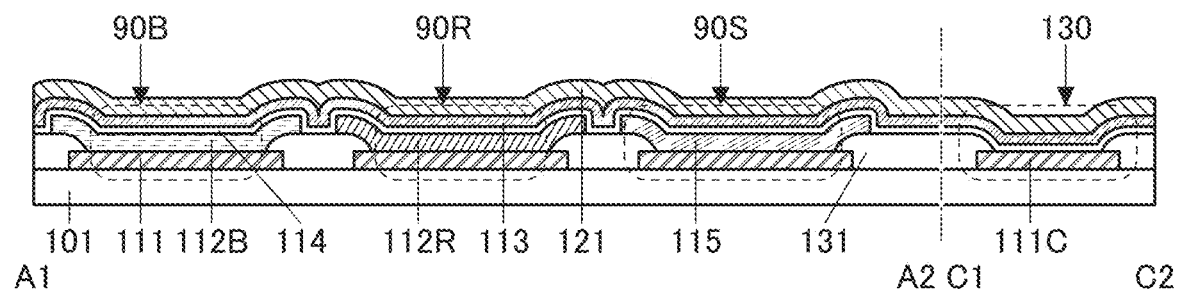

FIG. 15B is a schematic cross-sectional view taken along the dashed-dotted lines A1-A2 and C1-C2 in FIG. 15A. FIG. 15B is a schematic cross-sectional view of the light-emitting element 90B, the light-emitting element 90R, the light-receiving element 90S, and the connection electrode 111C.

Note that the light-emitting element 90G that is not illustrated in the schematic cross-sectional view can have a structure similar to that of the light-emitting element 90B or the light-emitting element 90R. Hereinafter, the description of the light-emitting element 90B or the light-emitting element 90R can be referred to for the description of the light-emitting element 90G.

The light-emitting element 90B includes a pixel electrode 111, an organic layer 112B, the organic layer 114, and the common electrode 113. The light-emitting element 90R includes the pixel electrode 111, an organic layer 112R, the organic layer 114, and the common electrode 113. The light-receiving element 90S includes the pixel electrode 111, the common electrode 115, the organic layer 114, and the common electrode 113. The organic layer 114 and the common electrode 113 are shared by the light-emitting element 90B, the light-emitting element 90R, and the light-receiving element 90S. The organic layer 114 can also be referred to as a common layer.

The organic layer 112R contains at least a light-emitting organic compound that emits light with intensity in the red wavelength range. The organic layer 112B contains at least alight-emitting organic compound that emits light with intensity in the blue wavelength range. The common electrode 115 contains a photoelectric conversion material that has sensitivity in the visible light or infrared light wavelength range. The organic layer 112R and the organic layer 112B can each be called an EL layer.

The organic layer 112R, the organic layer 112B, and the common electrode 115 may each include one or more of an electron-injection layer, an electron-transport layer, a hole-injection layer, and a hole-transport layer. The organic layer 114 does not necessarily include a light-emitting layer. For example, the organic layer 114 includes one or more of an electron-injection layer, an electron-transport layer, a hole-injection layer, and a hole-transport layer.

Here, the uppermost layer in the stacked-layer structure of the organic layer 112R, the organic layer 112B, and the common electrode 115, i.e., the layer in contact with the organic layer 114 is preferably a layer other than the light-emitting layer. For example, a structure is preferable in which an electron-injection layer, an electron-transport layer, a hole-injection layer, a hole-transport layer, or a layer other than those covers the light-emitting layer so as to be in contact with the organic layer 114. When atop surface of the light-emitting layer is protected by another layer in manufacturing each light-emitting element, the reliability of the light-emitting element can be improved.

The pixel electrode 111 is provided for each element. The common electrode 113 and the organic layer 114 are provided as layers common to the light-emitting elements. A conductive film that transmits visible light is used for either the respective pixel electrodes or the common electrode 113, and a reflective conductive film is used for the other. When the respective pixel electrodes are light-transmitting electrodes and the common electrode 113 is a reflective electrode, a bottom-emission display apparatus is obtained. When the respective pixel electrodes are reflective electrodes and the common electrode 113 is a light-transmitting electrode, atop-emission display apparatus is obtained. Note that when both the respective pixel electrodes and the common electrode 113 are light-transmitting electrodes, a dual-emission display apparatus can be obtained.

The insulating layer 131 is provided to cover end portions of the pixel electrode 111. The end portions of the insulating layer 131 are preferably tapered. Note that in this specification and the like, an end portion of an object having a tapered shape indicates that the end portion of the object has a cross-sectional shape in which the angle between a surface of the object and a surface on which the object is formed is greater than 0° and less than 90° in a region of the end portion, and the thickness continuously increases from the end portion.

When an organic resin is used for the insulating layer 131, a surface of the insulating layer 131 can be moderately curved. Thus, coverage with a film formed over the insulating layer 131 can be improved.

Examples of materials that can be used for the insulating layer 131 include an acrylic resin, a polyimide resin, an epoxy resin, a polyamide resin, a polyimide-amide resin, a siloxane resin, a benzocyclobutene-based resin, a phenol resin, and precursors of these resins.

Alternatively, an inorganic insulating material may be used for the insulating layer 131. Examples of inorganic insulating materials that can be used for the insulating layer 131 include oxides and nitride films such as silicon oxide, silicon oxynitride, silicon nitride oxide, silicon nitride, aluminum oxide, aluminum oxynitride, and hafnium oxide. Yttrium oxide, zirconium oxide, gallium oxide, tantalum oxide, magnesium oxide, lanthanum oxide, cerium oxide, neodymium oxide, or the like may be used.

As illustrated in FIG. 15B, there are gaps between two organic layers of the light-emitting elements that emit light of different colors and between two organic layers of the light-emitting element and the light-receiving element. The organic layer 112R, the organic layer 112B, and the common electrode 115 are thus preferably provided so as not to be in contact with each other. This favorably prevents unintentional light emission from being caused by current flowing through adjacent two organic layers. As a result, the contrast can be increased to achieve a display apparatus with high display quality.

The organic layer 112R, the organic layer 112B, and the common electrode 115 each preferably have a taper angle of greater than or equal to 30°. In an end portion of each of the organic layer 112R, an organic layer 112G, and the organic layer 112B, the angle between a side surface (a surface) of the layer and a bottom surface of the layer (a surface on which the layer is formed) is preferably greater than or equal to 30° and less than or equal to 120°, further preferably greater than or equal to 45° and less than or equal to 120°, still further preferably greater than or equal to 60° and less than or equal to 120°. Alternatively, the organic layer 112R, the organic layer 112G, and the organic layer 112B each preferably have a taper angle of 90° or a neighborhood thereof (greater than or equal to 80° and less than or equal to 100°, for example).

The protective layer 121 is provided over the common electrode 113. The protective layer 121 has a function of preventing diffusion of impurities such as water into each light-emitting element from the above.

The protective layer 121 can have, for example, a single-layer structure or a stacked-layer structure including at least an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as indium gallium oxide or indium gallium zinc oxide may be used for the protective layer 121.

As the protective layer 121, a stacked film of an inorganic insulating film and an organic insulating film can be used. For example, a structure in which an organic insulating film is sandwiched between a pair of inorganic insulating films is preferable. Furthermore, it is preferable that the organic insulating film function as a planarization film. With this structure, a top surface of the organic insulating film can be flat, and accordingly, coverage with the inorganic insulating film over the organic insulating film is improved, leading to an improvement in barrier properties. Moreover, atop surface of the protective layer 121 is flat, which is preferable because when a component (e.g., a color filter, an electrode of a touch sensor, or a lens array) is provided above the protective layer 121, the component is less affected by an uneven shape caused by the lower structure.

In the connection portion 130, the common electrode 113 is provided on and in contact with the connection electrode 111C and the protective layer 121 is provided to cover the common electrode 113. In addition, the insulating layer 131 is provided to cover end portions of the connection electrode 111C.

A structure example of a display apparatus that is partly different from that in FIG. 15B is described below. Specifically, an example in which the insulating layer 131 is not provided is described.

Figure 16A:
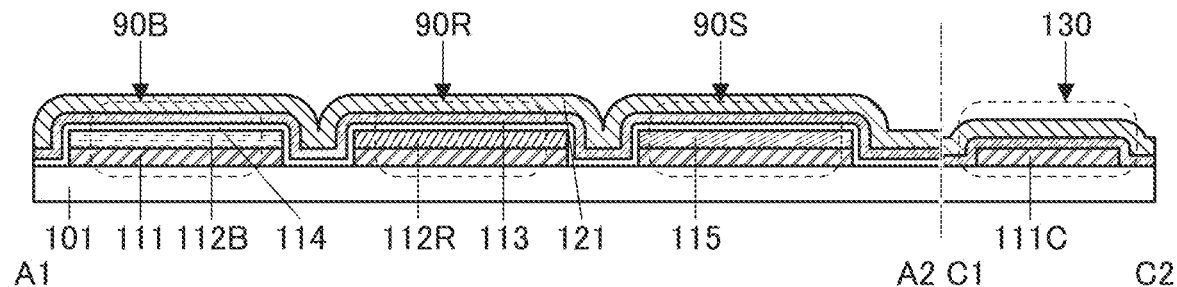
FIG. 16A to FIG. 16D are diagrams illustrating structure examples of a display apparatus.
Figure 16B:
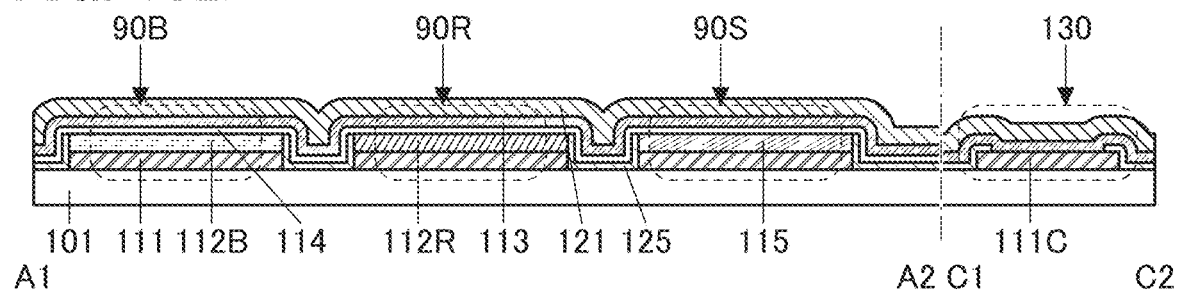
Figure 16C:
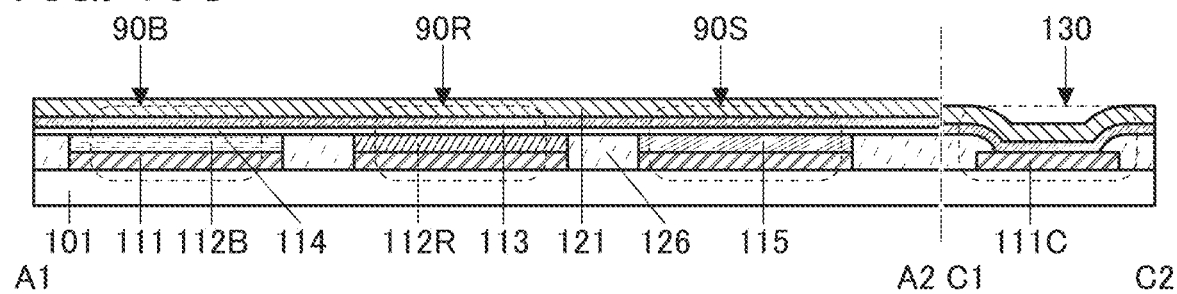

FIG. 16A to FIG. 16C show examples of the case where a side surface of the pixel electrode 111 is substantially aligned with a side surface of the organic layer 112R, the organic layer 112B, or the common electrode 115.

In FIG. 16A, the organic layer 114 is provided to cover top surfaces and side surfaces of the organic layer 112R, the organic layer 112B, and the common electrode 115. The organic layer 114 can prevent the pixel electrode 111 and the common electrode 113 from being in contact with each other and being electrically short-circuited.

FIG. 16B shows an example in which the insulating layer 125 is provided to be in contact with the side surfaces of the organic layer 112R, the organic layer 112G, the organic layer 112B, and the pixel electrode 111. The insulating layer 125 can prevent the pixel electrode 111 and the common electrode 113 from being electrically short-circuited and effectively inhibit leakage current therebetween.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when an inorganic insulating film such as an aluminum oxide film, a hafnium oxide film, or a silicon oxide film formed by an ALD method is used as the insulating layer 125, the insulating layer 125 having few pinholes and an excellent function of protecting the organic layer can be formed.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

The insulating layer 125 can be formed by a sputtering method, a CVD method, a PLD method, an ALD method, or the like. The insulating layer 125 is preferably formed by an ALD method achieving good coverage.

In FIG. 16C, resin layers 126 are provided between two adjacent light-emitting elements and between the light-emitting element and the light-receiving element so as to fill the gap between two facing pixel electrodes and the gap between two facing organic layers. The resin layer 126 can planarize the surface on which the organic layer 114, the common electrode 113, and the like are formed, which prevents disconnection of the common electrode 113 due to poor coverage in a step between adjacent light-emitting elements.

An insulating layer containing an organic material can be suitably used as the resin layer 126. For the resin layer 126, an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of any of these resins, or the like can be used, for example. For the resin layer 126, an organic material such as polyvinyl alcohol (PVA), polyvinyl butyral, polyvinylpyrrolidone, polyethylene glycol, polyglycerin, pullulan, water-soluble cellulose, or an alcohol-soluble poly amide resin may be used. Moreover, for the resin layer 126, a photosensitive resin can be used. A photoresist may be used for the photosensitive resin. As the photosensitive resin, a positive photosensitive material or a negative photosensitive material can be used.

A colored material (e.g., a material containing a black pigment) may be used for the resin layer 126 so that the resin layer 126 has a function of blocking stray light from an adjacent pixel and inhibiting color mixture.

Figure 16D:
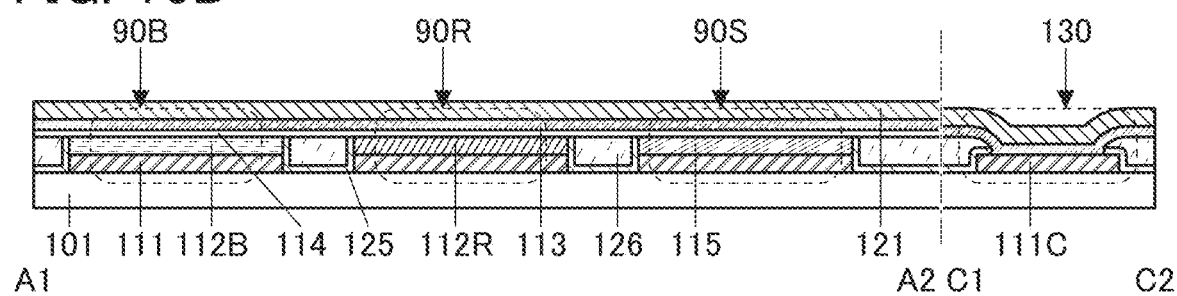

In FIG. 16D, the insulating layer 125 and the resin layer 126 over the insulating layer 125 are provided. Since the insulating layer 125 prevents the organic layer 112R or the like from being in contact with the resin layer 126, impurities such as moisture included in the resin layer 126 can be prevented from being diffused into the organic layer 112R or the like, whereby a highly reliable display apparatus can be provided.

A reflective film (e.g., a metal film containing one or more of silver, palladium, copper, titanium, aluminum, and the like) may be provided between the insulating layer 125 and the resin layer 126 so that light emitted from the light-emitting layer is reflected by the reflective film; hence, the display apparatus may be provided with a function of increasing the light extraction efficiency.

Figure 17A:
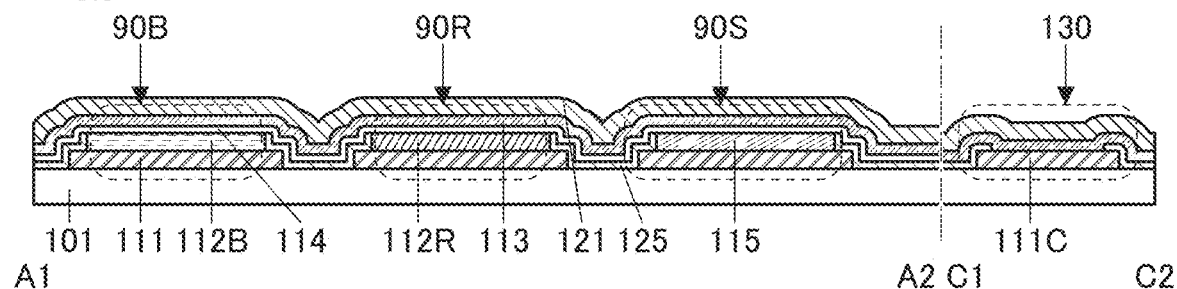
FIG. 17A to FIG. 17C are diagrams illustrating structure examples of a display apparatus.
Figure 17B:
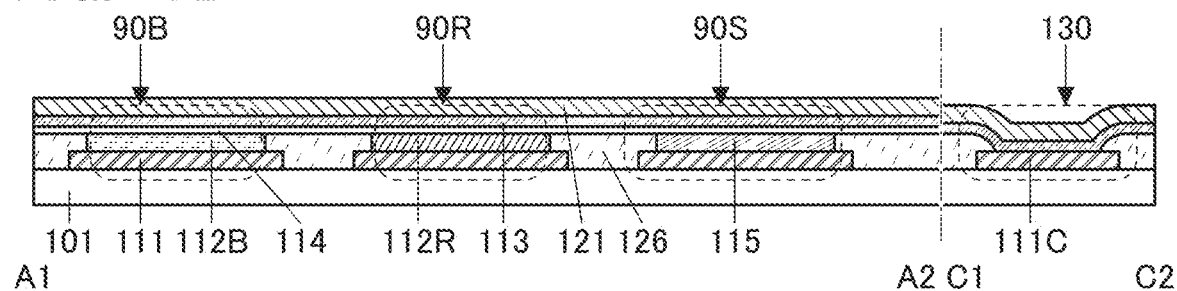
Figure 17C:
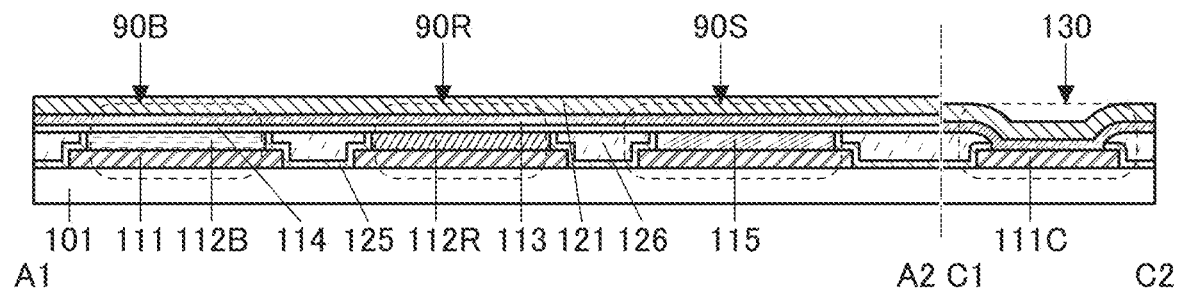

FIG. 17A to FIG. 17C show examples in which the width of the pixel electrode 111 is larger than the width of the organic layer 112R, the organic layer 112B, or the common electrode 115. The organic layer 112R or the like is provided on the inner side than end portions of the pixel electrode 111.

FIG. 17A shows an example in which the insulating layer 125 is provided. The insulating layer 125 is provided to cover the side surfaces of the organic layers included in the light-emitting element and the light-receiving element and part of a top surface and the side surfaces of the pixel electrode 111.

FIG. 17B shows an example in which the resin layer 126 is provided. The resin layer 126 is positioned between two adjacent light-emitting elements or between the light-emitting element and the light-receiving element, and covers the side surfaces of the organic layers and the top surface and the side surfaces of the pixel electrode 111.

FIG. 17C shows an example in which both the insulating layer 125 and the resin layer 126 are provided. The insulating layer 125 is provided between the organic layer 112R or the like and the resin layer 126.

FIG. 18A to FIG. 18E show examples in which the width of the pixel electrode 111 is smaller than the width of the organic layer 112R, the organic layer 112B, or the common electrode 115. The organic layer 112R or the like extends to an outer side beyond the end portions of the pixel electrode 111.

Figure 18A:
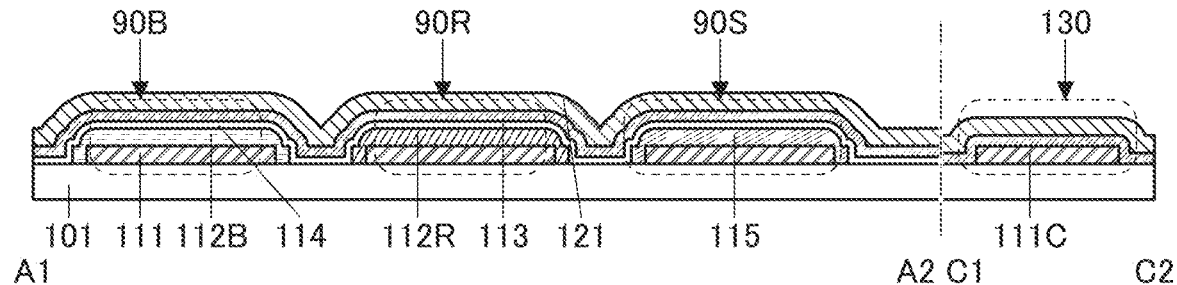
FIG. 18A to FIG. 18D are diagrams illustrating structure examples of a display apparatus.
Figure 18B:
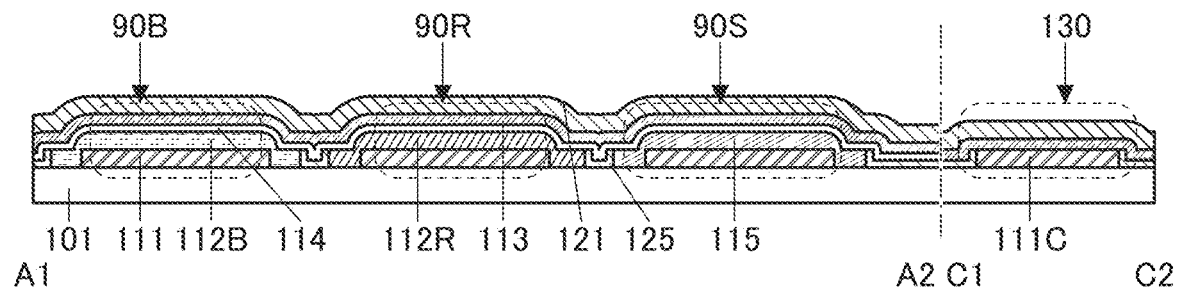

FIG. 18B shows an example in which the insulating layer 125 is provided. The insulating layer 125 is provided in contact with the side surfaces of the organic layers of two adjacent light-emitting elements. The insulating layer 125 may be provided to cover not only the side surface but also part of the top surface of the organic layer 112R or the like.

Figure 18C:
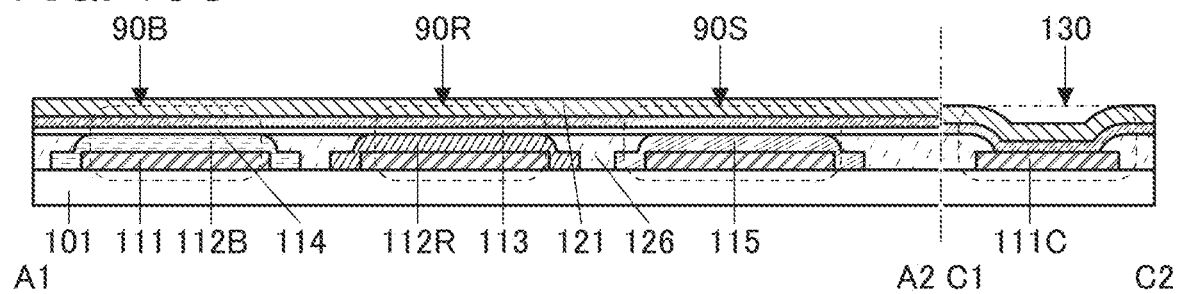

FIG. 18C shows an example in which the resin layer 126 is provided. The resin layer 126 is positioned between two adjacent light-emitting elements and covers the side surface and part of the top surface of the organic layer 112R or the like. The resin layer 126 may be formed to be in contact with the side surface of the organic layer 112R or the like and not to cover the top surface thereof.

Figure 18D:
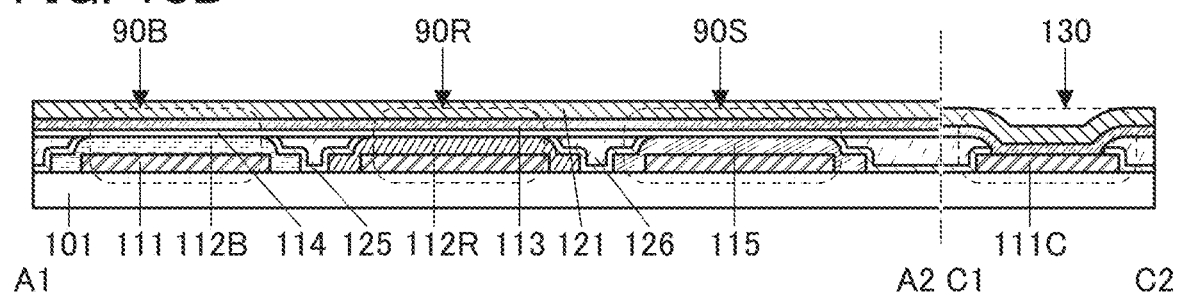

FIG. 18D shows an example in which both the insulating layer 125 and the resin layer 126 are provided. The insulating layer 125 is provided between the organic layer 112R or the like and the resin layer 126.

Here, a structure example of the resin layer 126 is described.

A top surface of the resin layer 126 is preferably as flat as possible; however, the surface of the resin layer 126 may be concave or convex depending on an uneven shape of a surface on which the resin layer 126 is formed, the formation conditions of the resin layer 126, or the like.

FIG. 19A to FIG. 20F are each an enlarged view of an end portion of the pixel electrode 111R included in the light-emitting element 90R, an end portion of the pixel electrode 111G included in the light-emitting element 90G, and the vicinity thereof. The organic layer 112G is provided over the pixel electrode 111G.

Figure 19A:
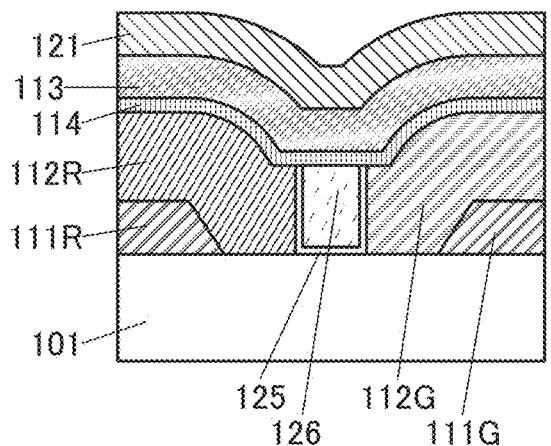
FIG. 19A to FIG. 19F are diagrams illustrating structure examples of a display apparatus.
Figure 19D:
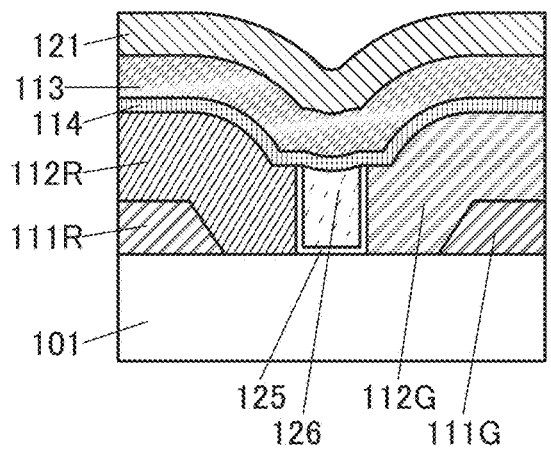
Figure 19B:
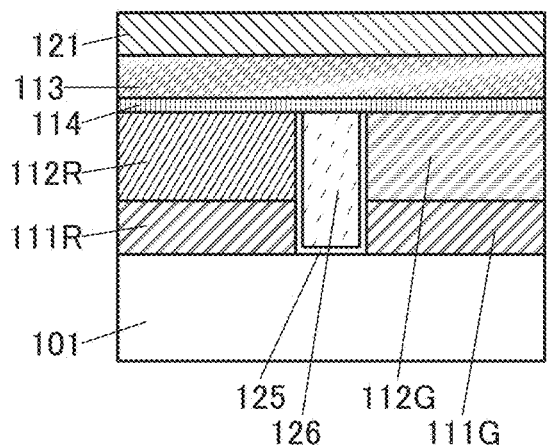
Figure 19E:
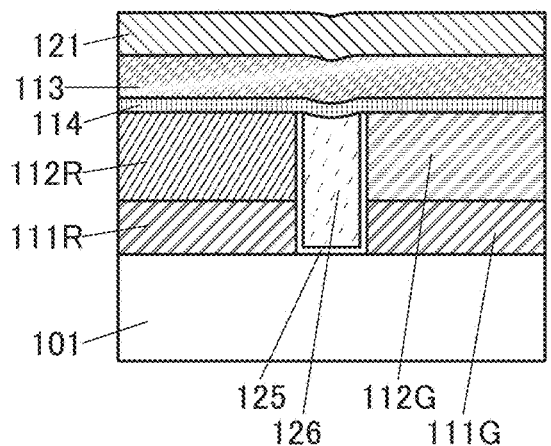
Figure 19C:
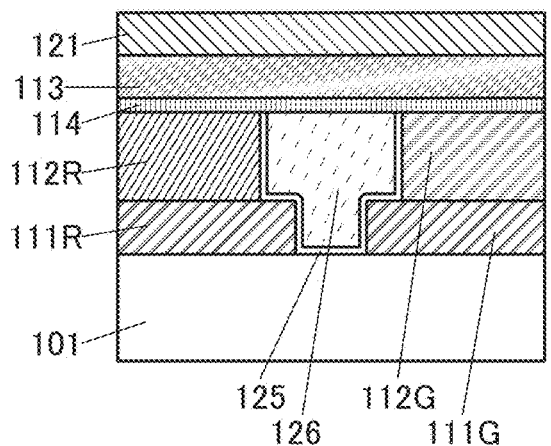

FIG. 19A, FIG. 19B, and FIG. 19C are each an enlarged view of the resin layer 126 and the vicinity thereof in the case where the resin layer 126 has a flat top surface. FIG. 19A shows an example of the case where the organic layer 112R or the like has a larger width than the pixel electrode 111. FIG. 19B shows an example in which these widths are substantially the same. FIG. 19C shows an example of the case where the organic layer 112R or the like has a smaller width than the pixel electrode 111.

The organic layer 112R is provided to cover the end portions of the pixel electrode 111 as illustrated in FIG. 19A, so that the end portion of the pixel electrode 111 is preferably tapered. Accordingly, the step coverage with the organic layer 112R is improved and a highly reliable display apparatus can be provided.

Figure 19F:
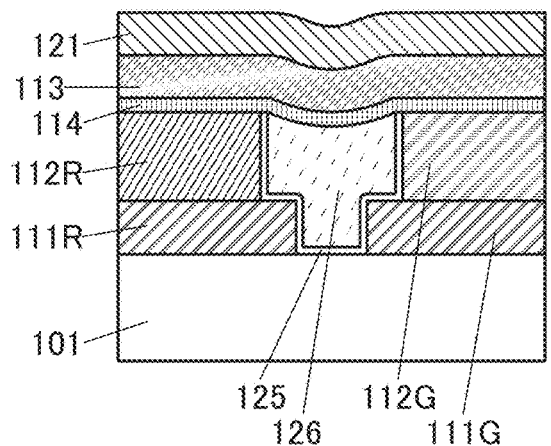

FIG. 19D, FIG. 19E, and FIG. 19F show examples of the case where the top surface of the resin layer 126 is concave.

In this case, a concave portion that reflects the concave top surface of the resin layer 126 is formed on each of top surfaces of the organic layer 114, the common electrode 113, and the protective layer 121.

Figure 20A:
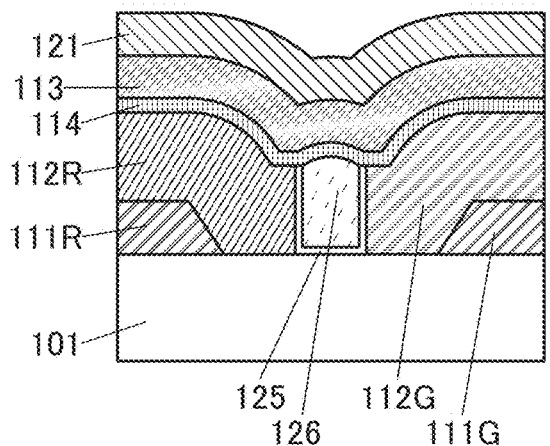
FIG. 20A to FIG. 20F are diagrams illustrating structure examples of a display apparatus.
Figure 20D:
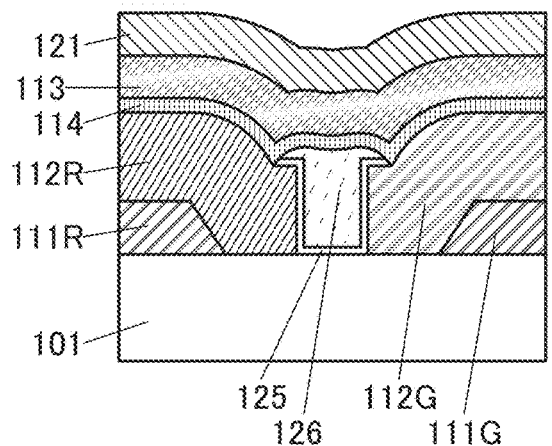
Figure 20B:
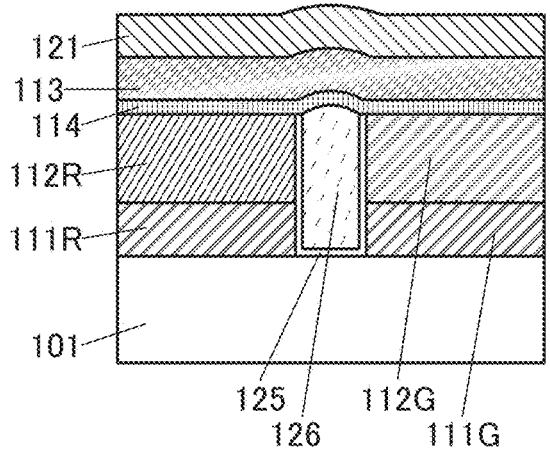
Figure 20E:
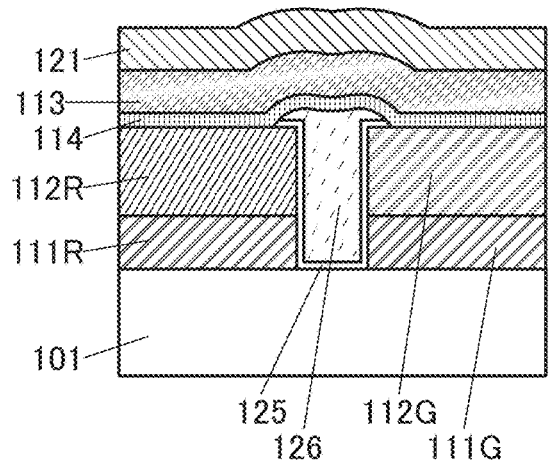
Figure 20C:
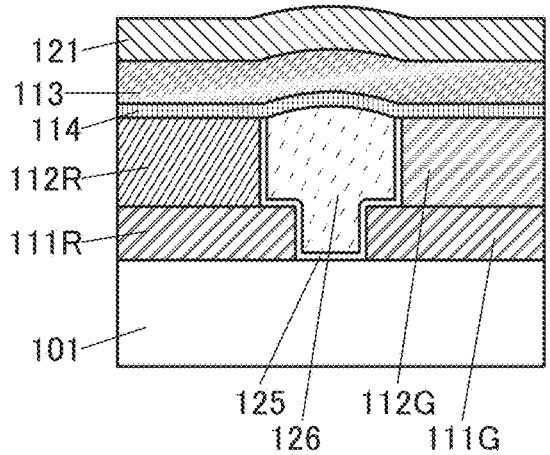

FIG. 20A, FIG. 20B, and FIG. 20C show examples of the case where the top surface of the resin layer 126 is convex. In this case, a convex portion that reflects the convex top surface of the resin layer 126 is formed on each of the top surfaces of the organic layer 114, the common electrode 113, and the protective layer 121.

Figure 20F:
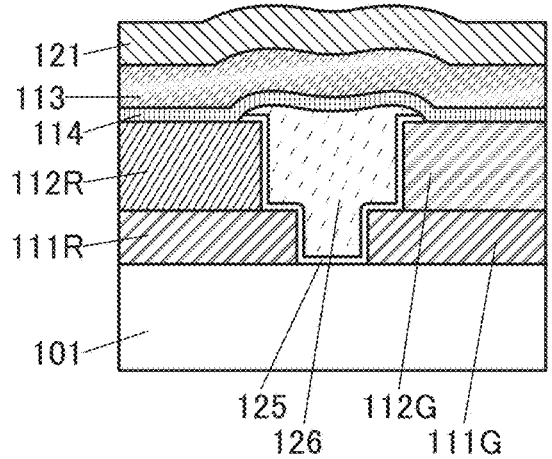

FIG. 20D, FIG. 20E, and FIG. 20F show examples of the case where part of the resin layer 126 covers an upper end portion and part of the top surface of the organic layer 112R and an upper end portion and part of the top surface of the organic layer 112G. Here, the insulating layer 125 is provided between the resin layer 126 and the top surfaces of the organic layers 112R and 112G.

FIG. 20D, FIG. 20E, and FIG. 20F show examples of the case where the top surface of the resin layer 126 is partly concave. In this case, unevenness that reflects the shape of the resin layer 126 is formed on each of the organic layer 114, the common electrode 113, and the protective layer 121.

The above is the description of the structure example of the resin layer.

At least part of this embodiment can be implemented in combination with the other embodiments described in this specification as appropriate.

Embodiment 7

In this embodiment, structure examples of a display apparatus that can be used for the light-emitting and light-receiving apparatus of one embodiment of the present invention are described. Although a display apparatus capable of displaying an image is described here, when a light-emitting element is used as a light source, a light-emitting and light-receiving apparatus can be obtained.

Figure 21A:
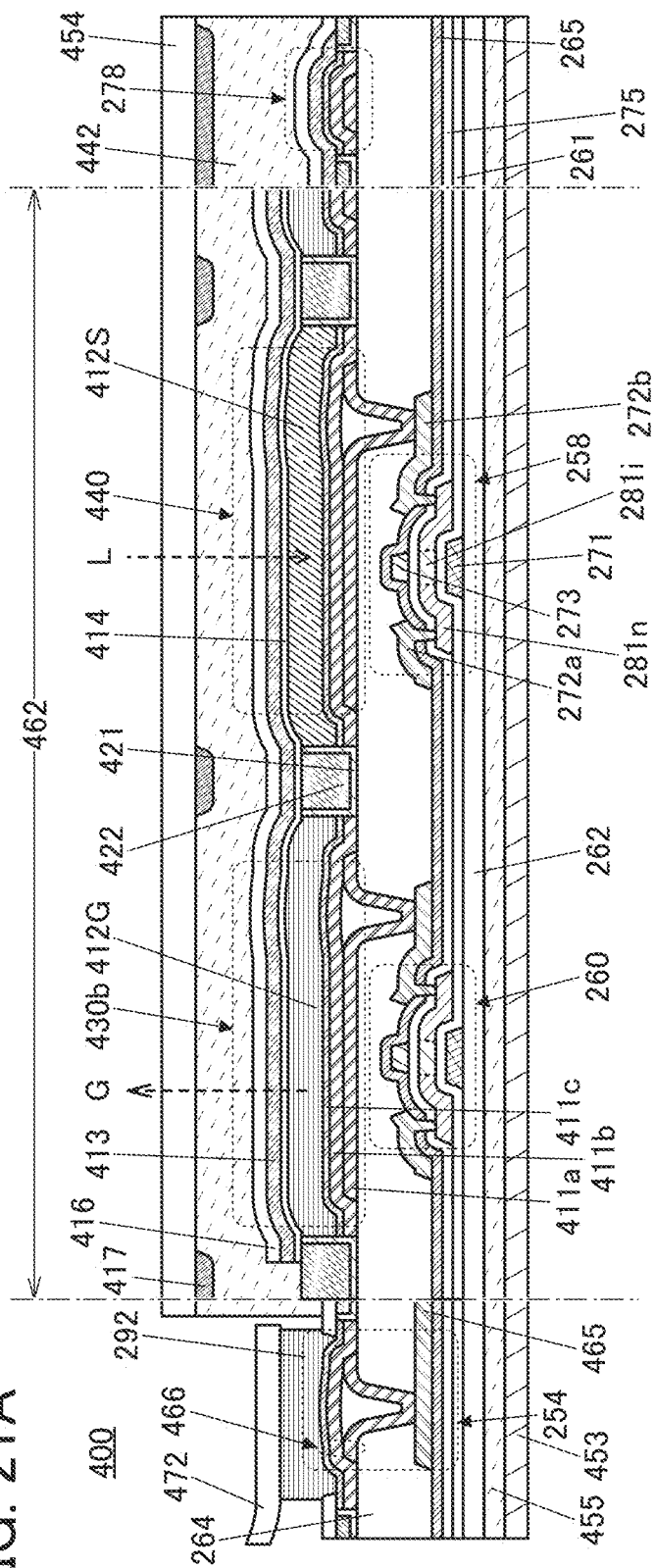
FIG. 21A and FIG. 21B are diagrams illustrating structure examples of a display apparatus.

FIG. 21A shows a schematic cross-sectional view of a display apparatus 400. FIG. 21A illustrates an example of cross sections of part of a region including an FPC 472, part of a display portion 462, and part of a region including a connection portion in the display apparatus 400. FIG. 21A specifically illustrates an example of a cross section of a region including a light-emitting element 430b that emits green light (G) and a light-receiving element 440 that receives reflected light (L) in the display portion 462.

The display apparatus 400 illustrated in FIG. 21A includes a transistor 260, a transistor 258, the light-emitting element 430b, the light-receiving element 440, and the like between a substrate 453 and a substrate 454.

The light-emitting element or the light-receiving element described above as an example can be employed for the light-emitting element 430b and the light-receiving element 440.

Here, in the case where a pixel of the display apparatus includes three kinds of subpixels including light-emitting elements that emit light of different colors, as the three subpixels, subpixels of three colors of red (R), green (G), and blue (B), subpixels of three colors of yellow (Y), cyan (C), and magenta (M), and the like can be given. In the case where the pixel includes four subpixels each including a light-emitting element, as the four subpixels, subpixels of four colors of R, G, B, and white (W), subpixels of four colors of R, G, B, and Y, and the like can be given. Alternatively, the subpixel may include a light-emitting element that emits infrared light.

As the light-receiving element 440, a photoelectric conversion element having sensitivity to light in a red, green, or blue wavelength range or a photoelectric conversion element having sensitivity to light in an infrared wavelength range can be used.

The substrate 454 and a protective layer 416 are bonded to each other with an adhesive layer 442. The adhesive layer 442 is provided to overlap with the light-emitting element 430b and the light-receiving element 440; that is, the display apparatus 400 employs a solid sealing structure. The substrate 454 is provided with a light-blocking layer 417.

The light-emitting element 430b and the light-receiving element 440 each include a conductive layer 411a, a conductive layer 411b, and a conductive layer 411c as a pixel electrode. The conductive layer 411b has a property of reflecting visible light and functions as a reflective electrode. The conductive layer 411c has a property of transmitting visible light and functions as an optical adjustment layer.

The conductive layer 411a included in the light-emitting element 430b is connected to a conductive layer 272b included in the transistor 260 through an opening provided in an insulating layer 264. The transistor 260 has a function of controlling driving of the light-emitting element. The conductive layer 411a included in the light-receiving element 440 is electrically connected to the conductive layer 272b included in the transistor 258. The transistor 258 has a function of controlling, for example, the timing of light exposure using the light-receiving element 440.

An EL layer 412G or a photoelectric conversion layer 412S is provided to cover the pixel electrode. An insulating layer 421 is provided in contact with a side surface of the EL layer 412G and a side surface of the photoelectric conversion layer 412S, and a resin layer 422 is provided to fill a depressed portion of the insulating layer 421. An organic layer 414, a common electrode 413, and the protective layer 416 are provided to cover the EL layer 412G and the photoelectric conversion layer 412S. With provision of the protective layer 416 that covers the light-emitting element, entry of impurities such as water into the light-emitting element can be inhibited, leading to an increase in the reliability of the light-emitting element.

Light G emitted from the light-emitting element 430b is emitted toward the substrate 454 side. The light-receiving element 440 receives light L incident through the substrate 454 and converts the light L into an electric signal. For the substrate 454, a material having a high visible-light-transmitting property is preferably used.

The transistor 260 and the transistor 258 are formed over the substrate 453. These transistors can be fabricated using the same material in the same step.

Note that the transistor 260 and the transistor 258 may be separately formed to have different structures. For example, it is possible to separately form a transistor having a back gate and a transistor having no back gate, or transistors having semiconductors, gate electrodes, gate insulating layers, source electrodes, and drain electrodes that are formed of different materials and/or have different thicknesses.

The substrate 453 and an insulating layer 262 are bonded to each other with an adhesive layer 455.

In a manufacturing method of the display apparatus 400, first, a formation substrate provided with the insulating layer 262, the transistors, the light-emitting elements, the light-receiving element, and the like is bonded to the substrate 454 provided with the light-blocking layer 417 with the adhesive layer 442. Then, the substrate 453 is attached to a surface exposed by separation of the formation substrate, whereby the components formed over the formation substrate are transferred onto the substrate 453. The substrate 453 and the substrate 454 preferably have flexibility. This can increase the flexibility of the display apparatus 400.

A connection portion 254 is provided in a region of the substrate 453 that does not overlap with the substrate 454. In the connection portion 254, a wiring 465 is electrically connected to the FPC 472 through a conductive layer 466 and a connection layer 292. The conductive layer 466 can be obtained by processing the same conductive film as the pixel electrode. Thus, the connection portion 254 and the FPC 472 can be electrically connected to each other through the connection layer 292.

Each of the transistor 260 and the transistor 258 includes a conductive layer 271 functioning as a gate, an insulating layer 261 functioning as a gate insulating layer, a semiconductor layer 281 including a channel formation region 281i and a pair of low-resistance regions 281n, a conductive layer 272a connected to one of the pair of low-resistance regions 281n, the conductive layer 272b connected to the other of the pair of low-resistance regions 281n, an insulating layer 275 functioning as a gate insulating layer, a conductive layer 273 functioning as a gate, and an insulating layer 265 covering the conductive layer 273. The insulating layer 261 is positioned between the conductive layer 271 and the channel formation region 281i. The insulating layer 275 is positioned between the conductive layer 273 and the channel formation region 281i.

The conductive layer 272a and the conductive layer 272b are connected to the respective low-resistance regions 281n through openings provided in the insulating layer 265. One of the conductive layer 272a and the conductive layer 272b functions as a source, and the other functions as a drain.

FIG. 21A illustrates an example in which the insulating layer 275 covers a top surface and a side surface of the semiconductor layer. The conductive layer 272a and the conductive layer 272b are connected to the respective low-resistance regions 281n through openings provided in the insulating layer 275 and the insulating layer 265.

Figure 21B:
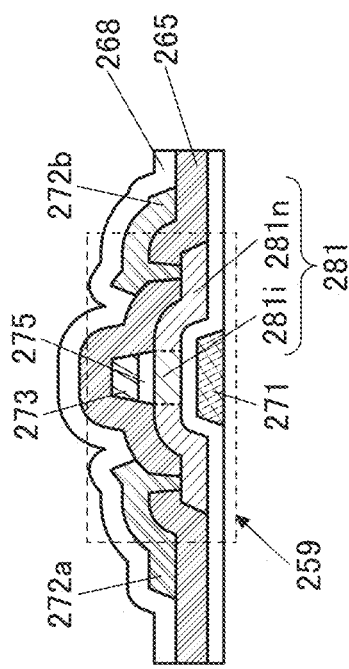

Meanwhile, in a transistor 259 illustrated in FIG. 21B, the insulating layer 275 overlaps with the channel formation region 281i of the semiconductor layer 281 and does not overlap with the low-resistance regions 281n. The structure illustrated in FIG. 21B can be fabricated by processing the insulating layer 275 using the conductive layer 273 as a mask, for example. In FIG. 21B, the insulating layer 265 is provided to cover the insulating layer 275 and the conductive layer 273, and the conductive layer 272a and the conductive layer 272b are connected to the respective low-resistance regions 281n through the openings in the insulating layer 265. Furthermore, an insulating layer 268 covering the transistor may be provided.

There is no particular limitation on the structure of the transistors included in the display apparatus of this embodiment. For example, a planar transistor, a staggered transistor, an inverted staggered transistor, or the like can be used. A top-gate or a bottom-gate transistor structure may be employed. Alternatively, gates may be provided above and below the semiconductor layer where a channel is formed.

The structure in which the semiconductor layer where a channel is formed is interposed between two gates is used for the transistor 260 and the transistor 258. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the semiconductor layer of the transistor, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

The semiconductor layer of the transistor preferably includes a metal oxide (also referred to as an oxide semiconductor). That is, a transistor including a metal oxide in its channel formation region (hereinafter, referred to as an OS transistor) is preferably used for the display apparatus of this embodiment.

The band gap of a metal oxide used for the semiconductor layer of the transistor is preferably 2 eV or more, further preferably 2.5 eV or more. With the use of a metal oxide having a wide bandgap, the off-state current of the OS transistor can be reduced.

A metal oxide contains preferably at least indium or zinc and further preferably indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and M is further preferably gallium. Hereinafter, a metal oxide containing indium, M, and zinc is referred to as In-M-Zn oxide in some cases.

It is particularly preferable to use an oxide containing indium (In), gallium (Ga), and zinc (Zn) (also referred to as IGZO) for the semiconductor layer of the transistor. Alternatively, an oxide containing indium (In), aluminum (Al), and zinc (Zn) (also referred to as IAZO) may be used for the semiconductor layer of the transistor. Alternatively, an oxide containing indium (In), aluminum (Al), gallium (Ga), and zinc (Zn) (IAGZO) may be used for the semiconductor layer.

When a metal oxide is an In-M-Zn oxide, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In-M-Zn oxide include In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio. By increasing the proportion of the number of indium atoms in the metal oxide, the on-state current, field-effect mobility, or the like of the transistor can be improved.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The atomic ratio of In may be less than the atomic ratio of M in the In-M-Zn oxide. Examples of the atomic ratio of the metal elements in such an In-M-Zn oxide include In:M:Zn=1:3:2 or a composition in the neighborhood thereof, In:M:Zn=1:3:3 or a composition in the neighborhood thereof, and In:M:Zn=1:3:4 or a composition in the neighborhood thereof. By increasing the proportion of the number of M atoms in the metal oxide, the band gap of the In-M-Zn oxide is further increased; thus, the resistance to a negative bias stress test with light irradiation can be improved. Specifically, the amount of change in the threshold voltage or the amount of change in the shift voltage (Vsh) measured in a NBTIS (Negative Bias Temperature Illumination Stress) test of the transistor can be decreased. Note that the shift voltage (Vsh) is defined as Vg at which, in a drain current (Id)-gate voltage (Vg) curve of a transistor, the tangent at a point where the slope of the curve is the steepest intersects the straight line of Id=1 pA.

Alternatively, the semiconductor layer of the transistor may include silicon. Examples of silicon include amorphous silicon and crystalline silicon (e.g., low-temperature polysilicon or single crystal silicon).

Alternatively, a semiconductor layer of a transistor may include a layered substance that functions as a semiconductor. The layered substance is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered substance has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered substances include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

A material through which impurities such as water and hydrogen are not easily diffused is preferably used for at least one of the insulating layers covering the transistors. Such an insulating layer can function as a barrier layer. Such a structure can effectively inhibit diffusion of impurities into the transistors from the outside and increase the reliability of a display apparatus.

An inorganic insulating film is preferably used as each of the insulating layer 261, the insulating layer 262, the insulating layer 265, the insulating layer 268, and the insulating layer 275. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above inorganic insulating films may also be used.

Here, an organic insulating film often has a lower barrier property than an inorganic insulating film. Therefore, the organic insulating film preferably has an opening in the vicinity of an end portion of the display apparatus 400. This can inhibit entry of impurities from the end portion of the display apparatus 400 through the organic insulating film. Alternatively, the organic insulating film may be formed so that its end portion is positioned on the inner side compared to the end portion of the display apparatus 400, to prevent the organic insulating film from being exposed at the end portion of the display apparatus 400.

An organic insulating film is suitable for the insulating layer 264 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

The light-blocking layer 417 is preferably provided on a surface of the substrate 454 on the substrate 453 side. A variety of optical members can be arranged on the outer surface of the substrate 454. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be arranged on the outer surface of the substrate 454.

FIG. 21A illustrates a connection portion 278. In the connection portion 278, the common electrode 413 is electrically connected to a wiring. FIG. 21A illustrates an example of the case where the wiring has the same stacked-layer structure as the pixel electrode.

For each of the substrate 453 and the substrate 454, glass, quartz, ceramics, sapphire, a resin, a metal, an alloy, a semiconductor, or the like can be used. The substrate on the side from which light from the light-emitting element is extracted is formed using a material which transmits the light. When the substrate 453 and the substrate 454 are formed using a flexible material, the flexibility of the display apparatus can be increased. Furthermore, a polarizing plate may be used as the substrate 453 or the substrate 454.

For each of the substrate 453 and the substrate 454, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 453 and the substrate 454.

In the case where a circularly polarizing plate overlaps with the display apparatus, a highly optically isotropic substrate is preferably used as the substrate included in the display apparatus. A highly optically isotropic substrate has a low birefringence (that can also be referred to as a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic resin film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the resin layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As the connection layer 292, an anisotropic conductive film (ACF), an anisotropic conductive paste (ACP), or the like can be used.

As materials for the gates, the source, and the drain of a transistor and conductive layers such as a variety of wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display apparatus, and conductive layers (e.g., a conductive layer functioning as a pixel electrode or a common electrode) included in a light-emitting element.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 8

In this embodiment, examples in which the display apparatus of one embodiment of the present invention is installed in a vehicle are described with reference to FIG. 22 and FIG. 23.

Figure 22:
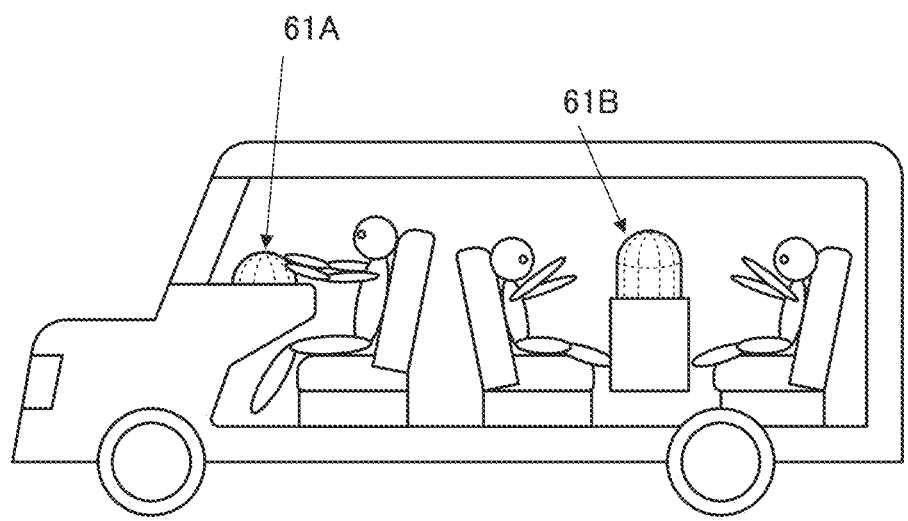
FIG. 22 is a diagram illustrating structure examples of display apparatuses.

The display apparatus described in Embodiment 1 can be favorably used for a light-emitting and light-receiving portion of a display apparatus 61A illustrated in FIG. 22. A vehicle control device has a hemispherical shape and is fitted in a dashboard or the like so as to be fixed thereto. FIG. 22 also illustrates an example of providing, on the rear seat side, a display apparatus 61B in a shape of a cylinder on one plane of which a hemisphere with the same diameter is attached. The display apparatuses 61A and 61B can be configured to provide power supply or a video signal from below. Moreover, the display apparatuses 61A and 61B can be used as interior lights.

Although FIG. 22 illustrates the example of an electric vehicle, there is no particular limitation as long as it is a vehicle. A display panel having a curved surface, typically, a spherical shape or a hemispherical shape, can be mounted on agricultural machines, motorized bicycles including motor-assisted bicycles, motorcycles, electric wheelchairs, electric carts, boats and ships, submarines, aircraft such as fixed-wing aircraft or rotary-wing aircraft, and the like. The display panel having a curved surface, typically, a spherical shape or a hemispherical shape, can also be mounted on transport vehicles such as buses, passenger planes, helicopters, and spacecraft.

The display apparatus described in Embodiment 1 can be used for steering wheels illustrated in FIG. 23A to FIG. 23F.

Figure 23A:
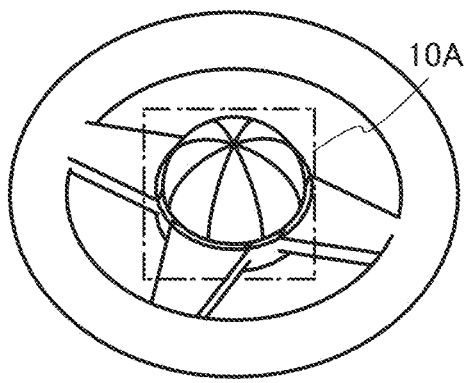
FIG. 23A to FIG. 23F are diagrams illustrating structure examples of display apparatuses.

A steering wheel 41A illustrated in FIG. 23A has a structure in which the display apparatus 10A described in Embodiment 1 is fitted in a center portion. By including the display apparatus 10A, the steering wheel 41A can be a well-designed steering wheel.

Figure 23C:
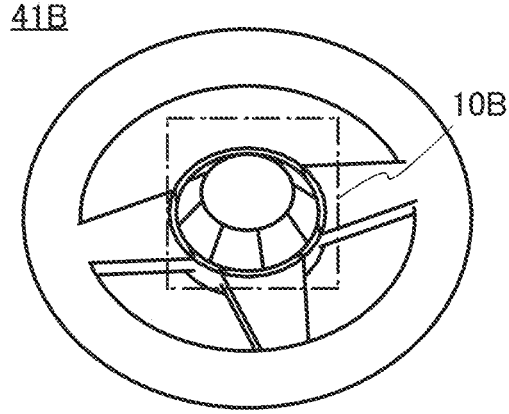
Figure 23E:
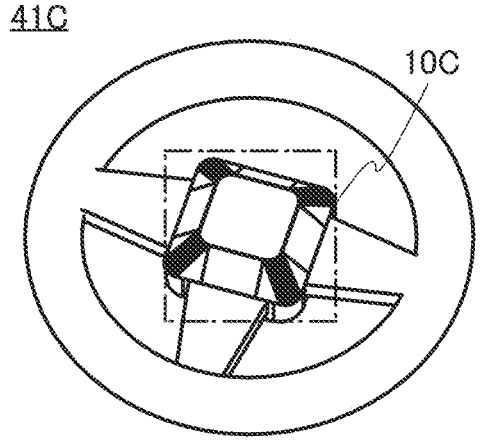
Figure 23B:
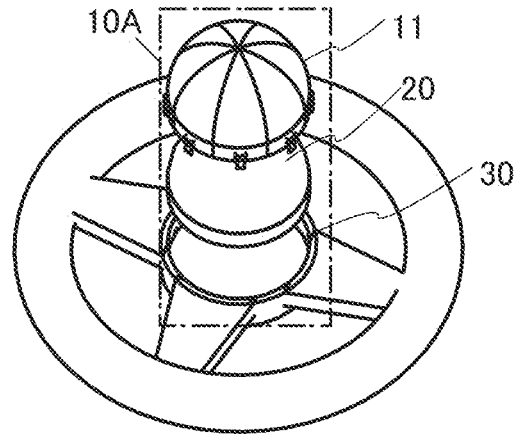

FIG. 23B is a development view illustrating components included in the display apparatus 10A of the steering wheel 41A illustrated in FIG. 23A. As illustrated in FIG. 23B, the display apparatus 10A of one embodiment of the present invention can have a structure in which the display panel 11 is in contact with and fixed to a surface of the fixing member 20. Thus, a driver can operate the display panel 11 while inhibiting damage to the display panel 11, so that a steering wheel including a display apparatus that is highly convenient or reliable can be provided. Moreover, an air bag can be stored in the housing 30. In this case, when the air bag pops out, the display panel 11 also pops out. However, since the display panel 11 includes a non-rectangular flexible substrate, the safety of the structure can be improved compared to the case of a display panel including a glass substrate. Moreover, since the display panel 11 is fabricated by combining a plurality of display panels, the display panel 11 can separate into pieces and scatter when the air bag pops out. Thus, the safety of the structure can be further improved.

A steering wheel 41B illustrated in FIG. 23C has a structure in which the display apparatus 10B described in Embodiment 1 is fitted in a center portion. By including the display apparatus 10B, the steering wheel 41B can be a well-designed steering wheel.

Figure 23D:
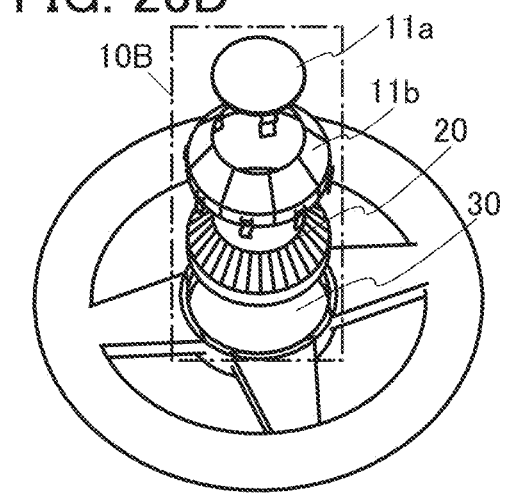

FIG. 23D is a development view illustrating components included in the display apparatus 10B of the steering wheel 41B illustrated in FIG. 23C. As illustrated in FIG. 23D, the display apparatus 10B of one embodiment of the present invention can have a structure in which the display panels 11a and 11b are in contact with and fixed to surfaces of the fixing member 20. Thus, a driver can operate the display panels 11a and 11b while inhibiting damage to the display panels 11a and 11b, so that a steering wheel including a display apparatus that is highly convenient or reliable can be provided. Moreover, an air bag can be stored in the housing 30. In this case, when the air bag pops out, the display panels 11a and 11b also pop out. However, since the display panels 11a and 11b each include a non-rectangular flexible substrate, the safety of the structure can be improved compared to the case of a display panel including a glass substrate. Moreover, since the display panels 11a and 11b are fabricated by combining a plurality of display panels, the display panels 11a and 11b can separate into pieces and scatter when the air bag pops out. Thus, the safety of the structure can be further improved.

A steering wheel 41C illustrated in FIG. 23E has a structure in which the display apparatus 10C described in Embodiment 1 is fitted in a center portion. By including the display apparatus 10C, the steering wheel 41C can be a well-designed steering wheel.

Figure 23F:
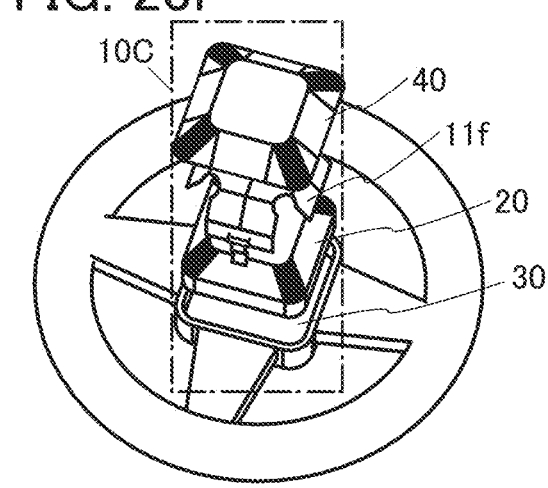

FIG. 23F is a development view illustrating components included in the display apparatus 10C of the steering wheel 41C illustrated in FIG. 23E. As illustrated in FIG. 23F, the display apparatus 10C of one embodiment of the present invention can have a structure in which the display panel 11f is in contact with and fixed to a surface of the fixing member 20. Thus, a driver can operate the display panel 11f while inhibiting damage to the display panel 11f, so that a steering wheel including a display apparatus that is highly convenient or reliable can be provided. Moreover, an air bag can be stored in the housing 30. In this case, when the air bag pops out, the display panel 11f also pops out. However, since the display panel 11f includes anon-rectangular flexible substrate, the safety of the structure can be improved compared to the case of a display panel including a glass substrate. Moreover, since the display panel 11f is covered with the protective substrate 40, the safety of the structure can be further improved.

As described above, with the structure of one embodiment of the present invention, flexibility in design of a display apparatus is improved and thus design, convenience, and reliability of the display apparatus can be improved. The display apparatus of one embodiment of the present invention can be suitably mounted on a vehicle or the like.

At least part of this embodiment can be implemented in combination with the other embodiments described in this specification as appropriate.

<Supplementary Notes on Description in this Specification and the Like>

The following are notes on the description of the foregoing embodiments and the structures in the embodiments.

The structure described in each embodiment can be combined with any of the structures described in the other embodiments as appropriate to constitute one embodiment of the present invention. In addition, in the case where a plurality of structure examples are described in one embodiment, some of the structure examples can be combined as appropriate.

Note that a content (or part thereof) described in one embodiment can be applied to, combined with, or replaced with another content (or part thereof) in the same embodiment and/or a content (or part thereof) described in another embodiment or other embodiments, for example.

Note that in each embodiment, a content described in the embodiment is a content described with reference to a variety of diagrams or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, components are classified on the basis of the functions, and shown as blocks independent of one another in block diagrams. However, in an actual circuit and the like, such components are sometimes hard to classify functionally, and there is a case where one circuit is associated with a plurality of functions and a case where a plurality of circuits are associated with one function. Therefore, the blocks in the block diagrams are not limited by the components described in the specification, and the description can be changed appropriately depending on the situation.

In drawings, the size, the layer thickness, or the region is shown arbitrarily for description convenience. Therefore, the size, the layer thickness, or the region is not necessarily limited to the illustrated scale. Note that the drawings are schematically shown for clarity, and embodiments of the present invention are not limited to shapes, values, or the like shown in the drawings. For example, variation in signal, voltage, or current due to noise or variation in signal, voltage, or current due to difference in timing can be included.

In this specification and the like, the terms "one of a source and a drain" (or a first electrode or a first terminal) and "the other of the source and the drain" (or a second electrode or a second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit the functions of the components. For example, an "electrode" is used as part of a "wiring" in some cases, and vice versa. Furthermore, the term such as "electrode" or "wiring" also includes the case where a plurality of "electrodes" or "wirings" are formed in an integrated manner, for example.

In this specification and the like, voltage and potential can be replaced with each other as appropriate. The term voltage refers to a potential difference from a reference potential, and when the reference potential is a ground potential, for example, voltage can be replaced with potential. The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Also, for example, the term "insulating film" can be changed into the term "insulating layer" in some cases.

In this specification and the like, a switch has a function of controlling whether a current flows or not by being in a conduction state (an on state) or a non-conduction state (an off state). Alternatively, a switch has a function of selecting and changing a current path.

In this specification and the like, the channel length refers to, for example, the distance between a source and a drain in a region where a semiconductor (or a portion where a current flows in a semiconductor when a transistor is on) and a gate overlap with each other or a region where a channel is formed in a top view of the transistor.

In this specification and the like, the channel width refers to, for example, the length of a portion where a source and a drain face each other in a region where a semiconductor (or a portion where a current flows in a semiconductor when a transistor is on) and a gate electrode overlap with each other or a region where a channel is formed.

In this specification and the like, the expression "A and B are connected" means the case where A and B are electrically connected to each other as well as the case where A and B are directly connected to each other. Here, the expression "A and B are electrically connected" means the case where electrical signals can be transmitted and received between A and B when an object having any electric action exists between A and B.

REFERENCE NUMERALS

10A: display apparatus, 10B: display apparatus, 10C: display apparatus, 11a: display panel, 11b: display panel, 11c: display panel, 11f: display panel, 11p: display panel, 11q: display panel, 11: display panel, 12: FPC, 13: source driver circuit, 14: display portion, 15: non-display portion, 16: pixel, 17: gate driver circuit, 18: bending portion, 19: notch portion, 20: fixing member, 21: curved surface, 22: curved surface, 23: plane, 30: housing, 40: protective substrate

The invention claimed is:

1. A display apparatus comprising:
a first display panel comprising a first display portion, a first non-display portion, a first gate driver circuit, and a first source driver circuit;
a second display panel comprising a second display portion, a second non-display portion, a second gate driver circuit, and a second source driver circuit; and
a fixing member having a frustoconical shape, the fixing member comprising a plane and a curved surface having a first part and a second part,
wherein the first gate driver circuit is provided in the first display portion and the first source driver circuit is provided in a first region of the first non-display portion,
wherein the second gate driver circuit is provided in the second display portion and the second source driver circuit is provided in a first region of the second non-display portion,
wherein the first display portion is fixed on the plane of the fixing member,
wherein the first region of the second non-display portion is fixed on the first part of the curved surface of the fixing member, and
wherein the second display portion is fixed on the second part of the curved surface of the fixing member.

2. The display apparatus according to claim 1, further comprising a housing,
wherein the first region of the second non-display portion and the first part of the fixing member are positioned inside the housing.

3. The display apparatus according to claim 1, wherein the first display portion has a circular shape.

4. The display apparatus according to claim 1, wherein the second display portion does not have a rectangular shape.

5. The display apparatus according to claim 1, wherein the first display portion and the second display portion are joined so that a frustoconical display portion is formed.

6. The display apparatus according to claim 1, further comprising a third display panel comprising a third display portion, a third non-display portion, a third gate driver circuit, and a third source driver circuit,
wherein the third display portion is fixed on the second part of the curved surface of the fixing member, and
wherein the first display portion, the second display portion, and the third display portion are joined so that a frustoconical display portion is formed.

7. The display apparatus according to claim 1,
wherein the first gate driver circuit comprises a first transistor formed in the same step as a second transistor in the first display portion, and
wherein the second gate driver circuit comprises a third transistor formed in the same step as a fourth transistor in the second display portion.

8. A display apparatus comprising:
a first display panel comprising a first display portion, a first non-display portion, a first gate driver circuit, and a first source driver circuit;
a second display panel comprising a second display portion, a second non-display portion, a second gate driver circuit, and a second source driver circuit;
a fixing member having a frustoconical shape, the fixing member comprising a plane and a curved surface having a first part and a second part; and
a housing storing a first region of the second non-display portion fixed on the first part of the curved surface of the fixing member,
wherein the first gate driver circuit is provided in the first display portion, and the first source driver circuit is provided in a first region of the first non-display portion,
wherein the second gate driver circuit is provided in the second display portion, and the second source driver circuit is provided in the first region of the second non-display portion,
wherein the first display portion is fixed on the plane of the fixing member, and wherein the second display portion is fixed on the second part of the curved surface of the fixing member.

9. The display apparatus according to claim 8,
wherein a first FPC is provided on the first region of the first non-display portion, and
wherein a second FPC is provided on the first region of the second non-display portion.

10. The display apparatus according to claim 8, wherein the second display portion does not have a rectangular shape.

11. The display apparatus according to claim 8, further comprising a third display panel comprising a third display portion, a third non-display portion, a third gate driver circuit, and a third source driver circuit,
wherein the third display portion is fixed on the second part of the curved surface of the fixing member, and
wherein the first display portion, the second display portion, and the third display portion are joined so that a frustoconical display portion is formed.

12. A display apparatus comprising:
a first display panel comprising a first display portion, a first non-display portion, a first gate driver circuit, and a first source driver circuit;
a second display panel comprising a second display portion, a second non-display portion, a second gate driver circuit, and a second source driver circuit;
a fixing member comprising a curved surface having a first part and a second part; and
a housing storing a first region of the second non-display portion fixed on the first part of the curved surface of the fixing member,
wherein the first gate driver circuit is provided in the first display portion and the first source driver circuit is provided in a first region of the first non-display portion,
wherein the second gate driver circuit is provided in the second display portion and the second source driver circuit is provided in the first region of the second non-display portion, and
wherein the second display portion is fixed on the second part of the curved surface of the fixing member.

13. The display apparatus according to claim 12,
wherein a first FPC is provided on the first region of the first non-display portion, and
wherein a second FPC is provided on the first region of the second non-display portion.

14. The display apparatus according to claim 12, wherein the second display portion does not have a rectangular shape.

15. The display apparatus according to claim 12, further comprising a third display panel comprising a third display portion, a third non-display portion, a third gate driver circuit, and a third source driver circuit,
wherein the third display portion is fixed on the second part of the curved surface of the fixing member, and
wherein the first display portion, the second display portion, and the third display portion are joined so that a frustoconical display portion is formed.

* * * * *